US012787740B2

(12) United States Patent
Kim et al.

(10) Patent No.: US 12,787,740 B2
(45) Date of Patent: Nov. 3, 2026

(54) INTEGRATED CIRCUIT DEVICE INCLUDING A POWER RAIL

(71) Applicant: SAMSUNG ELECTRONICS CO., LTD., Suwon-si (KR)

(72) Inventors: Bongkeun Kim, Suwon-si (KR); Myungsoo Noh, Suwon-si (KR); Dawoon Choi, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 489 days.

(21) Appl. No.: 18/230,710

(22) Filed: Aug. 7, 2023

(65) Prior Publication Data

US 2024/0213119 A1 Jun. 27, 2024

(30) Foreign Application Priority Data

Dec. 27, 2022 (KR) ........................ 10-2022-0186019

(51) Int. Cl.
*H10W 20/20* (2026.01)
*H10D 30/43* (2025.01)
(Continued)

(52) U.S. Cl.
CPC ............ *H10W 20/20* (2026.01); *H10D 30/43* (2025.01); *H10D 30/6735* (2025.01);
(Continued)

(58) Field of Classification Search
CPC ............. H01L 23/481; H01L 21/76895; H01L 23/5286; H01L 23/5226; H01L 23/5283;
(Continued)

(56) References Cited

U.S. PATENT DOCUMENTS 11,404,548 B2 8/2022 Yu et al.
11,410,876 B2 8/2022 Chang et al.
(Continued)

FOREIGN PATENT DOCUMENTS

CN 114256142 A 3/2022
KR 10-2022-0104617 7/2022
(Continued)

OTHER PUBLICATIONS

EESR issued in corresponding application No. EP Patent Application No. 23213311.6 on Jun. 5, 2024.
(Continued)

*Primary Examiner* — Jonathan Han
(74) *Attorney, Agent, or Firm* — Morgan, Lewis & Bockius LLP

(57) ABSTRACT

An integrated circuit device includes: a substrate having a backside surface; a pair of fin-type active regions protruding from the substrate and defining a trench region in the substrate; a pair of source/drain regions disposed, one-by-one, on the pair of fin-type active regions, respectively; a device isolation film covering a sidewall of each of the pair of fin-type active regions and disposed in the trench region; a via power rail disposed between the pair of fin-type active regions and between the pair of source/drain regions, wherein the via power rail passes through the device isolation film in a vertical direction; a backside power rail passing through the substrate in the vertical direction and disposed at a position overlapping the via power rail, wherein the backside power rail is connected to the via power rail; and an air spacer disposed between the substrate and the backside power rail.

20 Claims, 46 Drawing Sheets

(51) Int. Cl.
*H10D 30/67* (2025.01)
*H10D 62/10* (2025.01)
*H10D 84/83* (2025.01)

(52) U.S. Cl.
CPC ....... *H10D 30/6757* (2025.01); *H10D 62/121* (2025.01); *H10D 84/83* (2025.01)

(58) Field of Classification Search
CPC ........... H01L 21/76898; H01L 21/7682; H01L 23/485; H01L 23/535; H10D 30/43; H10D 30/6729; H10D 30/6735; H10D 30/6757; H10D 62/121; H10D 64/017; H10D 84/85; H10D 84/83; H10D 84/0149; H10D 84/0186; H10D 84/038; H10D 62/118; H10D 84/853; H10D 30/014; H10D 84/834; H10D 30/62; H10D 62/119; H10D 64/254; H10W 20/20; H10W 20/0698; H10W 20/072; H10W 20/40; H10W 20/46; H10W 20/023; H10W 20/0245; H10W 20/0257; H10W 20/0265; H10W 20/427; H10W 20/481; H10W 20/42; H10W 20/435
See application file for complete search history.

(56) References Cited

U.S. PATENT DOCUMENTS

| | | | | |
|---|---|---|---|---|
| 11,424,332 | B2 | 8/2022 | Yu et al. | |
| 11,450,559 | B2 | 9/2022 | Chang et al. | |
| 11,456,209 | B2 | 9/2022 | Yu et al. | |
| 2022/0093448 | A1 * | 3/2022 | Yu | H10D 30/43 |
| 2022/0139914 | A1 | 5/2022 | Cheng et al. | |
| 2022/0230947 | A1 | 7/2022 | Park et al. | |
| 2022/0310455 | A1 | 9/2022 | Huang et al. | |
| 2024/0204067 | A1 * | 6/2024 | Xie | H10D 62/121 |

FOREIGN PATENT DOCUMENTS

| | | | |
|---|---|---|---|
| TW | 202209449 | A | 3/2022 |
| TW | 202242971 | A | 11/2022 |

OTHER PUBLICATIONS

First Office Action issued Jan. 13, 2026 in corresponding Taiwanese Patent Application No. 112148365.

* cited by examiner

INTEGRATED CIRCUIT DEVICE INCLUDING A POWER RAIL

CROSS-REFERENCE TO RELATED APPLICATION

This application claims priority under 35 U.S.C. § 119 to Korean Patent Application No. 10-2022-0186019, filed on Dec. 27, 2022, in the Korean Intellectual Property Office, the disclosure of which is incorporated by reference herein in its entirety.

TECHNICAL FIELD

The present inventive concept relates to an integrated circuit (IC) device, and more particularly, to an IC device including a power rail.

DISCUSSION OF THE RELATED ART

As electronic products are increasingly desired to be miniaturized, multifunctional, and highly efficient, IC devices are also increasingly desired to have a large capacity and be highly integrated. Accordingly, it is desirable to efficiently design wiring structures to achieve high integration while ensuring functions and operating speed of the IC devices.

SUMMARY

According to an embodiment of the present inventive concept, an integrated circuit device includes: a substrate having a backside surface; a pair of fin-type active regions protruding from the substrate and defining a trench region in the substrate on an opposite side of the backside surface, wherein the pair of fin-type active regions extend in a first lateral direction; a pair of source/drain regions disposed, one-by-one, on the pair of fin-type active regions, respectively; a device isolation film covering a sidewall of each of the pair of fin-type active regions and disposed in the trench region; a via power rail disposed between the pair of fin-type active regions and between the pair of source/drain regions, wherein the via power rail passes through the device isolation film in a vertical direction; a backside power rail passing through the substrate in the vertical direction and disposed at a position overlapping the via power rail in the vertical direction, wherein the backside power rail is connected to the via power rail; and an air spacer disposed between the substrate and the backside power rail.

According to an embodiment of the present inventive concept, an integrated circuit device includes: a substrate having a backside surface; a plurality of fin-type active regions protruding from the substrate and defining a plurality of trench regions in the substrate on an opposite side of the backside surface, wherein the plurality of fin-type active regions extend in a first lateral direction; a plurality of source/drain regions disposed on the plurality of fin-type active regions, respectively; a device isolation film disposed on a sidewall of each of the plurality of fin-type active regions in the plurality of trench regions; a via power rail spaced apart from the plurality of fin-type active regions and the plurality of source/drain regions, wherein the via power rail passes through the device isolation film in a vertical direction; and a backside power structure passing the substrate in the vertical direction and disposed at a position overlapping the via power rail in the vertical direction, wherein the backside power structure includes: a backside power rail passing through the substrate in the vertical direction and disposed at a position overlapping the via power rail in the vertical direction, wherein the backside power rail is connected to the via power rail; and an air spacer disposed between the substrate and the backside power rail.

According to an embodiment of the present inventive concept, an integrated circuit device includes: a substrate having a backside surface; a fin-type active region protruding from the substrate to and defining a trench region in the substrate on an opposite side of the backside surface; at least one nanosheet disposed on the fin-type active region, wherein the at least one nanosheet is spaced apart from a fin top surface of the fin-type active region; a gate line at least partially surrounding the at least one nanosheet and disposed on the fin-type active region; a source/drain region adjacent to the gate line and disposed on the fin-type active region, wherein the source/drain region is in contact with the at least one nanosheet; a device isolation film covering a sidewall of the fin-type active region and disposed in the trench region; a via power rail spaced apart from each of the fin-type active region, the source/drain region, and the gate line, wherein the via power rail passes through the gate line in a vertical direction; and a backside power structure passing through the substrate in the vertical direction and disposed at a position overlapping the via power rail in the vertical direction, wherein the backside power structure includes: a backside power rail passing through the substrate in the vertical direction and disposed at a position overlapping the via power rail in the vertical direction, wherein the backside power rail is connected to the via power rail; and an air spacer disposed between the substrate and the backside power rail.

BRIEF DESCRIPTION OF THE DRAWINGS

The above and other aspects of the present inventive concept will become more apparent by describing in detail embodiments thereof, with reference to the accompanying drawings, in which:

FIGS. 9 to 16, 17B, 18, 19B, 20 to 22, 23B, 24B, 25B, and 26 to 28 are cross-sectional views of an example cross-sectional structure of a portion corresponding to a cross-section taken along line Y1-Y1' of FIG. 2, according to a process sequence. FIGS. 17A, 19A, 23A, 24A, and 25A are cross-sectional views of an example cross-sectional structure of a portion corresponding to a cross-section taken along line X1-X1' of FIG. 2, according to a process sequence. FIGS. 17C, 19C, 23C, 24C, and 25C are cross-sectional views of an example cross-sectional structure of a portion corresponding to a cross-section taken along line Y2-Y2' of FIG. 2, according to a process sequence.

DETAILED DESCRIPTION OF THE EMBODIMENTS

Figure 1:
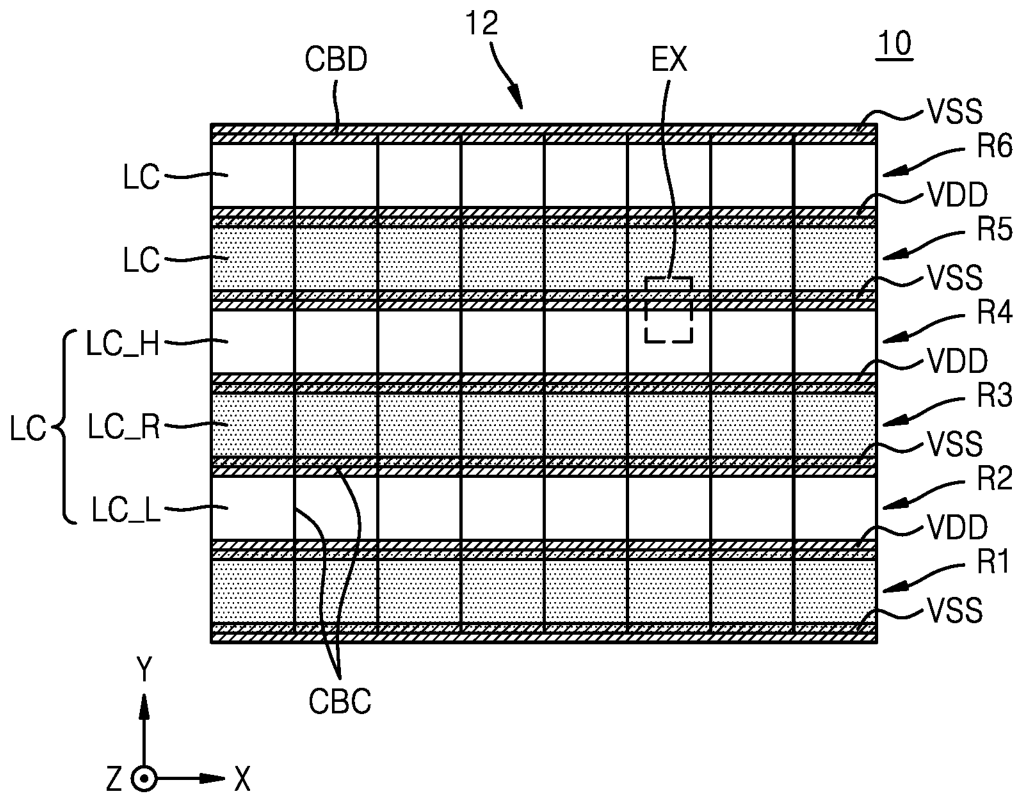
FIG. 1 is a plan layout diagram of a cell block of an integrated circuit (IC) device, according to an embodiment of the present inventive concept.

Hereinafter, embodiments of the present inventive concept will be described in detail with reference to the accompanying drawings. The same reference numerals are used to denote the same elements in the drawings and the specification, and repeated descriptions thereof may be omitted or briefly discussed.

FIG. 1 is a plan layout diagram of a cell block 12 of an integrated circuit (IC) device 10, according to an embodiment of the present inventive concept.

Referring to FIG. 1, the cell block 12 of the IC device 10 may include a plurality of logic cells LC, which include circuit patterns configured to constitute various circuits. The plurality of logic cells LC may be arranged in a matrix form in a widthwise direction (e.g., an X direction) and a height direction (e.g., a Y direction) in the cell block 12.

Each of the plurality of logic cells LC may include a circuit pattern having a layout designed according to a place and route (PnR) technique to perform at least one logic function. The plurality of logic cells LC may perform various logic functions. In some embodiments of the present inventive concept, the plurality of logic cells LC may include a plurality of standard cells. In some embodiments of the present inventive concept, at least some of the plurality of logic cells LC may perform the same logic function as each other. In some embodiments of the present inventive concept, at least some of the plurality of logic cells LC may perform different logic functions from each other.

The plurality of logic cells LC may include various kinds of logic cells including a plurality of circuit elements. For example, each of the plurality of logic cells LC may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, a latch, or a combination thereof, without being limited thereto.

In the cell block 12, at least some of the plurality of logic cells LC that form one row R1, R2, R3, R4, R5, or R6 in the widthwise direction (e.g., the X direction) may have the same width as each other. In addition, at least some of the plurality of logic cells LC that form one row R1, R2, R3, R4, R5, or R6 may have the same height as each other. However, the present inventive concept is not limited to those illustrated in FIG. 1, and at least some of the plurality of logic cells LC that form one row R1, R2, R3, R4, R5, or R6 may have different widths and heights from each other.

An area of each of the plurality of logic cells LC included in the cell block 12 of the IC device 10 may be defined by a cell boundary CBD. A cell boundary contact portion CBC where respective cell boundaries CBD of two logic cells LC that are adjacent to each other in the widthwise direction (e.g., the X direction) or the height direction (e.g., the Y direction), from among the plurality of logic cells LC, meet each other may be between the two adjacent logic cells LC. For example, a cell boundary contact portion CBC may be an interface between cell boundaries CBD of corresponding logic cells LC that are adjacent to each other in the widthwise direction (e.g., the X direction) or the height direction (e.g., the Y direction).

In some embodiments of the present inventive concept, from among the plurality of logic cells LC that form one row R1, R2, R3, R4, R5, or R6, two logic cells LC that are adjacent to each other in the widthwise direction may contact each other at the cell boundary contact portion CBC without a distance therebetween. In some embodiments of the present inventive concept, from among the plurality of logic cells LC that form one row R1, R2, R3, R4, R5, or R6, two logic cells LC that are adjacent to each other in the widthwise direction may be a predetermined distance apart from each other.

In some embodiments of the present inventive concept, from among the plurality of logic cells LC that form one row R1, R2, R3, R4, R5, or R6, two adjacent logic cells may perform the same function as each other. In this case, the two adjacent logic cells LC may have the same structure as each other. In some embodiments of the present inventive concept, from among the plurality of logic cells LC that form one row R1, R2, R3, R4, R5, or R6, two adjacent logic cells may perform different functions from each other.

In some embodiments of the present inventive concept, one logic cell LC, which is selected from the plurality of logic cells LC included in the cell block 12 of the IC device 10, may have a symmetrical structure with another logic cell LC, which is adjacent to the selected logic cell LC in the height direction (e.g., the Y direction in FIG. 1), about the cell boundary contact portion CBC therebetween. For example, a reference logic cell LC_R in a third row R3 may have a symmetrical structure with a lower logic cell LC_L in a second row R2 about the cell boundary contact portion CBC therebetween. In addition, the reference logic cell LC_R in the third row R3 may have a symmetrical structure with an upper logic cell LC_H in a fourth row R4 about the cell boundary contact portion CBC therebetween.

Although the cell block 12 including six rows R1, R2, . . . , and R6 is illustrated in FIG. 1, embodiments of the present inventive concept are not limited thereto. The cell block 12 may include various numbers of rows selected as needed, and one row may include various numbers of logic cells selected as needed.

A selected one of a plurality of ground lines VSS and a plurality of power lines VDD may be between a plurality of rows (e.g., R1, R2, R3, R4, R5, and R6), each of which includes a plurality of logic cells LC arranged in a line in the widthwise direction (e.g., the X direction). The plurality of ground lines VSS and the plurality of power lines VDD may each extend in a first lateral direction (e.g., the X direction) and may be alternately arranged apart from each other in a second lateral direction (e.g., the Y direction). Accordingly, the plurality of ground lines VSS and the plurality of power lines VDD may each overlap the cell boundary CBD of the logic cell LC in the second lateral direction (e.g., the Y direction).

Figure 2:
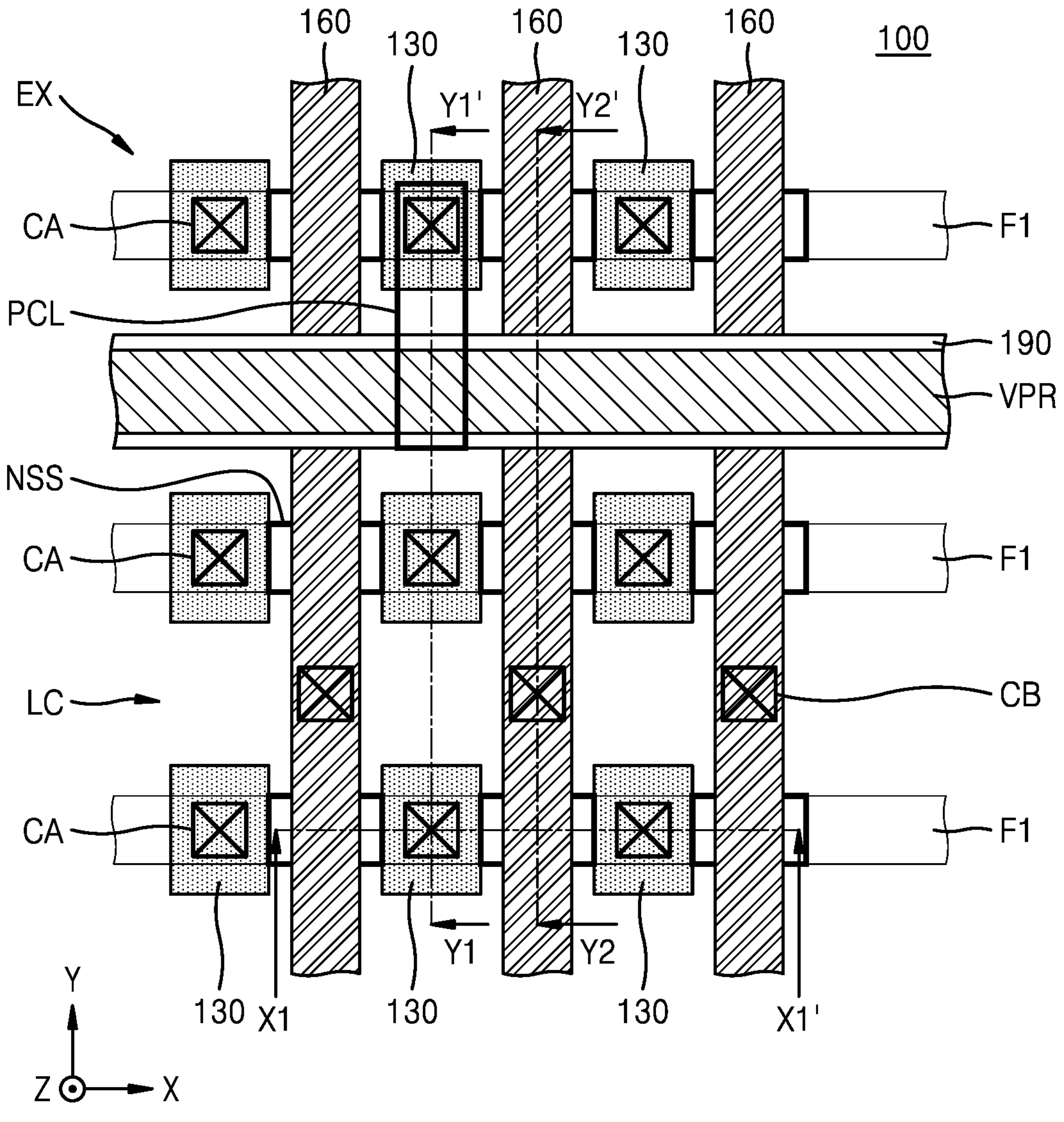
FIG. 2 is a plan layout diagram of an IC device according to an embodiment of the present inventive concept.
Figure 3A:
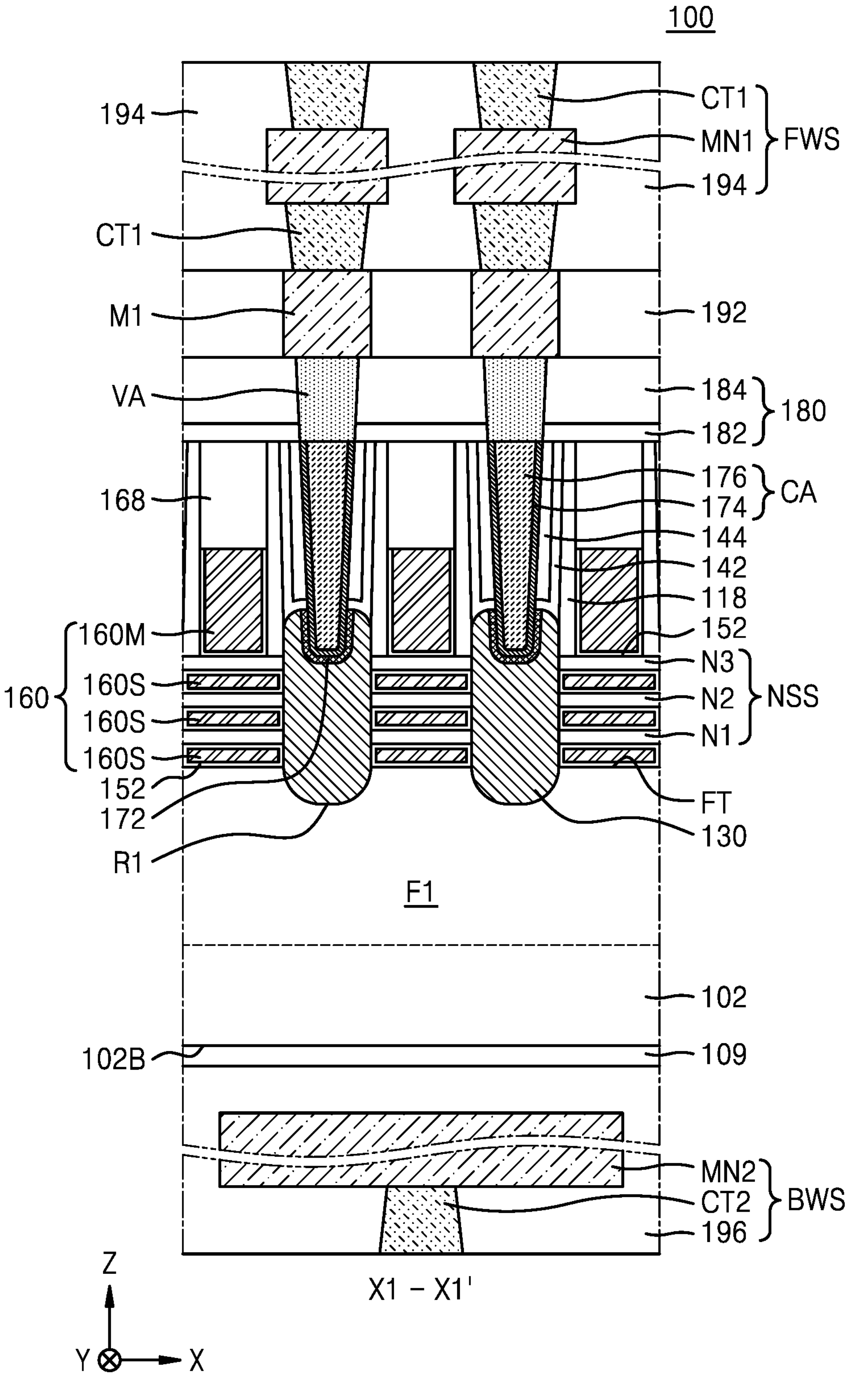
FIG. 3A is a cross-sectional view taken along line X1-X1' of FIG. 2.
Figure 3B:
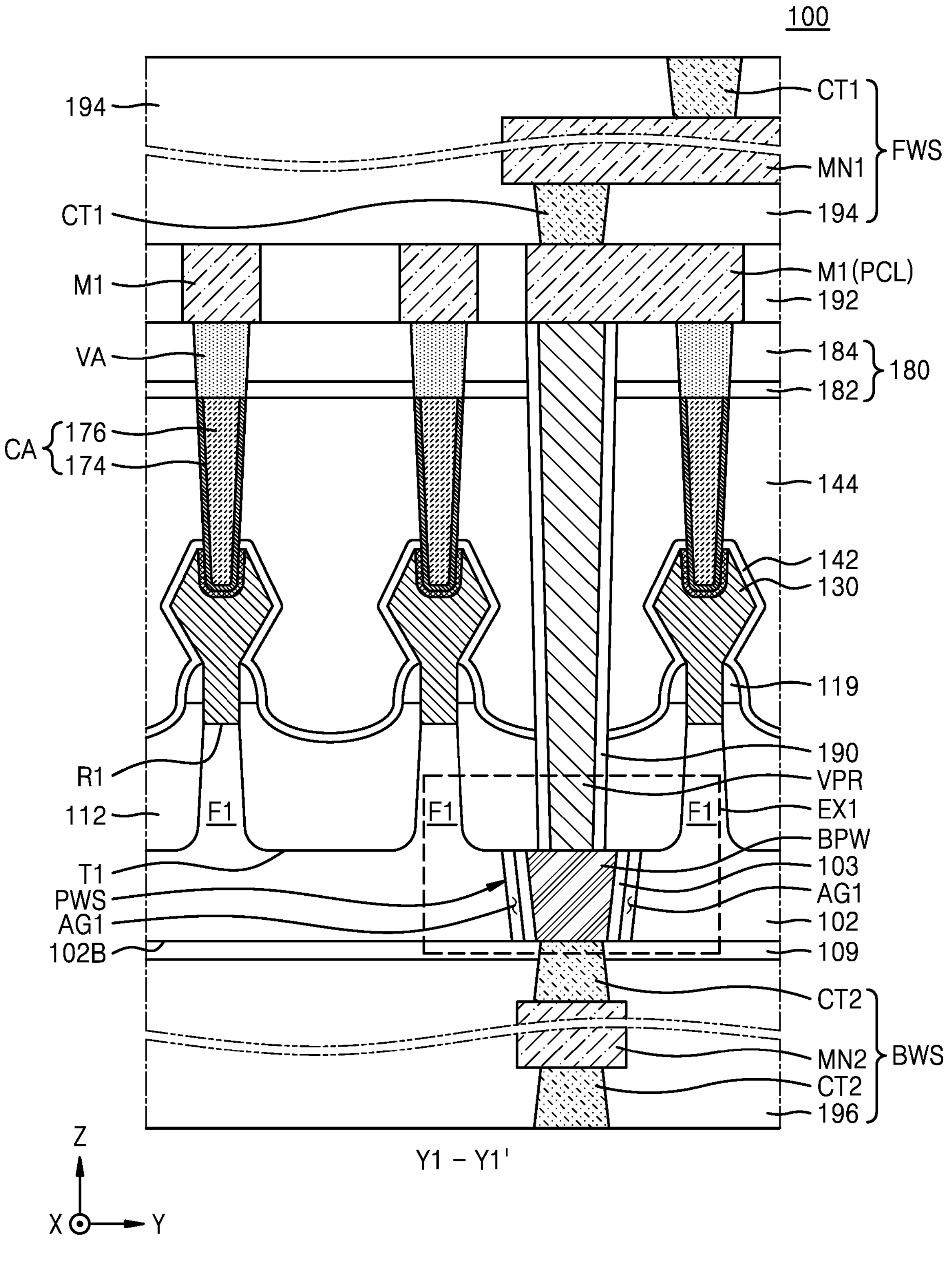
FIG. 3B is a cross-sectional view taken along line Y1-Y1' of FIG. 2.
Figure 3C:
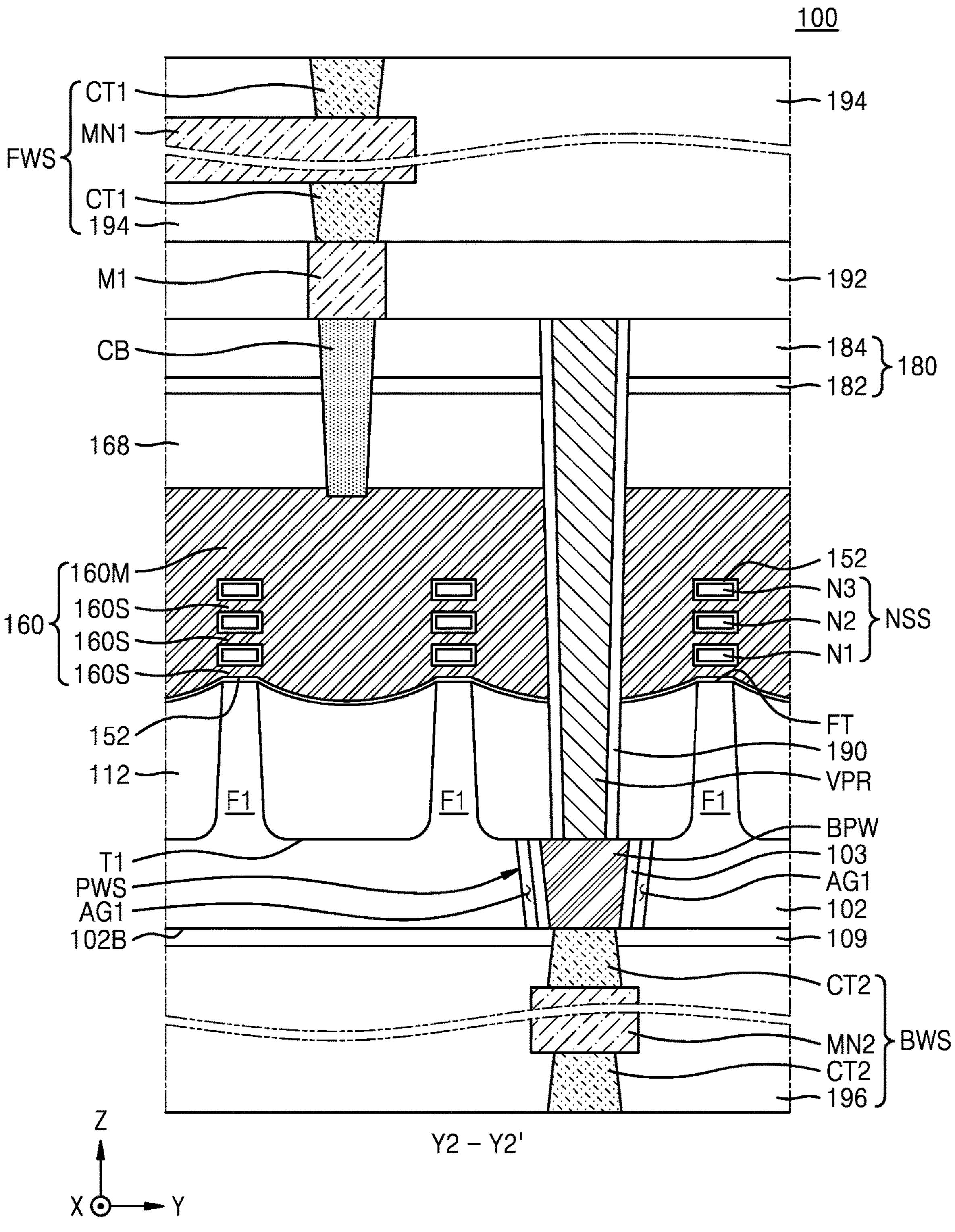
FIG. 3C is a cross-sectional view taken along line Y2-Y2' of FIG. 2.
Figure 3D:
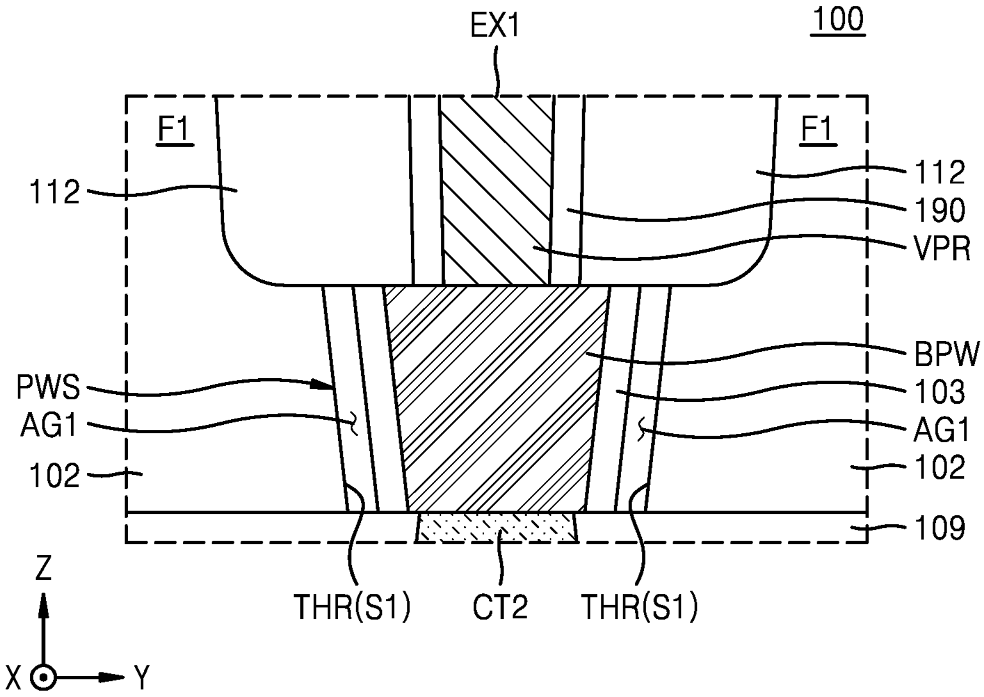
FIG. 3D is an enlarged cross-sectional view of portion "EX1" of FIG. 3B.

FIG. 2 is a plan layout diagram of an IC device 100 according to an embodiment of the present inventive concept. FIG. 2 illustrates a planar layout of some components of portion "EX" of FIG. 1. FIG. 3A is a cross-sectional view taken along line X1-X1' of FIG. 2. FIG. 3B is a cross-sectional view taken along line Y1-Y1' of FIG. 2. FIG. 3C is a cross-sectional view taken along line Y2-Y2' of FIG. 2. FIG. 3D is an enlarged cross-sectional view of portion "EX" of FIG. 3B. The IC device 100 including a field-effect transistor (FET) having a gate-all-around structure including an active region of a nanowire or nanosheet type and a gate surrounding the active region is described with reference to FIGS. 2 and 3A to 3D. The IC device 100 may constitute some of a plurality of logic cells LC shown in FIG. 1.

Referring to FIGS. 2 and 3A to 3D, the IC device 100 may include two logic cells LC, which are adjacent to each other in a second lateral direction (e.g., the Y direction) with a via power rail VPR therebetween. In some embodiments of the present inventive concept, the via power rail VPR may constitute the ground line VSS shown in FIG. 1.

The IC device 100 may include a substrate 102 having a backside surface 102B and a plurality of fin-type active regions F1 protruding from the substrate 102 to define a plurality of trench regions T1 on the substrate 102 on an opposite side of the backside surface 102B. The plurality of fin-type active regions F1 may extend long in a first lateral direction (e.g., the X direction) and extend parallel to each other on the substrate 102.

The substrate 102 may include an element semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship. The substrate 102 may include a conductive region, for example, a doped well or a doped structure.

A device isolation film 112 may be in the trench region T1 defining the plurality of fin-type active regions F1. The device isolation film 112 may cover a portion of a sidewall of each of the plurality of fin-type active regions F1 in the plurality of trench regions T1. The device isolation film 112 may include, for example, a silicon oxide film, without being limited thereto.

As shown in FIGS. 3B and 3C, the via power rail VPR may extend in the vertical direction (e.g., a Z direction) between a pair of fin-type active regions F1, which are selected from the plurality of fin-type active regions F1 and are adjacent to each other, and between a pair of source/drain regions 130 on the pair of fin-type active regions F1. The via power rail VPR may pass through the device isolation film 112 in a vertical direction (e.g., the Z direction).

A sidewall of the via power rail VPR may be at least partially surrounded by an insulating spacer 190. In some embodiments of the present inventive concept, the via power rail VPR may include a metal wiring layer and a conductive barrier layer at least partially surrounding the metal wiring layer. The metal wiring layer may include, for example, ruthenium (Ru), cobalt (Co), tungsten (W), or a combination thereof. The conductive barrier layer may include, for example, titanium (Ti), titanium nitride (TiN), tantalum (Ta), tantalum nitride (TaN), or a combination thereof. The insulating spacer 190 may include, for example, a silicon (Si) oxide film, a silicon oxynitride film, a silicon nitride film, or a combination thereof.

The back side surface 102B of the substrate 102 may be covered by a backside insulating film 109. The backside insulating film 109 may include a silicon oxide film, a silicon nitride film, silicon carbide film, a low-k dielectric film, or a combination thereof. The low-k dielectric film may include, for example, fluorine-doped silicon oxide, organosilicate glass, carbon-doped oxide, porous silicon oxide, porous organosilicate glass, a spin-on organic polymeric dielectric, a spin-on silicon-based polymeric dielectric, or a combination thereof, without being limited thereto.

As shown in FIGS. 3B, 3C, and 3D, the substrate 102 may include a backside power structure PWS passing through the substrate 102 in the vertical direction (e.g., Z direction) at a position overlapping the via power rail VPR in the vertical direction (e.g., the Z direction). The substrate 102 may have a through region THR that accommodates the backside power structure PWS.

The backside power structure PWS may include a backside power rail BPW and an insulating liner 103 and air spacers AG1, which cover both sidewalls of the backside power rail BPW. As used herein, the term "air spacer" may refer to, for example, a space including other gases that may be in the atmosphere or during a manufacturing process.

The insulating liner 103 may be between the backside power rail BPW and the air spacer AG1. For example, the insulating liner 103 may be in contact with the sidewalls of the backside power rail BPW. The air spacers AG1 may be between the substrate 102 and the insulating liner 103. The substrate 102, the insulating liner 103, and the device isolation film 112 may be exposed by the air spacers AG1. A width of the air spacers AG1 in the second lateral direction (e.g., the Y direction) may be defined by the substrate 102 and the insulating liner 103. In some embodiments of the present inventive concept, each of the air spacers AG1 may have a width of about 1 nm to about 5 nm (e.g., about 2 nm to about 4 nm) in the second lateral direction (e.g., the Y direction) on one sidewall of the backside power rail BPW, without being limited thereto. A length of the air spacers AG1 in the vertical direction (e.g., the Z direction) may be defined by the device isolation film 112 and the backside insulating film 109.

In some embodiments of the present inventive concept, the insulating liner 103 may include a silicon oxide film, a silicon nitride film, or a combination thereof. In an example, the insulating liner 103 may include a single material film, which includes a silicon oxide film or a silicon nitride film. In another example, the insulating liner 103 may have a double structure including a silicon oxide film and a silicon nitride film. In another example, the insulating liner 103 may include a triple structure in which a first silicon oxide film, a silicon nitride film, and a second silicon oxide film are sequentially stacked on each other. However, the configuration of the insulating liner 103 is not limited to the examples described above, and constituent materials and structures of the insulating liner 103 may be variously modified within the scope of the present inventive concept.

The backside power rail BPW may pass through the substrate 102 in the vertical direction (e.g., the Z direction) at a position overlapping the via power rail VPR in the vertical direction (e.g., the Z direction), and may be connected to one end of the via power rail VPR. A top surface of the backside power rail BPW, which faces the device isolation film 112, may be in contact with a bottom surface of the via power rail VPR, which faces the substrate 102.

In some embodiments of the present inventive concept, the backside power rail BPW may include a metal wiring layer and a conductive barrier layer at least partially surrounding the metal wiring layer. Detailed configurations of the metal wiring layer and the conductive barrier layer in the backside power rail BPW may be generally the same as those of the metal wiring layer and the conductive barrier layer in the via power rail VPR.

As can be seen more clearly from FIG. 3D, the through region THR of the substrate 102 may accommodate the backside power rail BPW, the insulating liner 103, and the air spacers AG1. The through region THR of the substrate 102 may have a pair of inner sidewalls S1 exposed at the air spacers AG1. The pair of inner sidewalls S1 of the through region THR may define a width of the through region THR in the second lateral direction (e.g., the Y direction). A distance between the pair of inner sidewalls S1 in the second lateral direction (e.g., the Y direction) may gradually reduce toward the backside surface 102B of the substrate 102. For example, a width of the through region THR in the second lateral direction (e.g., the Y direction) may gradually reduce toward the backside surface 120B of the substrate 102. For example, the through region THR may have a tapered shape.

The backside power rail BPW may have a width that gradually reduces toward the backside surface 102B of the substrate 102 in the second lateral direction (e.g., the Y direction). Each of the insulating liner 103 and the air spacers AG1 may substantially have a constant width in the second lateral direction (e.g., the Y direction), regardless of a distance from the backside surface 102B of the substrate 102.

As shown in FIG. 3B, the backside power structure PWS may be spaced apart from a pair of source/drain regions 130, which are on both sides of the via power rail VPR, with the device isolation film 112 therebetween, and the backside power structure PWS may be spaced apart from a pair of fin-type active regions F1, which are on both sides of the via power rail VPR, with the substrate 102 therebetween. Accordingly, the backside power rail BPW may be spaced apart from the pair of source/drain regions 130, which are on both sides of the via power rail VPR, with the device isolation film 112 therebetween, and the backside power structure PWS may be spaced apart from the pair of fin-type active regions F1, which are on both sides of the via power rail VPR, with the substrate 102 therebetween. The air spacers AG1 may cover both sidewalls of the backside power rail BPW in the second lateral direction (e.g., the Y direction). The backside power rail BPW may be spaced apart from the pair of fin-type active regions F1, which are on both sides of the via power rail VPR, with the insulating liner 103, the air spacers AG1, and the substrate 102 therebetween.

As shown in FIGS. 2, 3A, and 3C, a plurality of gate lines 160 may be on the plurality of fin-type active regions F1. Each of the plurality of gate lines 160 may extend long (e.g., lengthwise) in a second lateral direction (e.g., the Y direction), which intersects with the first lateral direction (e.g., the X direction). A plurality of nanosheet stacks NSS may be respectively on the fin top surfaces FT of the plurality of fin-type active regions F1 at intersections between the plurality of fin-type active regions F1 and the plurality of gate lines 160. Each of the plurality of nanosheet stacks NSS may include at least one nanosheet, which is spaced apart from a fin top surface FT of the fin-type active region F1 in a vertical direction (e.g., the Z direction) and faces the fin top surface FT. As used herein, the term "nanosheet" refers to, for example, a conductive structure having a cross-section that is substantially perpendicular to a direction in which current flows. The nanosheet may be interpreted as including a nanowire.

As shown in FIGS. 3A and 3C, each of the plurality of nanosheet stacks NSS may include a first nanosheet N1, a second nanosheet N2, and a third nanosheet N3, which overlap each other in the vertical direction (e.g., the Z direction) on the fin-type active region F1. The first nanosheet N1, the second nanosheet N2, and the third nanosheet N3 may be at different vertical distances (e.g., the Z-directional distances) from the fin top surface FT of the fin-type active region F1. Each of the plurality of gate lines 160 may at least partially surround the first nanosheet N1, the second nanosheet N2, and the third nanosheet N3 of the nanosheet NSS, which overlap each other in the vertical direction (e.g., the Z direction).

Although FIG. 2 illustrates a case in which the nanosheet stack NSS has a substantially rectangular planar shape, the present inventive concept is not limited thereto. The nanosheet stack NSS may have other planar shapes according to a planar shape of each of the fin-type active region F1 and the gate line 160. The present embodiment pertains to a configuration in which the plurality of nanosheet stacks NSS and the plurality of gate lines 160 are formed on one fin-type active region F1, and the plurality of nanosheet stacks NSS are arranged in a line in the first lateral direction (e.g., the X direction) on one fin-type active region F1. However, the number of nanosheet stacks NSS and the number of gate lines 160 on one fin-type active region F1 are not specifically limited.

Each of the first to third nanosheets N1, N2, and N3 included in the nanosheet stack NSS may function as a channel region. In some embodiments of the present inventive concept, each of the first to third nanosheets N1, N2, and N3 may have a thickness selected in a range of about 4 nm to about 6 nm, without being limited thereto. Here, the thickness of each of the first to third nanosheets N1, N2, and N3 refers to a size of each of the first to third nanosheets N1, N2, and N3 in the vertical direction (e.g., the Z direction). In some embodiments of the present inventive concept, the first to third nanosheets N1, N2, and N3 may have substantially the same thickness in the vertical direction (e.g., the Z direction). In some embodiments of the present inventive concept, at least some of the first to third nanosheets N1, N2, and N3 may have different thicknesses in the vertical direction (e.g., the Z direction). In some embodiments of the present inventive concept, each of the first nanosheet N1, the second nanosheet N2, and the third nanosheet N3 included in the nanosheet stack NSS may include a Si layer, a SiGe layer, or a combination thereof.

As shown in FIG. 3A, the first to third nanosheets N1, N2, and N3 included in one nanosheet stack NSS may have the same size or similar sizes in the first lateral direction (e.g., the X direction). In some embodiments of the present inventive concept, differently from that shown in FIG. 3A, at least some of the first to third nanosheets N1, N2, and N3 included in one nanosheet stack NSS may have different sizes in the first lateral direction (e.g., the X direction). The present embodiment pertains to an example in which each of the plurality of nanosheet stacks NSS includes three nanosheets, but the present inventive concept is not limited thereto. For example, the nanosheet stack NSS may include at least one nanosheet, and the number of nanosheets in the nanosheet stack NSS is not specifically limited.

As shown in FIGS. 3A and 3C, each of the plurality of gate lines 160 may include a main gate portion 160M and a plurality of sub-gate portions 160S. The main gate portion 160M may cover a top surface of the nanosheet stack NSS and extend in the second lateral direction (e.g., the Y direction). The plurality of sub-gate portions 160S may be integrally connected to the main gate portion 160M and respectively one-by-one arranged between the first to third nanosheets N1, N2, and N3 and between the first nanosheet N1 and the fin-type active region F1. In the vertical direction (e.g., the Z direction), a thickness of each of the plurality of sub-gate portions 160S may be less than a thickness of the main gate portion 160M.

As shown in FIGS. 3A and 3B, a plurality of recesses R1 may be formed in the fin-type active region F1. A lowermost surface of each of the plurality of recesses R1 may be at a lower vertical level than the fin top surface FT of the fin-type active region F1.

As shown in FIGS. 3A and 3B, a plurality of source/drain regions 130 may be respectively inside the plurality of recesses R1. Each of the plurality of source/drain regions 130 may be adjacent to at least one gate line 160 selected from the plurality of gate lines 160. Each of the plurality of source/drain regions 130 may have surfaces facing the first to third nanosheets N1, N2, and N3 included in the nanosheet stack NSS adjacent thereto. For example, each of the plurality of source/drain regions 130 may be in contact with the first to third nanosheets N1, N2, and N3 included in the nanosheet stack NSS adjacent thereto.

Each of the gate lines 160 may include, for example, a metal, a metal nitride, a metal carbide, or a combination thereof. The metal may include at least one of, for example, titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may include, for example, titanium nitride (TiN) and tantalum nitride (TaN). The metal carbide may include titanium aluminum carbide (TiAlC). However, a material included in the plurality of gate lines 160 is not limited to the examples described above.

A gate dielectric film 152 may be disposed between the nanosheet stack NSS and the gate line 160. In some embodiments of the present inventive concept, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In some embodiments of the present inventive concept, the interface dielectric film may be omitted. The high-k dielectric film may include a material having a dielectric constant higher than a silicon oxide film. For example, the high-k dielectric film may have a dielectric constant of about 10 to about 25. The high-k dielectric film may include, for example, hafnium oxide, without being limited thereto.

As shown in FIGS. 3A and 3C, a top surface of each of the gate dielectric film 152 and the gate line 160 may be covered by the capping insulating pattern 168. The capping insulating pattern 168 may include a silicon nitride film. Both sidewalls of each of the gate line 160 and the capping insulating pattern 168 may be covered by outer insulating spacers 118. The outer insulating spacers 118 may cover both sidewalls of the main gate portion 160M and may be disposed on top surfaces of the plurality of nanosheet stacks NSS. The outer insulating spacers 118 may be spaced apart from the gate line 160 with the gate dielectric film 152 therebetween.

As shown in FIG. 3B, a plurality of recess-side insulating spacers 119 may cover sidewalls of the source/drain region 130 and may be disposed on a top surface of the isolation film 112. In some embodiments of the present inventive concept, the recess-side insulating spacers 119 may be respectively and integrally connected to the outer insulating spacer 118 adjacent thereto.

The plurality of outer insulating spacers 118 and the plurality of recess-side insulating spacers 119 may each include, for example, silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

A metal silicide film 172 may be formed on a top surface of each of the plurality of source/drain regions 130. The metal silicide film 172 may include a metal, which includes, for example, titanium (Ti), tungsten (W), ruthenium (Ru), niobium (Nb), molybdenum (Mo), hafnium (H), nickel (Ni), cobalt (Co), platinum (Pt), ytterbium (Yb), terbium (Tb), dysprosium (Dy), erbium (Er), or palladium (Pd). For example, the metal silicide film 172 may include titanium silicide, without being limited thereto.

An insulating liner 142 may cover the plurality of source/drain regions 130, a plurality of metal silicide films 172, and the plurality of outer insulating spacers 118 and may be disposed on the substrate 102. In some embodiments, the insulating liner 142 may be omitted. An inter-gate dielectric film 144 may be disposed on the insulating liner 142. When the insulating liner 142 is omitted, the inter-gate dielectric film 144 may be in contact with the plurality of source/drain regions 130. In some embodiments of the present inventive concept, the insulating liner 142 may include silicon nitride, SiCN, SiBN, SiON, SiOCN, SiBCN, or a combination thereof, without being limited thereto. The inter-gate dielectric film 144 may include a silicon oxide film, without being limited thereto.

Both sidewalls of each of the plurality of sub-gate portions 160S included in the plurality of gate lines 160 may be spaced apart from the source/drain region 130 with the gate dielectric film 152 therebetween. The gate dielectric film 152 may be between the sub-gate portion 160S included in the gate line 160 and each of the first to third nanosheets N1, N2, and N3 and between the sub-gate portion 160S included in the gate line 160 and the source/drain region 130.

The plurality of nanosheet stacks NSS may be respectively disposed on the fin top surfaces FT of the plurality of fin-type active regions F1 in regions where the plurality of fin-type active regions F1 intersect with the plurality of gate lines 160. Each of the plurality of nanosheet stacks NSS may be spaced apart from the fin-type active region F1 and face the fin top surface FT of the fin-type active region F1. On the substrate 102, a plurality of nanosheet transistors may be formed at intersections between the plurality of fin-type active regions F1 and the plurality of gate lines 160.

As shown in FIGS. 3A and 3B, a plurality of source/drain contacts CA may be respectively disposed on the plurality of source/drain regions 130. Each of the plurality of source/drain contacts CA may pass through the inter-gate dielectric film 144 and the insulating liner 142 in the vertical direction (e.g., the Z direction) and be in contact with the metal silicide film 172. Each of the plurality of source/drain contacts CA may be electrically connectable to the source/drain region 130 through the metal silicide film 172. Each of the plurality of source/drain contacts CA may be spaced apart from the main gate portion 160M with the outer insulating spacer 118 therebetween in the first lateral direction (e.g., the X direction).

Each of the plurality of source/drain contacts CA may include a conductive barrier pattern 174 and a contact plug 176, which are sequentially stacked on the source/drain region 130. The conductive barrier pattern 174 may at least partially surround and contact a bottom surface and a sidewall of the contact plug 176. Each of the plurality of source/drain contacts CA may pass through the inter-gate dielectric film 144 and the insulating liner 142 and extend long in the vertical direction (e.g., the Z direction). The conductive barrier pattern 174 may be between the metal silicide film 172 and the contact plug 176. The conductive barrier pattern 174 may have a surface in contact with the metal silicide film 172 and a surface in contact with the contact plug 176. In some embodiments of the present inventive concept, the conductive barrier pattern 174 may include a metal or a metal nitride. For example, the conductive barrier pattern 174 may include titanium (Ti), tantalum (Ta), tungsten (W), titanium nitride (TiN), tantalum (TaN), tungsten nitride (WN), tungsten carbon nitride (WCN), titanium silicon nitride (TiSiN), tantalum silicon nitride (TaSiN), tungsten silicon nitride (WSiN), or a combination thereof, without being limited thereto. The contact plug 176 may include, for example, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

As shown in FIG. 3B, from among the plurality of source/drain contacts CA, the source/drain contact CA adjacent to the via power rail VPR may be spaced apart from the via power rail VPR in the second lateral direction (e.g., the Y direction).

As shown in FIGS. 3A to 3C, an upper insulating structure 180 may cover a top surface of each of the plurality of source/drain contacts CA, the plurality of capping insulating patterns 168, and the inter-gate dielectric film 144. The upper insulating structure 180 may include an etch stop film 182 and an interlayer insulating film 184, which are sequentially stacked on each of the plurality of source/drain contacts CA, the plurality of capping insulating patterns 168, and the inter-gate dielectric film 144. The etch stop film 182 may include, for example, silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The interlayer insulating film 184 may include, for example, an oxide film, a nitride film, an ultralow-k (ULK) film having an ultralow dielectric constant K of about 2.2 to about 2.4, or a combination thereof. For example, the interlayer insulating film 184 may include, for example, a tetraethylorthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without being limited thereto.

As shown in FIGS. 3A and 3B, a plurality of source/drain via contacts VA may respectively be disposed on the plurality of source/drain contacts CA. Each of the plurality of source/drain via contacts VA may pass through the upper insulating structure 180 and be in contact with the source/drain contact CA. Each of the plurality of source/drain regions 130 may be electrically connected to the source/drain via contact VA through the metal silicide film 172 and the source/drain contact CA. A bottom surface of each of the plurality of source/drain via contacts VA may be in contact with the top surface of the source/drain contact CA.

As shown in FIGS. 2 and 3C, a gate contact CB may be disposed on the gate line 160. The gate contact CB may be connected to the gate line 160 by passing through the upper insulating structure 180 and the capping insulating pattern 168 in the vertical direction (e.g., the Z direction). A bottom surface of the gate contact CB may be in contact with a top surface of the gate line 160.

The plurality of source/drain via contacts VA and the gate contact CB may each include a contact plug, which includes, for example, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, but a constituent material of the contact plug is not limited thereto. In some embodiments of the present inventive concept, the plurality of source/drain via contacts VA and the gate contact CB may further include a conductive barrier pattern at least partially surrounding a portion of the contact plug. The conductive barrier pattern included in the plurality of source/drain via contacts VA and the gate contact CB may include a metal or a metal nitride. For example, the conductive barrier pattern may include Ti, Ta, W, TiN, TaN, WN, WCN, TiSiN, TaSiN, WSiN, or a combination thereof, without being limited thereto.

The via power rail VPR and the insulating spacer 190 may pass through the upper insulating structure 180, the capping insulating pattern 168, the gate line 160, the inter-gate dielectric film 144, the insulating liner 142, and the device isolation film 112 in the vertical direction (e.g., the Z direction). A portion of the gate line 160, which is penetrated by the via power rail VPR and the insulating spacer 190 in the vertical direction (e.g., the Z direction), may be a region between a pair of nanosheet stacks NSS, which are adjacent to each other, from among the plurality of nanosheet stacks NSS. The via power rail VPR may be spaced apart from the gate line 160 with the insulating spacer 190 therebetween in a lateral direction (e.g., the second lateral direction (e.g., the Y direction)). The via power rail VPR and the insulating spacer 190 may be spaced apart from the plurality of source/drain regions 130 in the lateral direction (e.g., the second lateral direction (e.g., the Y direction)).

As shown in FIG. 3C, the backside power structure PWS including the backside power rail BPW, the insulating liner 103, and the air spacers AG1 may be at a position overlapping the gate line 160 in the vertical direction (e.g., the Z direction). The backside power structure PWS may be spaced apart from the plurality of nanosheet stacks NSS with the device isolation film 112 therebetween.

As shown in FIGS. 3A, 3B, and 3C, an upper insulating film 192 may cover the top surface of the upper insulating structure 180, the top surface of each of the plurality of source/drain via contacts VA, and the top surface of the gate contact CB. A constituent material of the upper insulating film 192 may be substantially the same as that of the interlayer insulating film 184.

A plurality of upper wiring layers M1 may pass through the upper insulating film 192. Each of the plurality of upper wiring layers M1 may be connected to a selected one of the plurality of source/drain via contacts VA located thereunder or a selected one of a plurality of gate contacts (refer to CB in FIGS. 2 and 3C). The plurality of upper wiring layers M1 may include, for example, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

The plurality of upper wiring layers M1 may include a power connection conductive layer PCL connected to the via power rail VPR and disposed on the via power rail VPR. A selected one of the plurality of source/drain via contacts VA may be spaced apart from the via power rail VPR in the second lateral direction (e.g., the Y direction) and connected between the source/drain contact CA and the power connection conductive layer PCL. From among the plurality of source/drain regions 130, the source/drain region connected to the via power rail VPR may be configured to be electrically connected to the via power rail VPR through the source/drain contact CA, the source/drain via contact VA, and the power connection conductive layer PCL.

A front-side wiring structure FWS may be on the plurality of upper wiring layers M1 and the upper insulating film 192. The front-side wiring structure FWS may include a plurality of wiring layers MN1, a plurality of via contacts CT1, and an interlayer insulating film 194 covering the plurality of wiring layers MN1 and the plurality of via contacts CT1. The via power rail VPR may be connected to a selected one of the plurality of wiring layers MN1 through the upper wiring layer M1 and the via contact CT1. Constituent materials of the plurality of wiring layers MN1 and the plurality of via contacts CT1 may substantially be the same as those of the plurality of upper wiring layers M1, which have been described above. A constituent material of the interlayer insulating film 194 may substantially be the same as that of the interlayer insulating film 184, which has been described above.

A backside wiring structure BWS may be disposed on the backside insulating film 109. The backside wiring structure BWS may include a plurality of wiring layers MN2, a plurality of via contacts CT2 and an interlayer insulating film 196 covering the plurality of wiring layers MN2 and a plurality of via contacts CT2. A selected one of the plurality of via contacts CT2 may have one end, which passes through the backside insulating film 109 and contacts the backside power rail BPW, and another end, which is in contact with a selected one of the plurality of wiring layers MN2. The backside power rail BPW may be connected to a selected one of the plurality of wiring layers MN2 through the one via contact CT2. Constituent materials of the plurality of wiring layers MN2 and the plurality of via contacts CT2 may substantially be the same as those of the plurality of upper wiring layers M1, which have been described above. A constituent material of the interlayer insulating film 196 may be substantially the same as that of the interlayer insulating film 184, which has been described above.

As described above with reference to FIGS. 2 and 3A to 3D, the IC device 100 may include a backside power structure PWS passing through the substrate 102, and the backside power structure PWS may include a backside power rail BPW, an insulating liner 103 and air spacers AG1. The insulating liner 103 and the air gap spacers AG1 cover both sidewalls of the backside power rail BPW. By interposing the air spacers AG1 between the substrate 102 and the backside power rail BPW, the occurrence of a leakage current between the substrate 102 and the backside power rail BPW may be inhibited, and the likelihood of a short between the substrate 102 and the backside power rail BPW may be prevented. In addition, by interposing the air spacers AG1 between the substrate 102 and the backside power rail BPW, a thickness of the insulating liner 103 in the second lateral direction (e.g., the Y direction) may be reduced. Thus, a size of the backside power structure PWS in the second lateral direction (e.g., the Y direction) may be reduced. Accordingly, a structure that is advantageous in increasing the integration density of the IC device 100 may be provided.

Figure 4:
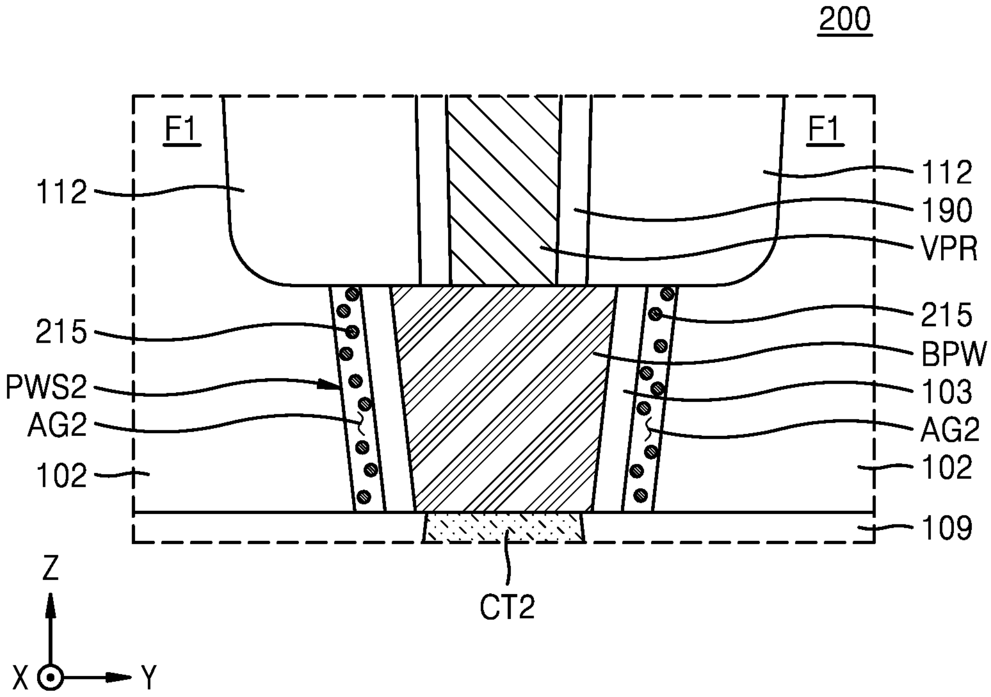
FIG. 4 is a cross-sectional view of an IC device according to an embodiment of the present inventive concept.

FIG. 4 is a cross-sectional view of an IC device 200 according to an embodiment of the present inventive concept. FIG. 4 illustrates an enlarged cross-sectional configuration of a portion corresponding to portion "EX1" of FIG. 3B in the IC device 200. The IC device 200 may constitute some of the plurality of cell blocks 12 shown in FIG. 1. In FIG. 4, the same reference numerals are used to denote the same elements as in FIGS. 2 and 3A to 3D, and repeated descriptions thereof may be omitted or briefly discussed.

Referring to FIG. 4, the IC device 200 may substantially have the same configuration as the IC device 100 described with reference to FIGS. 2 and 3A to 3D. However, the IC device 200 may include a backside power structure PWS2.

The backside power structure PWS2 may substantially have the same configuration as the backside power structure PWS described with reference to FIGS. 3B to 3D. However, the backside power structure PWS2 may include a backside power rail BPW, an insulating liner 103, air spacers AG2, and a plurality of char particles 215 that are dispersed in the air spacers AG2. The insulating liner 103 and air spacers AG2 may cover both sidewalls of the backside power rail BPW.

The plurality of char particles 215 may include char of hydrocarbon polymers. In some embodiments of the present inventive concept, the plurality of char particles 215 may include char of vinyl polymers. For example, the plurality of char particles 215 may include char of copolymers including an aromatic hydrocarbon polymer, a (meth)acrylic polymer, a vinylpyridine polymer, a vinylester polymer, a vinylpyrrolidone polymer, an olefin polymer, or a combination thereof. Specific examples of polymers used to form the plurality of char particles 215 are described below with reference to FIG. 10.

The plurality of char particles 215 may include various types of hydrocarbon compounds and/or solid carbides, which are generated when carbon rings of the hydrocarbon polymer are broken down by thermal decomposition. In some embodiments of the present inventive concept, the plurality of char particles 215 may include char of a hydrocarbon polymer including about 70% to about 90% by weight of carbon (C) and about 10% to about 30% by weight of hydrogen (H), based on a total weight of the plurality of char particles 215. For example, the plurality of char particles 215 may have various carbon contents, for example, a carbon content of about 72 weight percent (wt %) to about 88 wt % or a carbon content of about 75 wt % to about 85 wt %, based on the total weight of the plurality of char particles 215. In addition, the plurality of char particles 215 may include about 60% to about 90% by weight of carbon and about 10% to about 40% by weight of hydrogen, based on the total weight of the plurality of char particles 215. In addition, the plurality of char particles 215 may include about 80% to about 95% by weight of carbon (C) and about 5% to about 20% by weight of hydrogen (H), based on a total weight of the plurality of char particles 215.

In some embodiments of the present inventive concept, the plurality of char particles 215 may further include an additional component including a halogen element, nitrogen (N), oxygen (O), sulfur (S), phosphorus (P), sodium (Na), magnesium (Mg), manganese (Mn), silicon (Si), iron (Fe), or a combination thereof. The additional component may be derived from constituent elements of a polymer used to form the plurality of char particles 215. The additional component may be included at a content of about 0 wt % to about 10 wt %, based on the total weight of the plurality of char particles 215. In some embodiments of the present inventive concept, the plurality of char particles 215 may include a solid-phase material layer including thermal decomposition products of the polymer. The solid-phase material layer may have a porous structure.

The plurality of char particles 215 may have a lower dielectric constant than the insulating liner 103. In some embodiments of the present inventive concept, the plurality of char particles 215 may have a dielectric constant of about 1.1 to about 3.5, without being limited thereto.

As described above with reference to FIG. 4, the IC device 200 may include a backside power structure PWS2 passing through a substrate 102, and the backside power structure PWS2 may include a backside power rail BPW, the insulating liner 103, the air spacers AG2, and the plurality of char particles 215. The insulating liner 103 and the air spacers AG2 may cover both sidewalls of the backside power rail BPW, and the plurality of char particles 215 may be dispersed in the air spacers AG2. By interposing the air spacers AG2 and the plurality of char particles 215 between the substrate 102 and the backside power rail BPW, the occurrence of a leakage current between the substrate 102 and the backside power rail BPW may be inhibited, and the likelihood of a short between the substrate 102 and the backside power rail BPW may be prevented. In addition, by interposing the air spacers AG2 and the plurality of char particles 215 between the substrate 102 and the backside power rail BPW, a thickness of the insulating liner 103 in a second lateral direction (e.g., the Y direction) may be reduced. Accordingly, a structure that is advantageous in increasing the integration density of the IC device 200 may be provided.

Figure 5:
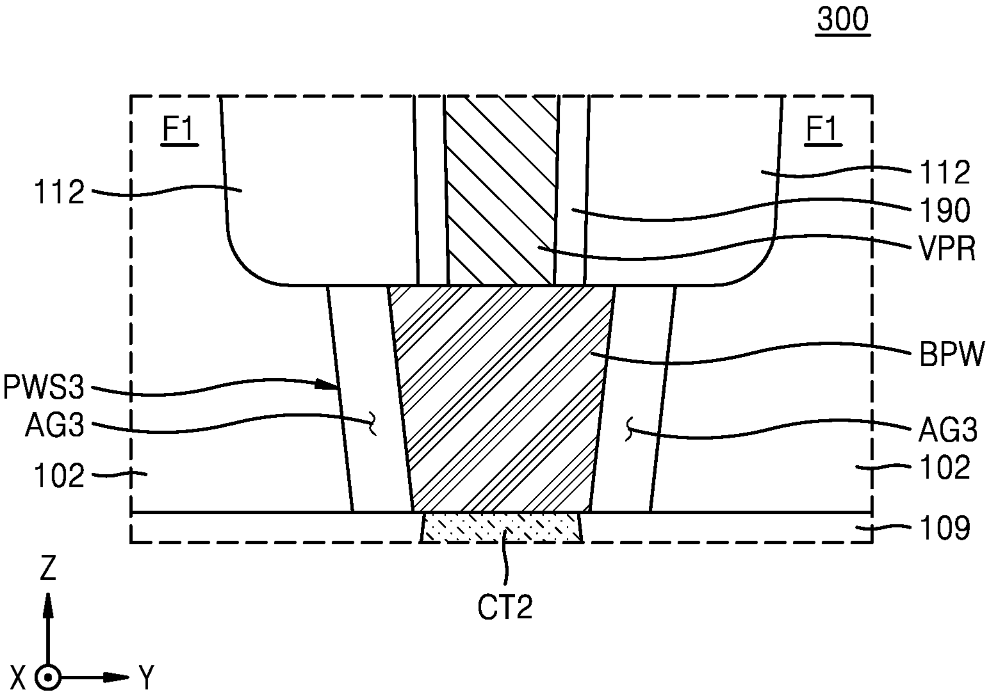
FIG. 5 is a cross-sectional view of an IC device according to an embodiment of the present inventive concept.

FIG. 5 is a cross-sectional view of an IC device 300 according to an embodiment of the present inventive concept. FIG. 5 illustrates an enlarged cross-sectional configuration of a portion corresponding to portion "EX1" of FIG. 3B in the IC device 300. The IC device 300 may constitute some of the plurality of cell blocks 12 shown in FIG. 1. In FIG. 5, the same reference numerals are used to denote the same elements as in FIGS. 2 and 3A to 3D, and repeated descriptions thereof may be omitted or briefly discussed.

Referring to FIG. 5, the IC device 300 may substantially have the same configuration as the IC device 100 described with reference to FIGS. 2 and 3A to 3D. However, the IC device 300 may include a backside power structure PWS3.

The backside power structure PWS3 may substantially have the same configuration as the backside power structure PWS described with reference to FIGS. 3B to 3D. However, the backside power structure PWS3 may include a backside power rail BPW and air spacers AG3 covering both sidewalls of the backside power rail BPW.

A substrate 102, the backside power rail BPW, the device isolation film 112, and the backside insulating film 109 may be exposed at the air spacers AG3. A width of the air spacers AG3 in a second lateral direction (e.g., the Y direction) may be defined by the substrate 102 and the backside power rail BPW. In some embodiments of the present inventive concept, each of the air spacers AG3 may have a width of about 2 nm to about 10 nm (e.g., about 4 nm to about 8 nm) in the second lateral direction (e.g., the Y direction) on one sidewall of the backside power rail BPW, without being limited thereto. A length of the air spacers AG3 in a vertical direction (e.g., the Z direction) may be defined by the device isolation film 112 and the backside insulating film 109.

As described above with reference to FIG. 5, the IC device 300 may include the backside power structure PWS3 passing through the substrate 102, and the backside power structure PWS3 may include the air spacers AG3 covering both sidewalls of the backside power rail BPW. By interposing the air spacers AG3 between the substrate 102 and the backside power rail BPW, the occurrence of a leakage current between the substrate 102 and the backside power rail BPW may be inhibited, and the likelihood of a short between the substrate 102 and the backside power rail BPW may be prevented. By interposing the air spacers AG3 between the substrate 102 and the backside power rail BPW, a distance for insulation between the substrate 102 and the backside power rail BPW may be reduced. Therefore, a structure that increases the integration density of the IC device 300 may be provided.

Figure 6:
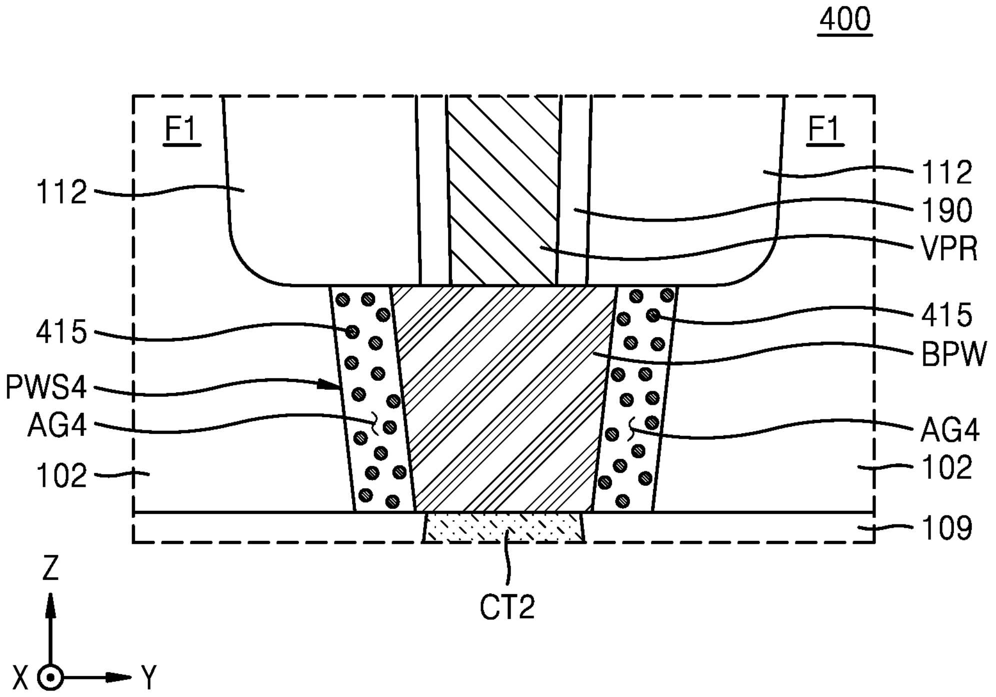
FIG. 6 is a cross-sectional view of an IC device according to an embodiment of the present inventive concept.

FIG. 6 is a cross-sectional view of an IC device 400 according to an embodiment of the present inventive concept. FIG. 6 illustrates an enlarged cross-sectional configuration of a portion corresponding to portion "EX1" of FIG. 3B in the IC device 400. The IC device 400 may constitute some of the plurality of cell blocks 12 shown in FIG. 1. In FIG. 6, the same reference numerals are used to denote the same elements as in FIGS. 2 and 3A to 3D, and repeated descriptions thereof may be omitted or briefly discussed.

Referring to FIG. 6, the IC device 400 may substantially have the same configuration as the IC device 100 described with reference to FIGS. 2 and 3A to 3D. However, the IC device 400 may include a backside power structure PWS4.

The backside power structure PWS4 may substantially have the same configuration as the backside power structure PWS described with reference to FIGS. 3B to 3D. However, the backside power structure PWS4 may include a backside power rail BPW, air spacers AG4 covering both sidewalls of the backside power rail BPW, and a plurality of char particles 415 dispersed in the air spacers AG4.

Details of the air spacer AG4 may substantially be the same as those of the air spacer AG3 described with reference to FIG. 5. Details of the plurality of char particles 415 may substantially be the same as those of the plurality of char particles 215 described with reference to FIG. 4.

As described above with reference to FIG. 6, the IC device 400 may include the backside power structure PWS4 passing through the substrate 102, and the backside power structure PWS4 may include the air spacers AG4 covering both sidewalls of the backside power rail BPW and the plurality of char particles 415 dispersed in the air spacers AG4. Accordingly, the occurrence of a leakage current between the substrate 102 and the backside power rail BPW may be inhibited, and the likelihood of a short between the substrate 102 and the backside power rail BPW may be prevented. In addition, by interposing the air spacers AG4 and the plurality of char particles 415 between the substrate 102 and the backside power rail BPW, a distance for insulation between the substrate 102 and the backside power rail BPW may be reduced. Therefore, a structure that increases the integration density of the IC device 400 may be provided.

Figure 7:
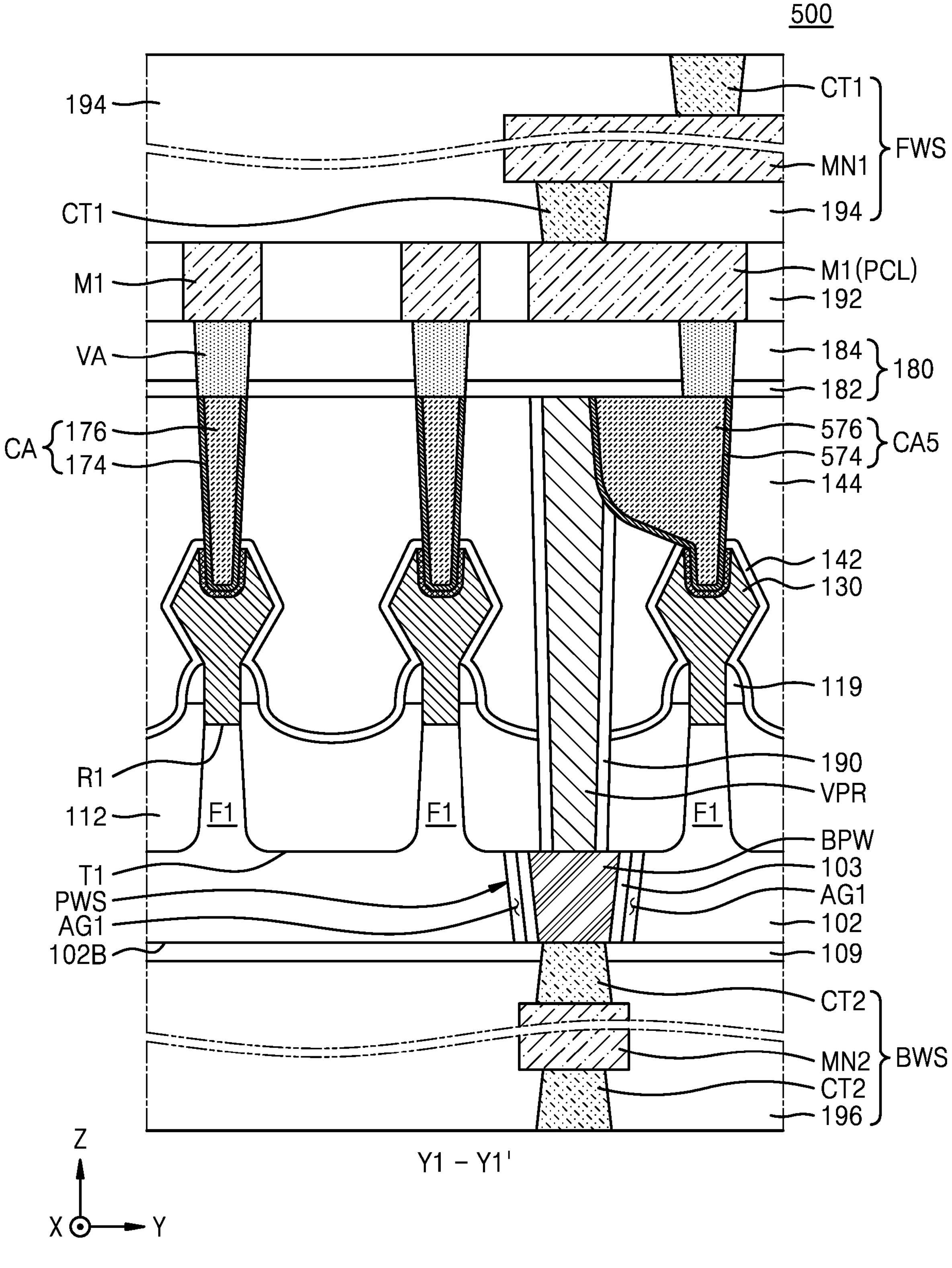
FIG. 7 is a cross-sectional view of an IC device according to an embodiment of the present inventive concept.

FIG. 7 is a cross-sectional view of an IC device 500 according to an embodiment of the present inventive concept. FIG. 7 illustrates a cross-sectional configuration of a portion corresponding to a cross-section taken along line Y1-Y1' of FIG. 2 in the IC device 500. In FIG. 7, the same reference numerals are used to denote the same elements as in FIGS. 2 and 3A to 3D, and repeated descriptions thereof may be omitted or briefly discussed. The IC device 500 may constitute some of the plurality of cell blocks 12 shown in FIG. 1.

Referring to FIG. 7, the IC device 500 may substantially have the same configuration as the IC device 100 described with reference to FIGS. 2 and 3A to 3D. However, in the IC device 500, a source/drain contact CA5 may be formed on a source/drain region 130 that is connected to the via power rail VPR, from among a plurality of source/drain regions 130. The source/drain contact CA5 may be connected between the source/drain region 130 and the via power rail VPR, and thus, the source/drain region 130 and the via power rail VPR may be electrically connectable to each other. The source/drain contact CA5 may have a greater width in the second lateral direction (e.g., the Y direction) than that of a source/drain contact CA, which is formed on another source/drain region 130 that is not connected to the via power rail VPR, from among the plurality of source/drain regions 130.

The source/drain contact CA5 may include a conductive barrier pattern 574 and a contact plug 576, which are sequentially stacked on the source/drain region 130. The conductive barrier pattern 574 may include a portion in contact with the metal silicide film 172 and a portion in contact with the via power rail VPR. Details of the conductive barrier pattern 574 and the contact plug 576 may substantially be the same as those of the conductive barrier pattern 174 and the contact plug 176 described with reference to FIGS. 3A and 3B.

A selected one of the source/drain via contacts VA may be connected between the source/drain contact CA5 and the power connection conductive layer PCL, and thus, the source/drain contact CA5 may be electrically connectable to a plurality of front-side wiring structures FWS that are disposed on a plurality of upper wiring layers M1.

Figure 8:
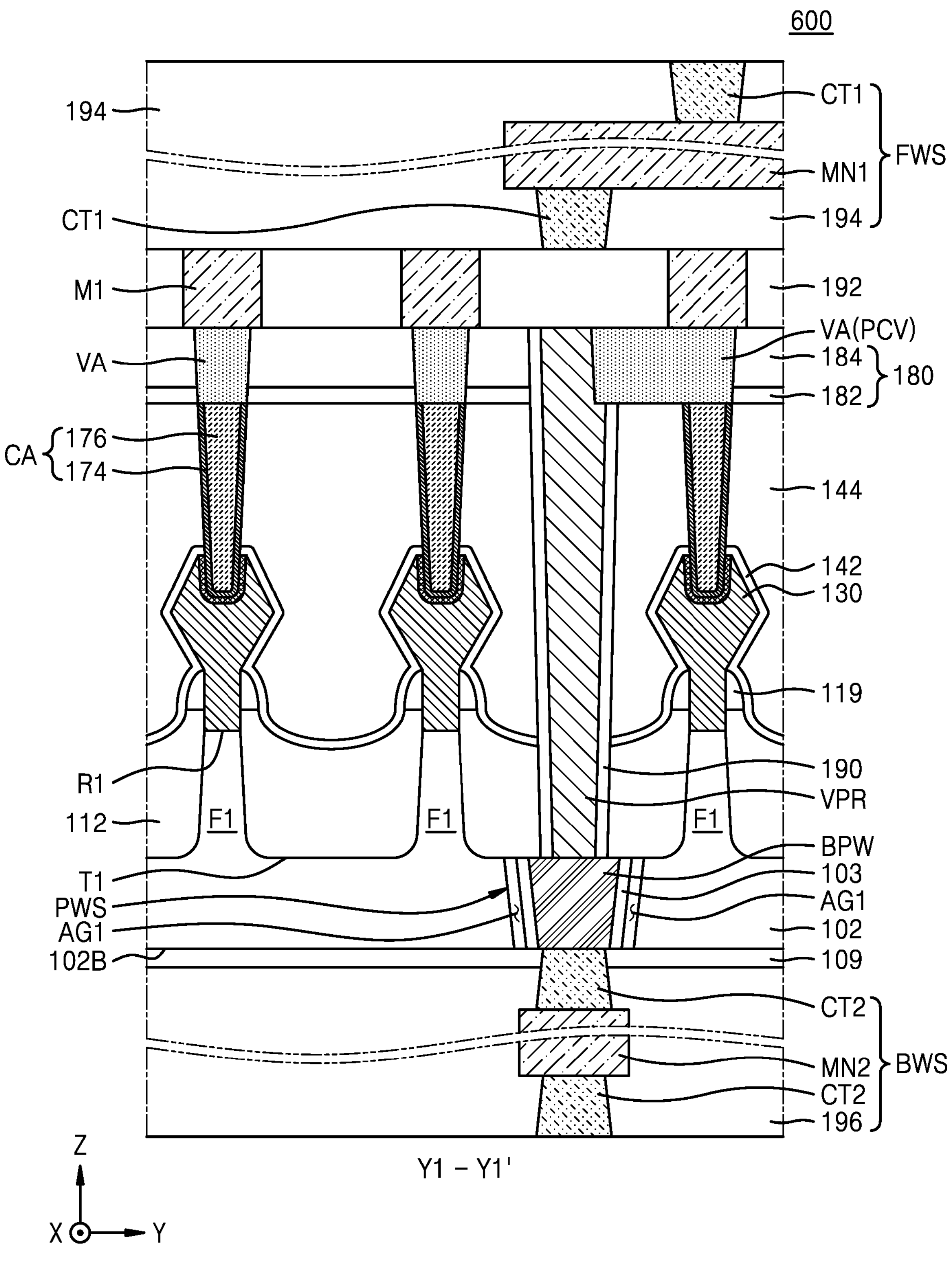
FIG. 8 is a cross-sectional view of an IC device according to an embodiment of the present inventive concept.

FIG. 8 is a cross-sectional view of an IC device 600 according to an embodiment of the present inventive concept. FIG. 8 illustrates a cross-sectional configuration of a portion corresponding to a cross-section taken along line Y1-Y1' of FIG. 2 in the IC device 600. In FIG. 8, the same reference numerals are used to denote the same elements as in FIGS. 2 and 3A to 3D, and repeated descriptions thereof may be omitted or briefly discussed. The IC device 600 may constitute some of the plurality of cell blocks 12 shown in FIG. 1.

Referring to FIG. 8, the IC device 600 may substantially have the same configuration as the IC device 100 described with reference to FIGS. 2 and 3A to 3D. However, in the IC device 600, a plurality of source/drain via contacts VA may include a power connection via PCV that is connected to a via power rail VPR.

The source/drain contact CA and the power connection via PCV may be sequentially stacked on the source/drain region 130 that is electrically connected to the via power rail VPR, from among the plurality of source/drain regions 130. The source/drain contact CA, which is disposed on the source/drain region 130 that is connected to the via power rail VPR, may substantially have the same configuration as the source/drain contact CA that is disposed on the source/drain region 130 that is not connected to the via power rail VPR. The power connection via PCV may have a greater width in the second lateral direction (e.g., the Y direction) than that of another source/drain via contact VA that is not connected to the via power rail VPR, from among the plurality of source/drain via contacts VA. The power connection via PCV may be at the same vertical level and include the same material as the other source/drain via contact VA that is not connected to the via power rail VPR.

The power connection via PCV may be connected to the source/drain contact CA, which is located on the source/drain region 130 that is connected to the via power rail VPR, and the via power rail VPR, and thus, the source/drain region 130 may be electrically connectable to the via power rail VPR through the source/drain contact CA and the power connection via PCV.

The power connection via PCV may be connected to a selected one of a plurality of upper wiring layers M1 and may be electrically connectable to a front-side wiring structure FWS, which is disposed on the plurality of upper wiring layers M1, through the selected upper wiring layer M1.

Similar to the IC device 100 described with reference to FIGS. 2 and 3A to 3D, each of the IC devices 500 and 600 described with reference to FIGS. 7 and 8 may include a backside power structure PWS passing through a substrate 102, and the backside power structure PWS may include a backside power rail BPW, an insulating liner 103, and air spacers AG1. The insulating liner 103 and the air spacers AG1 cover both sidewalls of the backside power rail BPW. Accordingly, the occurrence of a leakage current between the substrate 102 and the backside power rail BPW may be inhibited, and the likelihood of a short between the substrate 102 and the backside power rail BPW may be prevented. Furthermore, a size of the backside power structure PWS in the second lateral direction (e.g., the Y direction) may be reduced, and thus, a structure that increases the integration density of the IC device 100 may be provided.

Next, example methods of manufacturing an IC device, according to some embodiments of the present inventive concept, will be described.

FIGS. 9 to 28 are cross-sectional views of a process sequence of a method of manufacturing an IC device, according to an embodiment of the present inventive concept. More specifically, FIGS. 9 to 16, 17B, 18, 19B, 20 to 22, 23B, 24B, 25B, and 26 to 28 are cross-sectional views of an example cross-sectional structure of a portion corresponding to a cross-section taken along line Y1-Y1' of FIG. 2, according to a process sequence. FIGS. 17A, 19A, 23A, 24A, and 25A are cross-sectional views of an example cross-sectional structure of a portion corresponding to a cross-section taken along line X1-X1' of FIG. 2, according to a process sequence. FIGS. 17C, 19C, 23C, 24C, and 25C are cross-sectional views of an example cross-sectional structure of a portion corresponding to a cross-section taken along line Y2-Y2' of FIG. 2, according to a process sequence. An example method of manufacturing the IC device 100 shown in FIGS. 2 and 3A to 3D is described with reference to FIGS. 9 to 28D. In FIGS. 9 to 28, the same reference numerals are used to denote the same elements as in FIGS. 2 and 3A to 3D, and repeated descriptions thereof may be omitted or briefly discussed.

Figure 9:
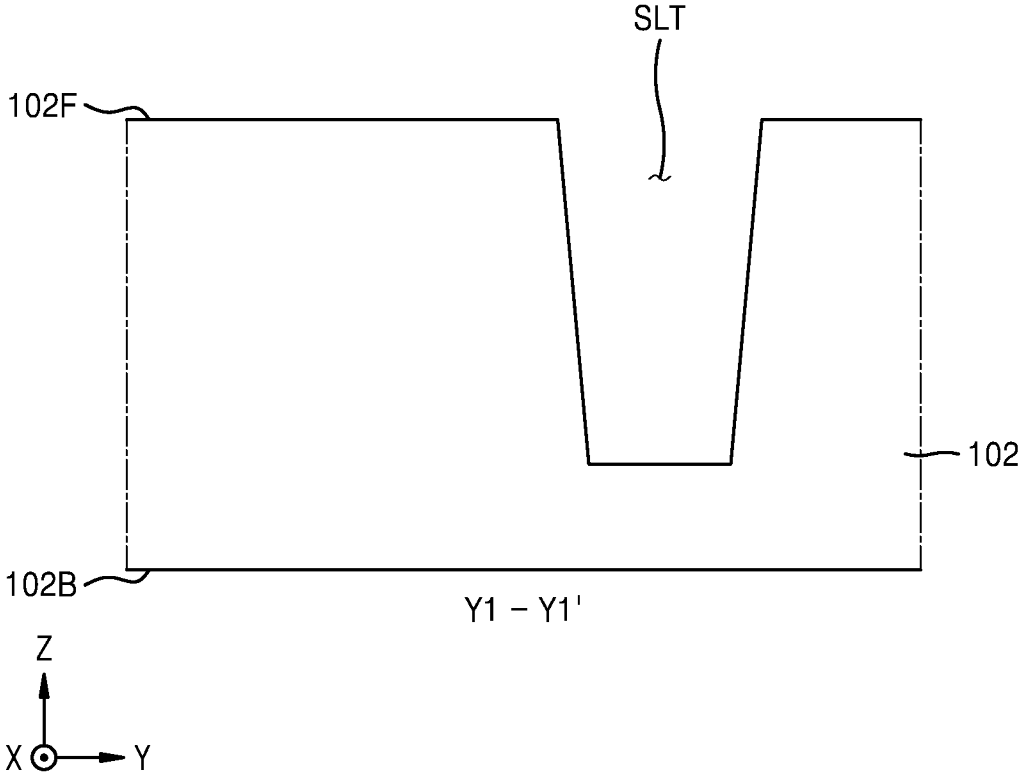
FIGS. 9, 10, 11, 12, 13, 14, 15, 16, 17A, 17B, 17C, 18, 19A, 19B, 19C, 20, 21, 22, 23A, 23B, 23C, 24A, 24B, 24C, 25A, 25B, 25C, 26, 27, and 28 are cross-sectional views of a process sequence of a method of manufacturing an IC device, according to an embodiment of the present inventive concept.

Referring to FIG. 9, a substrate 102 may be prepared, and a portion of the substrate 102 may be etched from a front-side surface 102F of the substrate 102, and thus, a sacrificial trench SLT may be formed in the substrate 102. For example, the sacrificial trench SLT may penetrate from the front-side surface 102F toward the backside surface 102B of the substrate 102. A portion of the substrate 102 may be exposed at a bottom surface of the sacrificial trench SLT. A sidewall of the sacrificial trench SLT may extend in an inclined direction, with respect to a direction perpendicular to the front-side surface 120F of the substrate 102, from the front-side surface 120F of the substrate 102 to the backside surface 102B thereof. A width of the sacrificial trench SLT in the second lateral direction (e.g., the Y direction) may gradually reduce in a direction away from the front-side surface 120F of the substrate 102 toward the backside surface 102B thereof. A partial space on the bottom side of the sacrificial trench SLT may provide a space in which a backside power structure PWS (refer to FIGS. 3B to 3D) is to be formed in a subsequent process.

Figure 10:
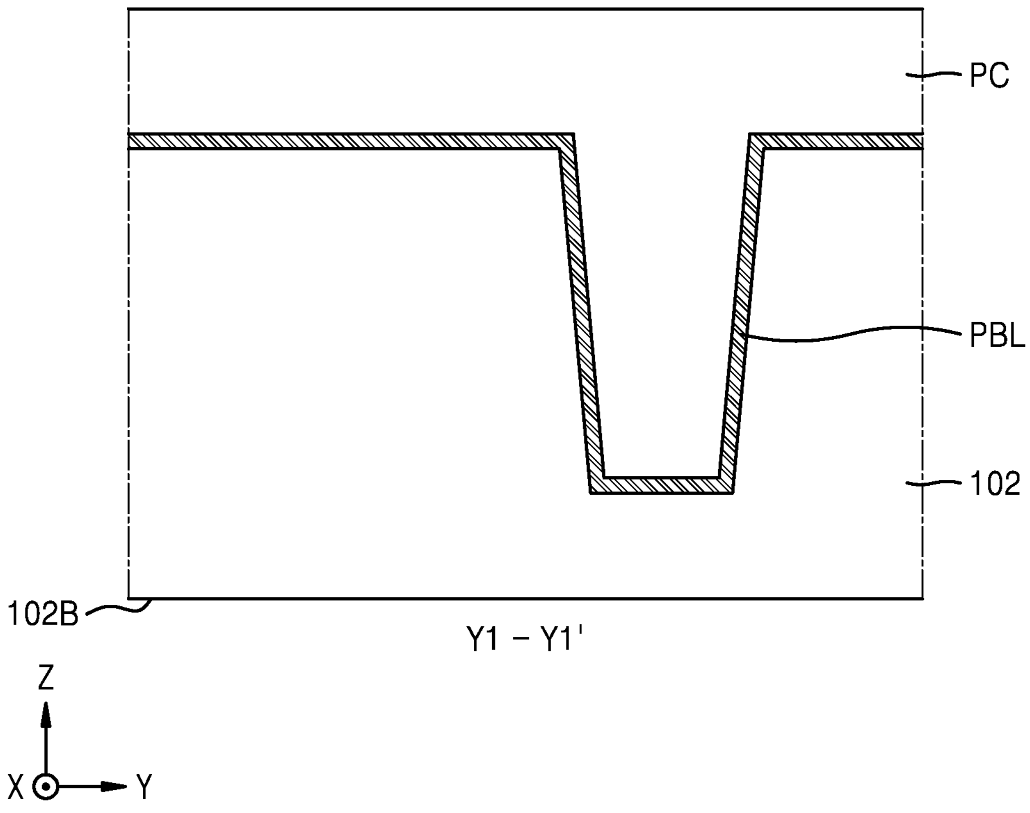

Referring to FIG. 10, after the resultant structure of FIG. 9 is cleaned, a polymer brush layer PBL may be formed to cover the substrate 102 in which the sacrificial trench SLT is formed.

In some embodiments of the present inventive concept, to form the polymer brush layer PBL, a series of processes may be performed as follows. For example, a polymer composition including an anchoring polymer having an anchoring group may be coated on the substrate 102 in which the sacrificial trench SLT is formed, and thus, a polymer composition layer PC may be formed. In some embodiments of the present inventive concept, the polymer composition layer PC may be formed to include only anchoring polymers having the same or similar molecular weights. For example, all the anchoring polymers included in the polymer composition layer PC may have a number-average molecular weight Mn that is selected in a range of about 2,000 to about 500,000. A polydispersity Mw/Mn refers to a ratio of a weight average molecular weight Mw to a number-average molecular weight Mn, and each of the anchoring polymers included in the polymer composition layer PC may have a polydispersity Mw/Mn may be about 1.5 or less (e.g., about 1.0 or less), without being limited thereto.

Thereafter, the polymer composition layer PC may be annealed to induce a reaction of the anchoring group of the anchoring polymer with a surface of the substrate 102 so that anchoring polymer may be grafted on surfaces of the substrate 102 in contact with the polymer composition layer PC. Thus, a polymer brush layer PBL may be formed on the substrate 102. In some embodiments of the present inventive concept, the anchoring polymer may be grafted on the surface of the substrate 102 by a condensation reaction of a hydroxyl group remaining on the surface of the substrate 102 after the substrate 102 is cleaned with a hydroxyl group, which is the anchoring group of the anchoring polymer. The annealing process for forming the polymer brush layer PBL may be performed at a temperature of about 150° C. to about 300° C. for about 60 seconds to about 300 seconds, without being limited thereto. In some embodiments of the present inventive concept, the polymer brush layer PBL may have a width of about 2 nm to about 10 nm (e.g., a width of about 4 nm to about 8 nm) in the second lateral direction (e.g., the Y direction), without being limited thereto.

The anchoring polymer included in the polymer composition layer PC may include, for example, a vinyl polymer derived from a C2-C30 monomer. For example, the anchoring polymer may include a copolymer including an aromatic hydrocarbon polymer, a (meth)acrylic polymer, a vinylpyridine polymer, a vinylester polymer, a vinylpyrrolidone polymer, an olefin polymer, or a combination thereof. When the anchoring polymer includes a copolymer, the copolymer may include a block copolymer or a random copolymer.

The aromatic hydrocarbon polymer may include, for example, a monomer unit derived from a styrene monomer, such as styrene, o-methylstyrene, m-methylstyrene, and p-methylstyrene.

The (meth)acrylate polymer may include, for example, a monomer unit derived from an alkyl(meth)acrylate monomer, a hydroxyl alkyl(meth)acrylate monomer, an oxyalkyl (meth)acrylate monomer, an aminoalkyl(meth)acrylate monomer, a fluorine (F) atom-containing monofunctional (meth)acrylate monomer, or a (meth)acrylamide monomer. In the monomers described above, an alkyl group may be a C1-C10 alkyl group.

The vinylpyridine polymer may include, for example, a monomer unit derived from vinylpyridine monomers, such as 2-vinyl pyridine, 3-vinyl pyridine, and 4-vinyl pyridine.

The vinylester polymer may include, for example, a monomer unit derived from vinyl acetate. The vinylpyrrolidone polymer may include, for example, a monomer unit derived from N-vinyl-2-pyrrolidone.

A monomer included in the olefin polymer may include a monomer unit derived from an olefin monomer, such as ethylene and butadiene.

For example, the anchoring polymer may include polystyrene, polydimethylsiloxane, polymethylmethacrylate, polyacrylate, polyvinyl acetate, poly(methylmethacrylate-random-trifluoroethyl methacrylate) (P(MMA-r-TFEMA)), or poly(methylmethacrylate-random-dodecafluoroheptyl methacrylate) (P(MMA-r-DFHMA)).

In the anchoring polymer included in the polymer composition layer PC, the anchoring group may anchor the anchoring polymer on exposed surfaces that are in contact with the polymer composition layer PC that is disposed on the substrate 102. In some embodiments of the present inventive concept, the anchoring group may include a substituted or unsubstituted hydroxyl group, a thiol group, an azide group, a carboxylic acid group, an amide group, an epoxide group, a vinyl group, or a trichlorosilane group. For example, the anchoring polymer may include a hydroxyl-terminated polymer, such as hydroxyl group-terminated polystyrene and hydroxyl group-terminated polymethyl methacrylate.

Figure 11:
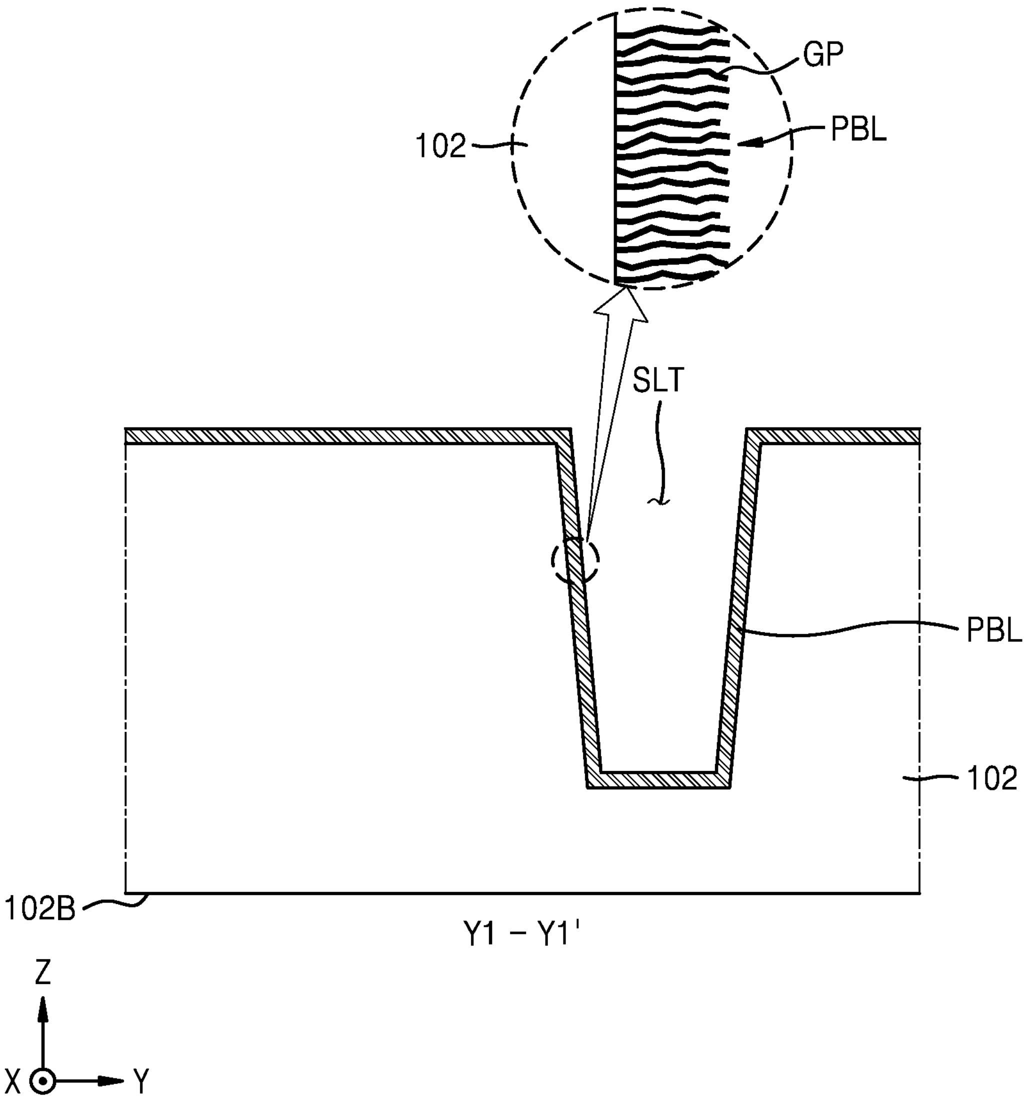

Referring to FIG. 11, unreacted portions of the polymer composition layer PC may be removed by using an organic solvent from the resultant structure of FIG. 10 to expose the polymer brush layer PBL.

Propylene glycol monomethyl ester acetate (PGMEA), propylene glycol monomethyl ester (PGME), ethyl-3-ethoxy propionate (EEP), ethyl lactate (EL), methyl 2-hydroxybutyate (HBM), or gamma-butyro lactone (GBL) may be used as the organic solvent, without being limited thereto.

The polymer brush layer PBL may include, for example, a plurality of graft polymers GP anchored on a surface of the substrate 102. One end of each of the plurality of graft polymers GP may be fixed on a surface of the substrate 102, and another end of each of the plurality of graft polymers GP may include a free end that is not fixed anywhere. By using polymers having the same or similar molecular weights as all the anchoring polymers included in the polymer composition layer PC shown in FIG. 10, each of the plurality of graft polymers GP anchored on the surface of the substrate 102 may substantially have a constant length. As a result, the polymer brush layer PBL having a substantially uniform thickness may be obtained on the surface of the substrate 102, and the polymer brush layer PBL is exposed inside and outside the sacrificial trench SLT.

Figure 12:
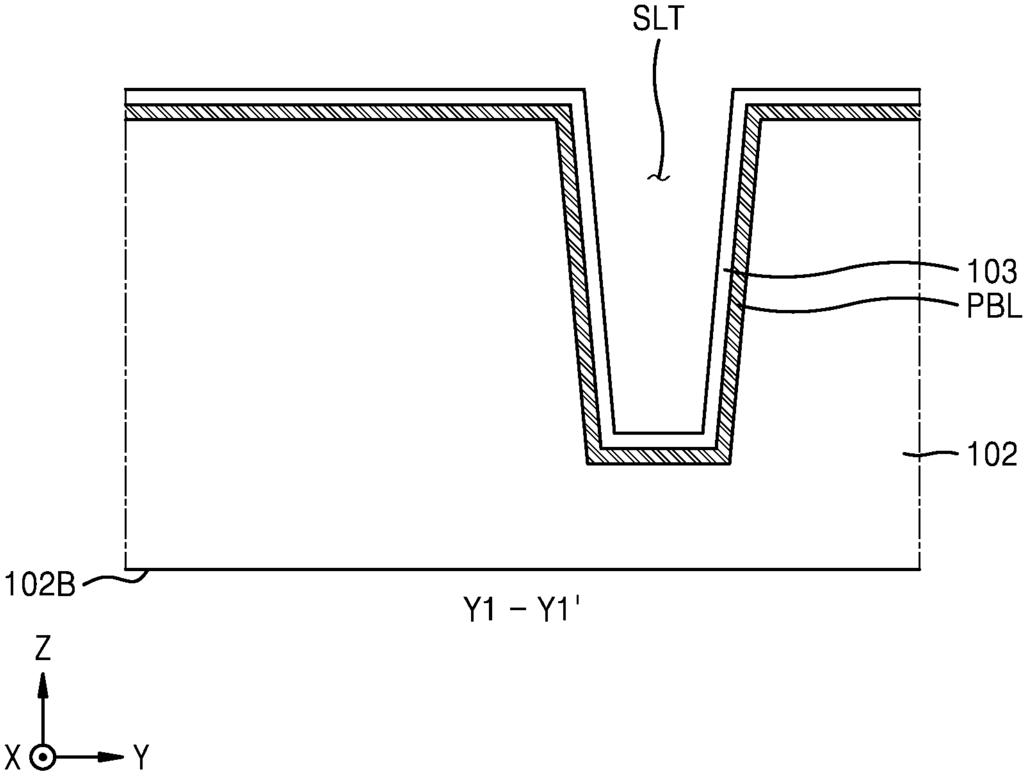

Referring to FIG. 12, an insulating liner 103 may be formed on the polymer brush layer PBL.

The insulating liner 103 may be formed to conformally cover the polymer brush layer PBL and may have a substantially uniform thickness. The insulating liner 103 may be formed by using an atomic layer deposition (ALD) process. The insulating liner 103 may include, for example, a silicon oxide film, a silicon nitride film, or a combination thereof.

Figure 13:
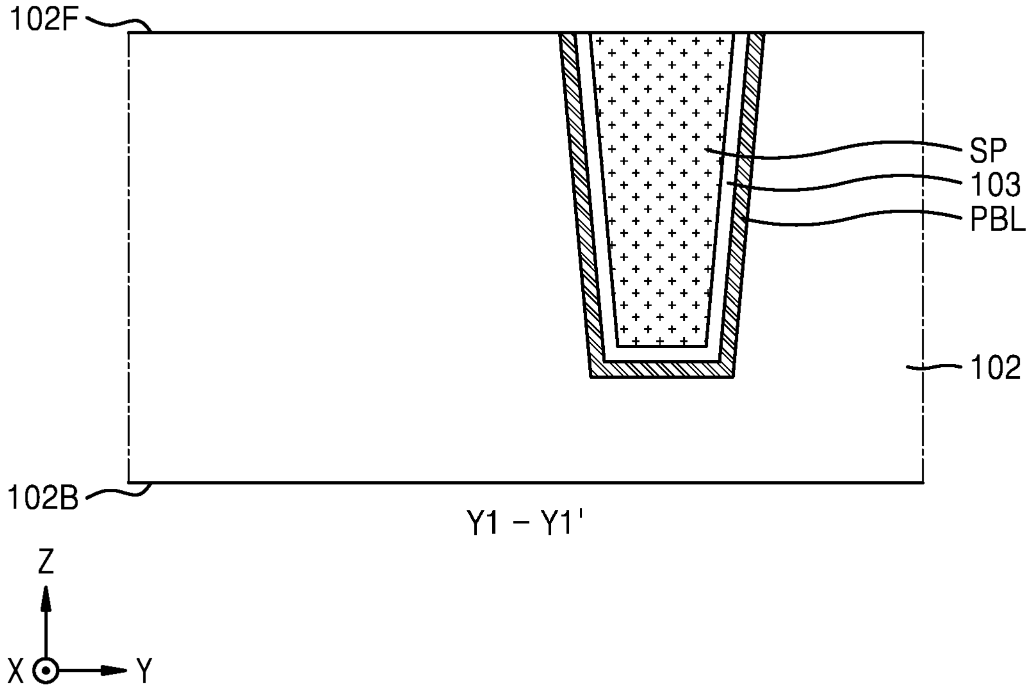

Referring to FIG. 13, in the resultant structure of FIG. 12, a sacrificial film may be formed to such a sufficient thickness as to fill remaining empty space of the sacrificial trench SLT after providing the insulating liner 103, and unnecessary portions of the sacrificial film may be removed from the front-side surface 102F of the substrate 102 to expose the front-side surface 102F of the substrate 102. As a result, a sacrificial pattern SP including a portion of the sacrificial film, which fills the remaining empty space of sacrificial trench SLT, may remain.

The sacrificial pattern SP may include, for example, a silicon nitride film, a silicon oxide film, or a combination thereof. In some embodiments of the present inventive concept, the sacrificial pattern SP may include a material having different etching characteristics from those of the insulating liner 103. In an example, the insulating liner 103 may include a silicon oxide film, and the sacrificial pattern SP may include a silicon nitride film. In another example, the insulating liner 103 may include a silicon nitride film, and the sacrificial pattern SP may include a silicon oxide film. However, the present inventive concept is not limited to the examples described above, and a constituent material of the sacrificial pattern SP may be selected from various materials used in the art.

Figure 14:
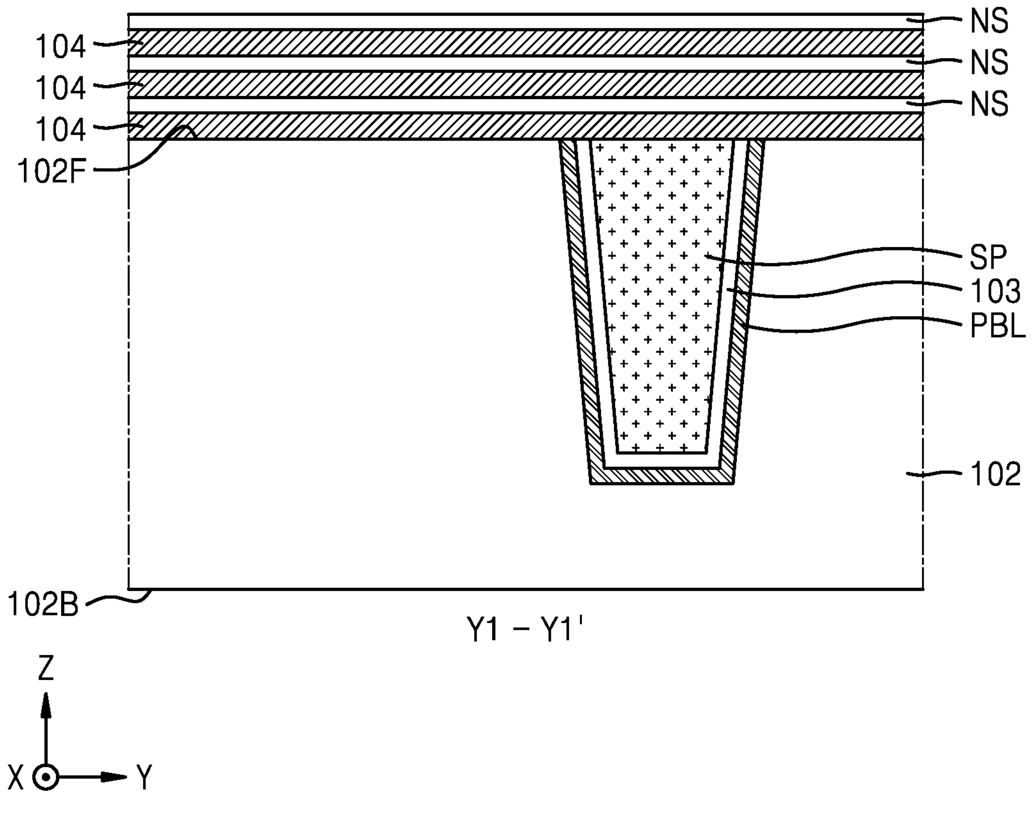

Referring to FIG. 14, in the resultant structure of FIG. 13, a plurality of sacrificial semiconductor layers 104 and a plurality of nanosheet semiconductor layers NS may be alternately stacked one by one on the front-side surface 102F and the sacrificial pattern SP.

The plurality of sacrificial semiconductor layers 104 and the plurality of nanosheet semiconductor layers NS may include semiconductor materials having different etch selectivities from each other. In some embodiments of the present inventive concept, the plurality of nanosheet semiconductor layers NS may include a Si layer, and the plurality of sacrificial semiconductor layers 104 may include a SiGe layer. In some embodiments of the present inventive concept, the plurality of sacrificial semiconductor layers 104 may have a constant Ge content. The SiGe layer included in the plurality of sacrificial semiconductor layers 104 may have a constant Ge content, which is selected in a range of about 5 at % to about 60 at %, for example, about 10 at % to about 40 at %. The Ge concentration of the SiGe layer included in the plurality of sacrificial semiconductor layers 104 may be variously selected as needed.

Figure 15:
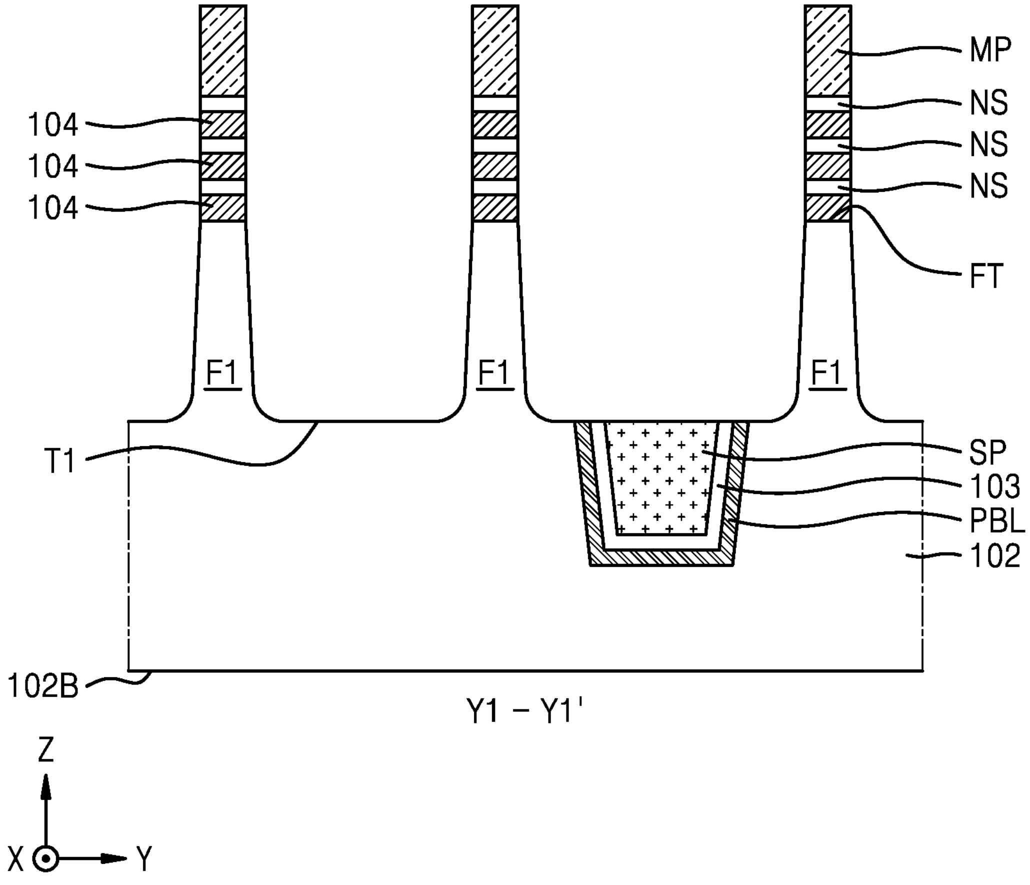

Referring to FIG. 15, a mask pattern MP may be formed on the resultant structure of FIG. 14. Thereafter, the plurality of sacrificial semiconductor layers 104, the plurality of nanosheet semiconductor layers NS, and the substrate 102 may be partially etched by using the mask pattern MP as an etch mask. Thus, a plurality of fin-type active regions F1 may be formed on the substrate 102. A plurality of trench regions T1 may be defined by the plurality of fin-type active regions F1 on the substrate 102. In some embodiments of the present inventive concept, the mask pattern MP may have a stack structure of an oxide pattern and a silicon nitride film pattern. The mask pattern MP may extend parallel to each other in a first lateral direction (e.g., the X direction) on the substrate 102. Stack structures of the plurality of sacrificial semiconductor layers 104 and the plurality of nanosheet semiconductor layers NS may remain on a fin top surface FT of each of the plurality of fin-type active regions F1.

While portions of the substrate 102 are being etched to form the plurality of fin-type active regions F1, a portion of each of the polymer brush layer PBL, the insulating liner 103, and the sacrificial pattern SP may be etched together from a portion adjacent to the front-side surface 102F of the substrate 102, and thus, a vertical level of a top surface of each of the polymer brush layer PBL, the insulating liner 103, and the sacrificial pattern SP may be lowered. A top surface of each of the polymer brush layer PBL, the insulating liner 103, and the sacrificial pattern SP may define a portion of the trench region T1.

Figure 16:
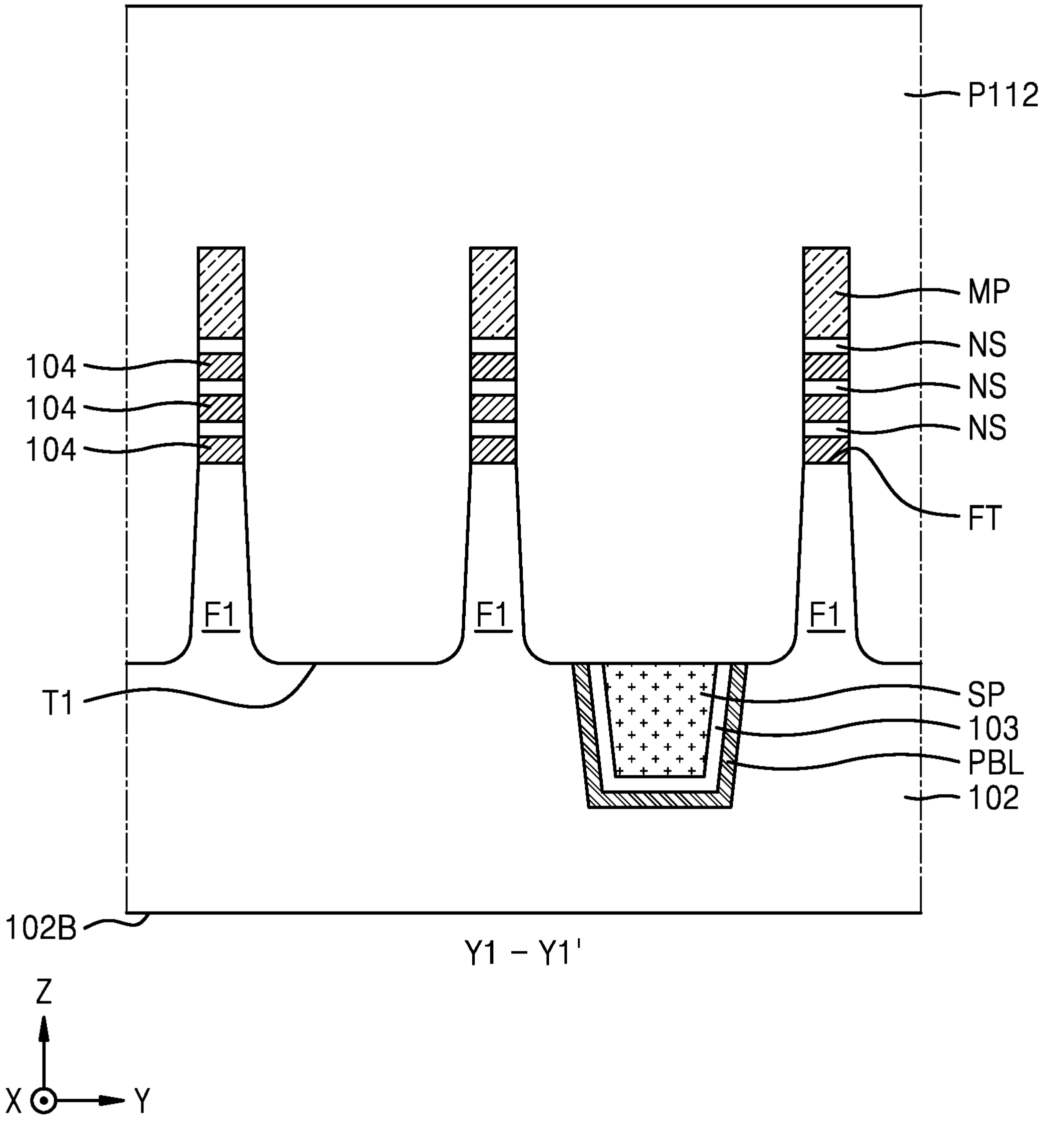

Referring to FIG. 16, a device isolation insulating film P112 may be formed on the resultant structure of FIG. 15. The device isolation insulating film P112 may be formed to such a sufficient thickness as to fill remaining spaces of the plurality of trench regions T1. In some embodiments of the present inventive concept, the device isolation insulating film P112 may include a silicon oxide film, without being limited thereto.

The device isolation insulating film P112 may be formed by using, for example, a plasma-enhanced chemical vapor deposition (PECVD) process, a high density plasma (HDP) CVD process, an inductively coupled plasma (ICP) CVD process, a capacitor coupled plasma (CCP) CVD process, a flowable CVD (FCVD) process, or a spin coating process.

Figure 17A:
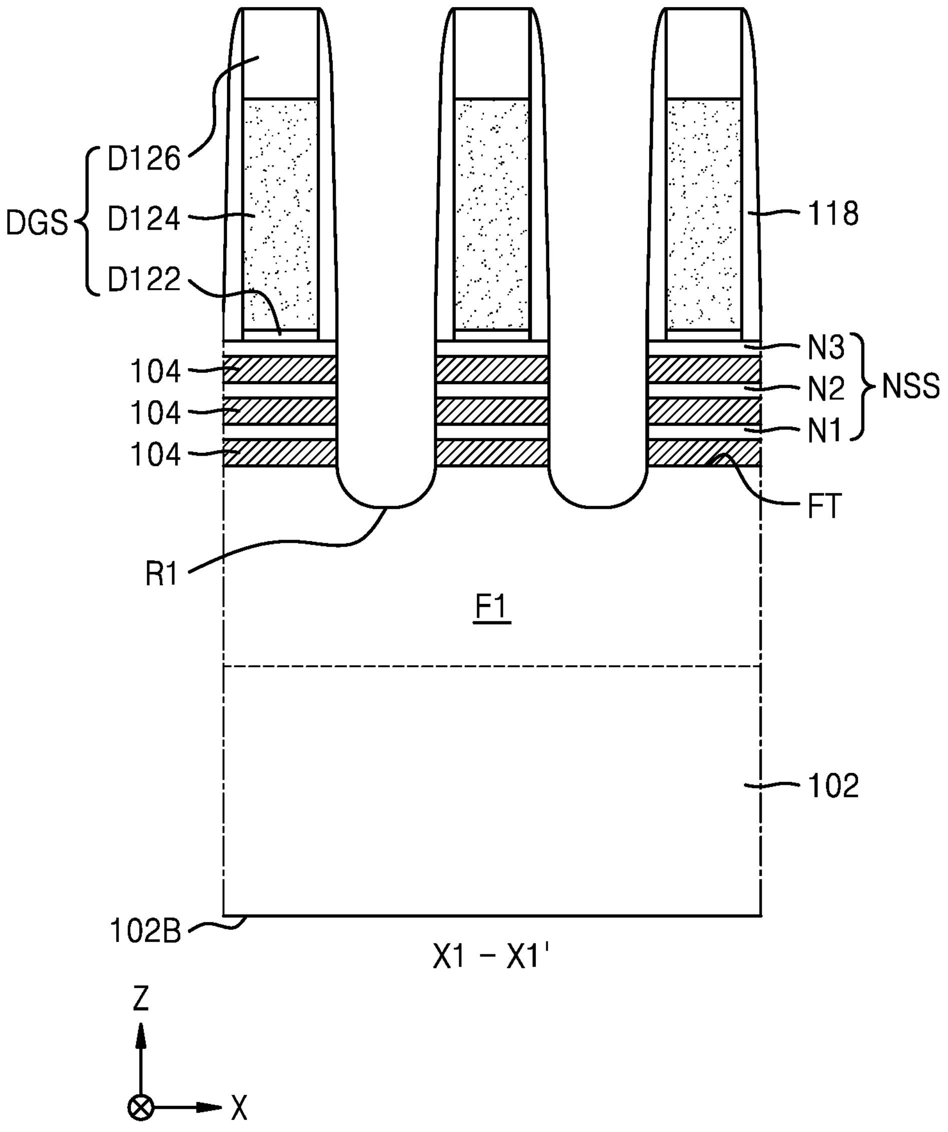
Figure 17B:
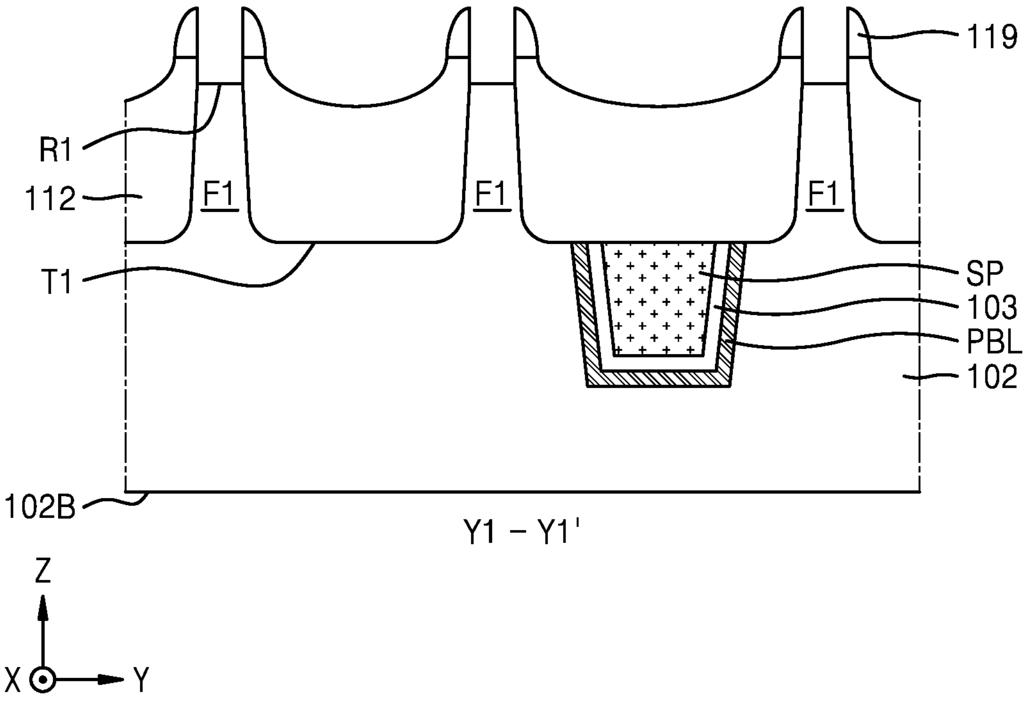
Figure 17C:
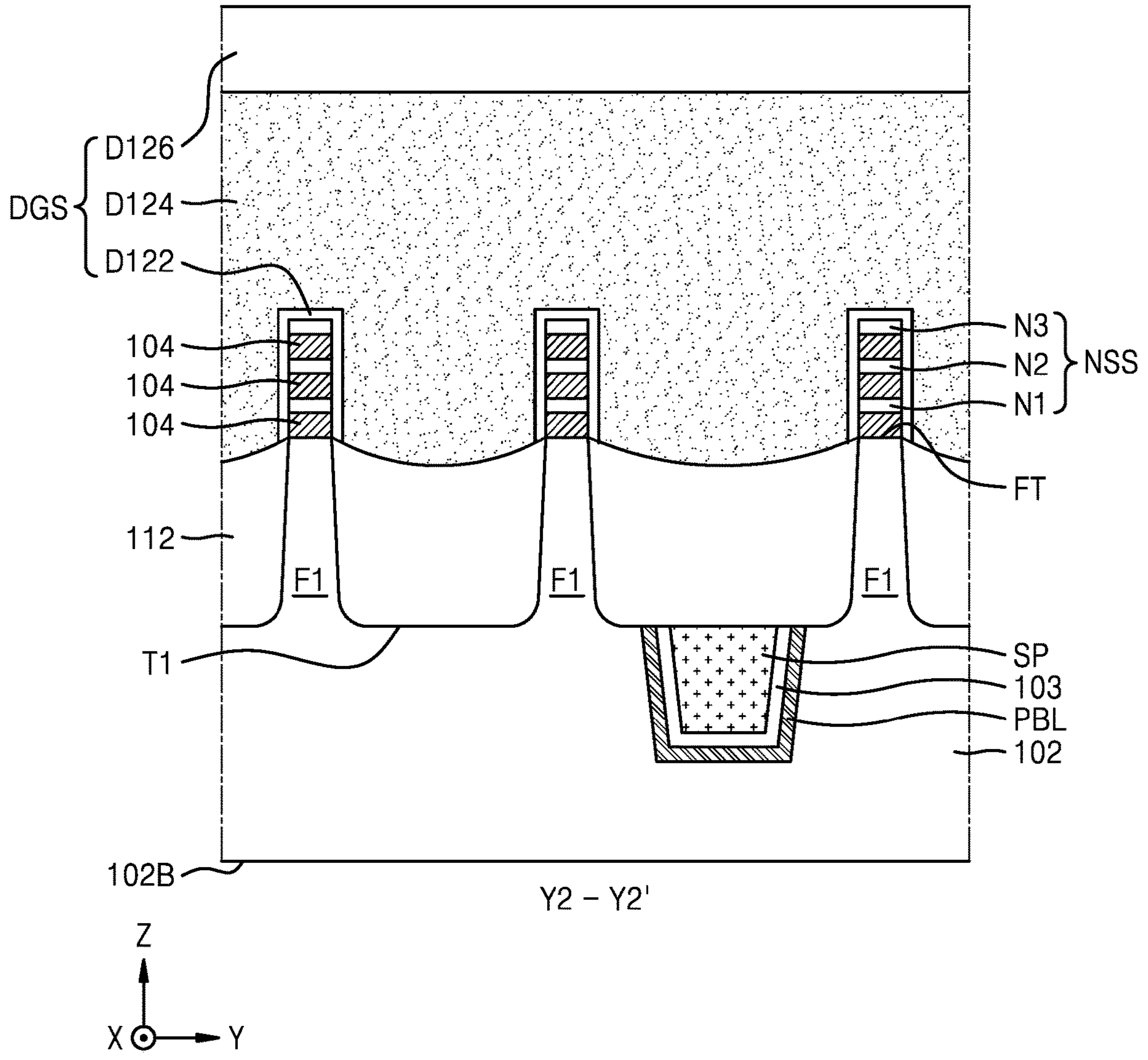

Referring to FIGS. 17A, 17B, and 17C, the resultant structure of FIG. 16 may be planarized to expose the top surface of the mask pattern MP. Thereafter, the mask pattern MP, which is exposed, may be removed, and a recess process for removing a portion of the device isolation insulating film P112 may be performed. Thus, a device isolation film 112 including the remaining portion of the device isolation insulating film P112 may be formed. As a result, the plurality of sacrificial semiconductor layers 104 and the plurality of nanosheet semiconductor layers (refer to NS in FIG. 16) may protrude over the top surface of the device isolation film 112.

The device isolation insulating film P112 may be recessed by using, for example, a dry etching process, a wet etching process, or a combination thereof. In this case, a wet etching process using, for example, $NH_4OH$, tetramethyl ammonium hydroxide (TMAH), or potassium hydroxide (KOH) as an etchant or a dry etching process, such as an inductively coupled plasma (ICP) process, a transformer coupled plasma (TCP) process, an electron cyclotron resonance (ECR) process, a reactive ion etch (RIE) process, may be employed. For example, when the device isolation insulating film P112 is recessed by using a dry etching process, a fluorine-containing gas (e.g., $CF_4$), a chlorine-containing gas ($Cl_2$), or hydrogen bromide (HBr) may be used as an etch gas.

Thereafter, a plurality of dummy gate structures DGS may be formed on the stack structures of the plurality of sacrificial semiconductor layers 104 and the plurality of nanosheet semiconductor layers NS. Each of the plurality of dummy gate structures DGS may be formed to extend long in the second lateral direction (e.g., the Y direction). Each of the plurality of dummy gate structures DGS may have a structure in which an oxide film D122, a dummy gate layer D124, and a capping layer D126 are sequentially stacked on the substrate 102. In some embodiments of the present inventive concept, the oxide film D122 may be a film obtained by oxidizing the surface of each of the plurality of sacrificial semiconductor layers 104 and the plurality of nanosheet semiconductor layers (refer to NS in FIG. 16). For example, the dummy gate layer D124 may include polysilicon, and the capping layer D126 may include a silicon nitride film.

A plurality of outer insulating spacers 118 may be formed to cover both sidewalls of each of the plurality of dummy gate structures DGS. Thereafter, a portion of each of the plurality of sacrificial semiconductor layers 104 and the plurality of nanosheet semiconductor layers NS and a portion of the fin-type active region F1 may be etched by using the plurality of dummy gate structures DGS and the plurality of outer insulating spacers 118 as etch masks. Thus, the plurality of nanosheet semiconductor layers NS may be divided into a plurality of nanosheet stacks NSS, each of which includes a first nanosheet N1, a second nanosheet N2, and a third nanosheet N3, and a plurality of recesses R1 may be formed in an upper portion of the fin-type active region F1. To form the plurality of recesses R1, an etching process may be performed by using, for example, a dry etching process, a wet etching process, or a combination thereof. After the plurality of recesses R1 are formed, a plurality of recess-side insulating spacers 119 may be formed adjacent to the plurality of recesses R1 and may be formed on the device isolation film 112. In addition, the plurality of recess-side insulating spacers 119 may be formed on both sides of each of the fin-type active region F1.

Figure 18:
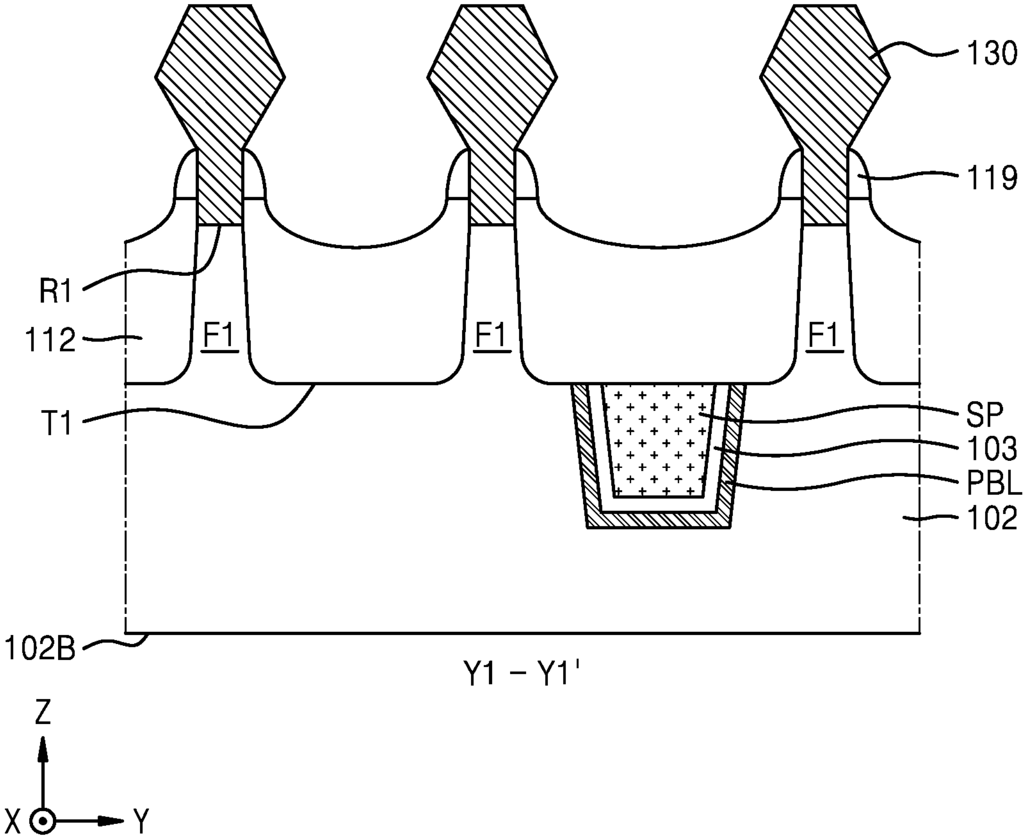

Referring to FIG. 18, in the resultant structure of FIGS. 17A, 17B, and 17C, a plurality of source/drain regions 130 may be formed to fill the plurality of recesses R1.

To form the plurality of source/drain regions 130, a semiconductor material may be epitaxially grown from a surface of the fin-type active region F1, which is exposed at a bottom surface of each of the plurality of recesses R1, and a sidewall of each of the first to third nanosheets N1, N2, and N3 included in the nanosheet stack NSS.

Figure 19A:
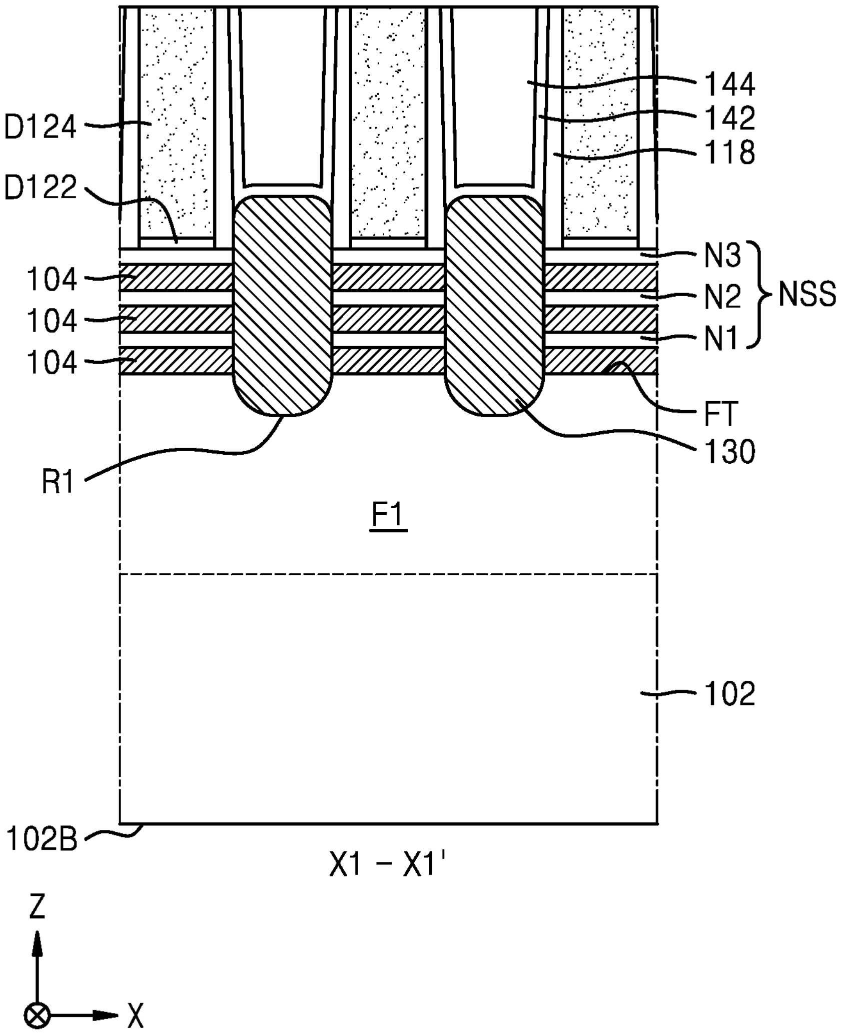
Figure 19B:
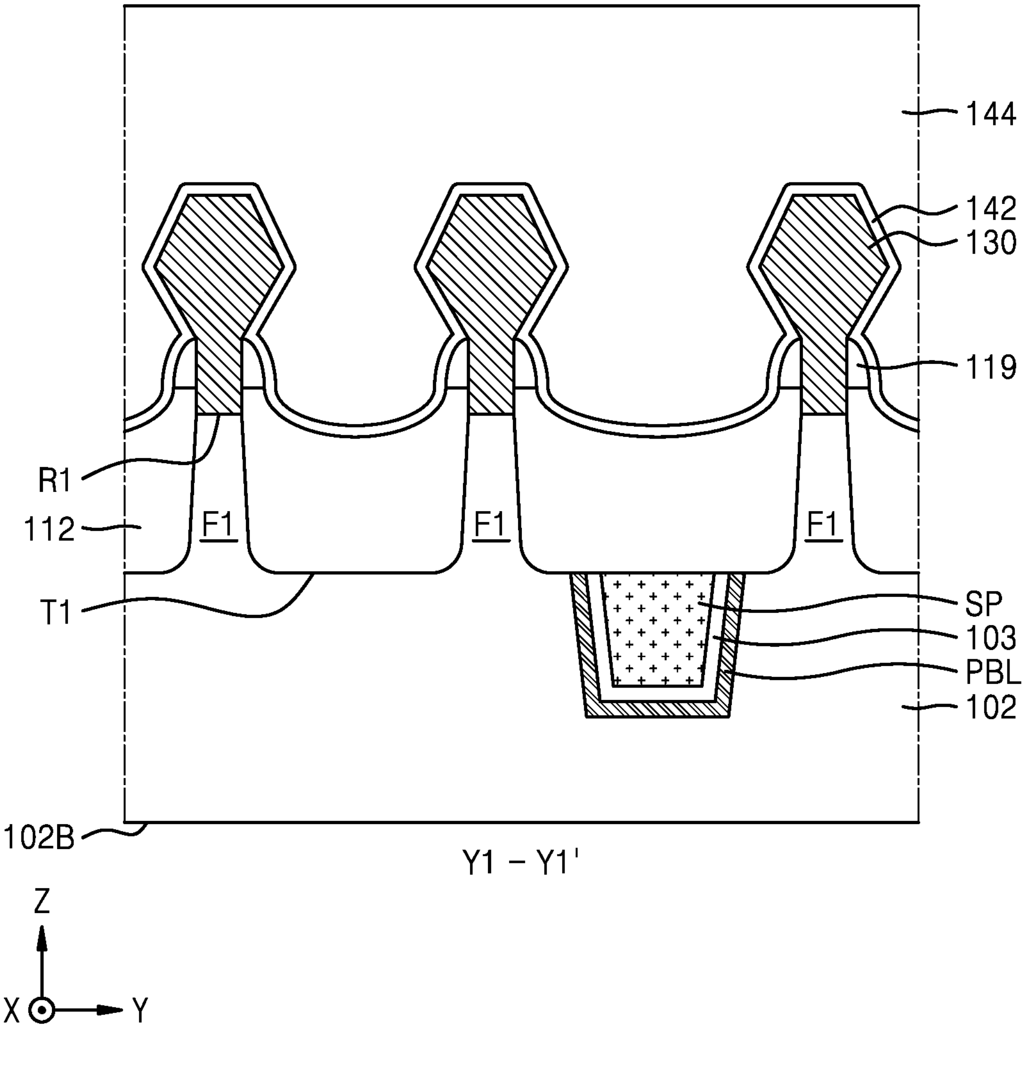
Figure 19C:
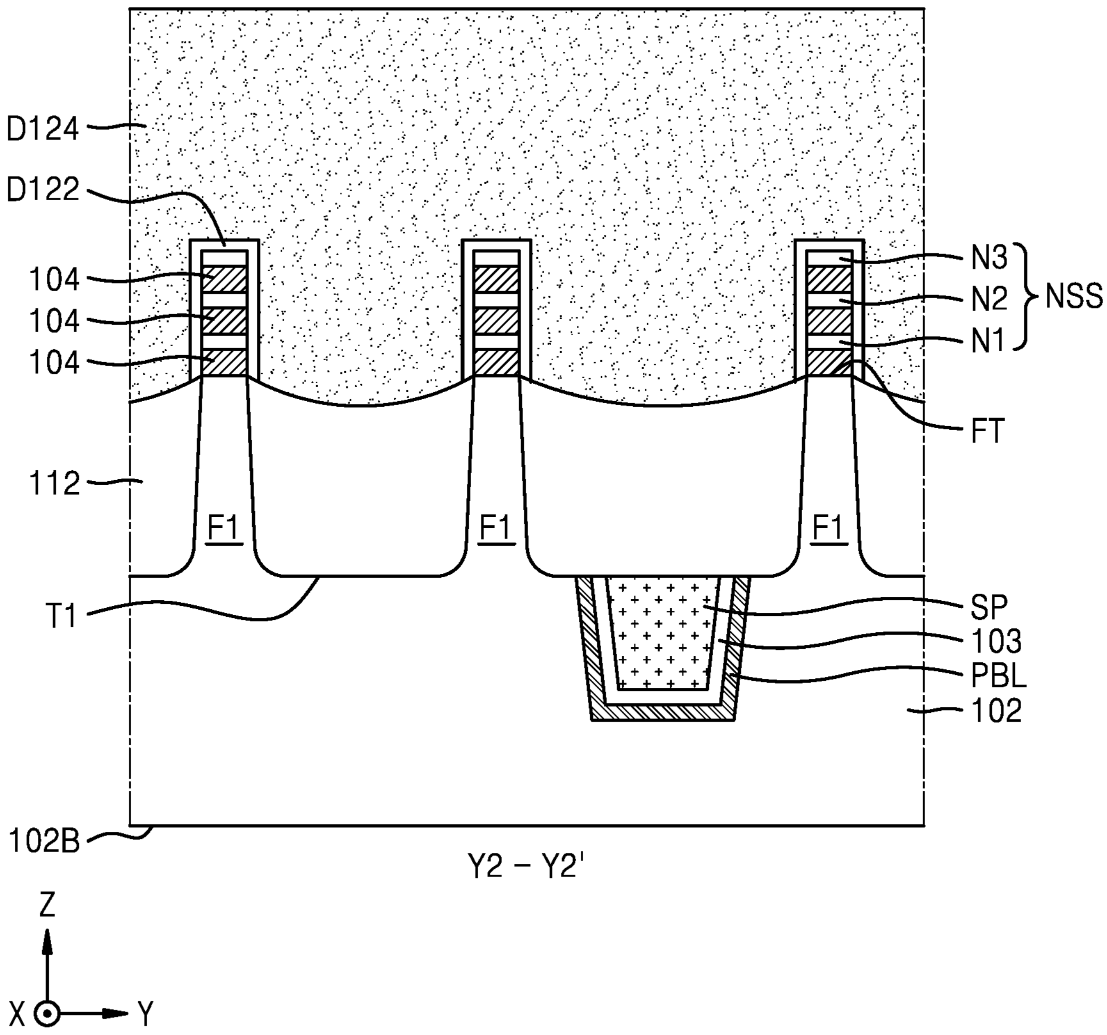

Referring to FIGS. 19A, 19B, and 19C, an insulating liner 142 may be formed to cover the resultant structure of FIG. 18, and an inter-gate dielectric film 144 may be formed on the insulating liner 142. Thereafter, a portion of each of the insulating liner 142 and the inter-gate dielectric film 144 may be etched to expose top surfaces of a plurality of capping layers D126. Thereafter, the dummy gate layer D124 may be exposed by removing the plurality of capping layers D126, and the insulating liner 142 and the inter-gate dielectric film 144 may be partially removed such that a top surface of the inter-gate dielectric film 144 and a top surface of the dummy gate layer D124 are substantially coplanar.

Figure 20:
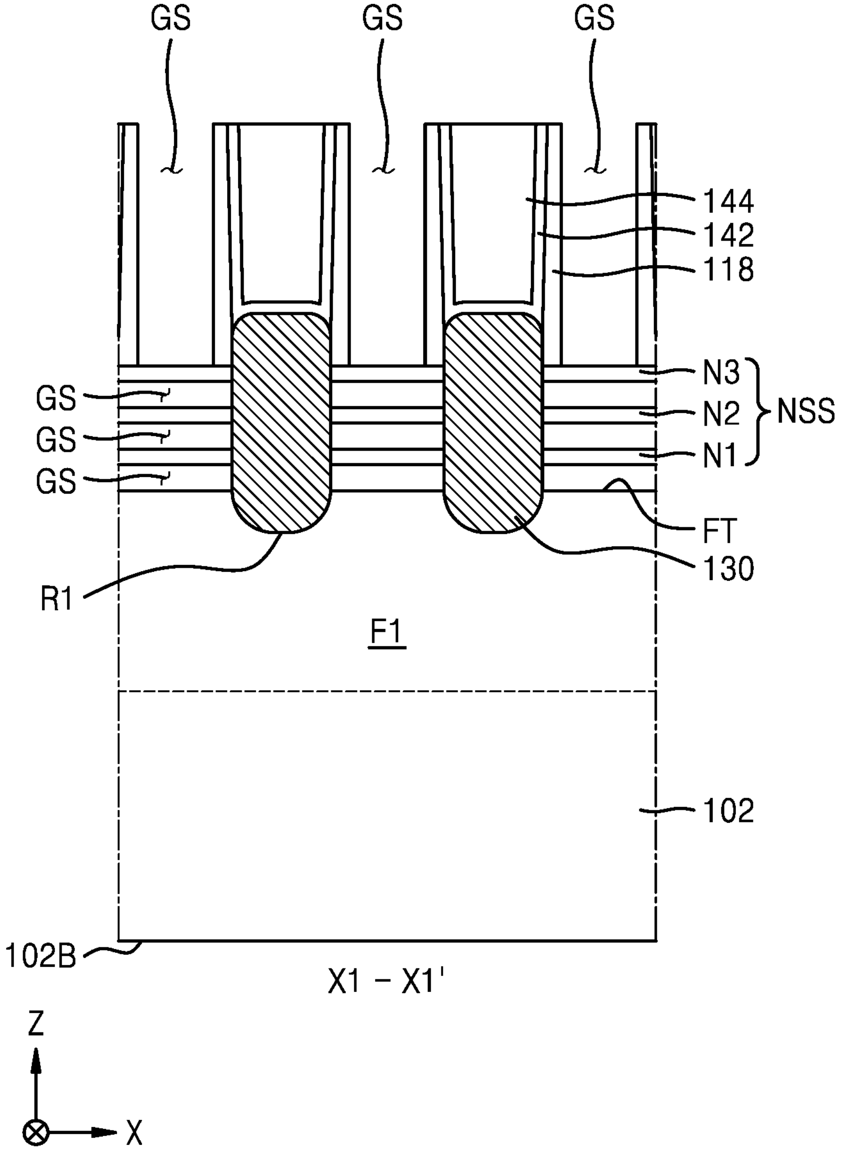

Referring to FIG. 20, a gate space GS may be prepared by removing the dummy gate layer D124 and the oxide film D122 located on the plurality of sacrificial semiconductor layers 104 and the plurality of nanosheet semiconductor layers NS from the resultant structure of FIGS. 19A, 19B, and 19C, and the plurality of nanosheet stacks NSS may be exposed through the gate space GS. Afterwards, the plurality of sacrificial semiconductor layers 104 remaining on the fin-type active region F1 may be removed through the gate space GS, and thus, the gate space GS may extend to respective spaces between the first to third nanosheets N1, N2, and N3 and a space between the first nanosheet N1 and the fin top surface FT of the fin-type active region F1. In some embodiments of the present inventive concept, to selectively remove the plurality of sacrificial semiconductor layers 104, differences in etch selectivity between the first to third nanosheets N1, N2, and N3 and the plurality of sacrificial semiconductor layers 104 may be used.

For example, a liquid or gaseous etchant may be used to selectively remove the plurality of sacrificial semiconductor layers 104. In some embodiments of the present inventive concept, to selectively remove the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Figure 21:
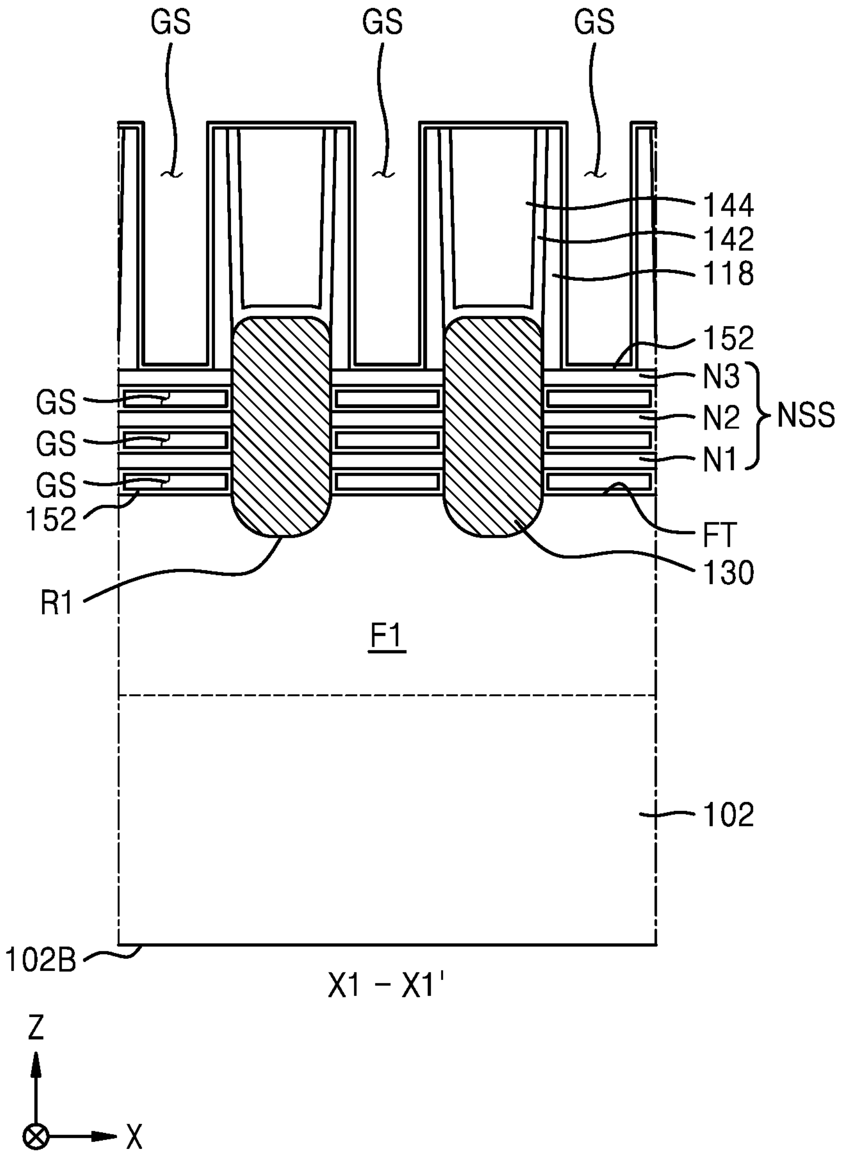

Referring to FIG. 21, in the resultant structure of FIG. 20, a gate dielectric film 152 may be formed to cover respective exposed surfaces of the first to third nanosheets N1, N2, and N3 and the fin-type active region F1. For example, the gate dielectric film 152 may be formed by using an atomic layer deposition (ALD) process.

Figure 22:
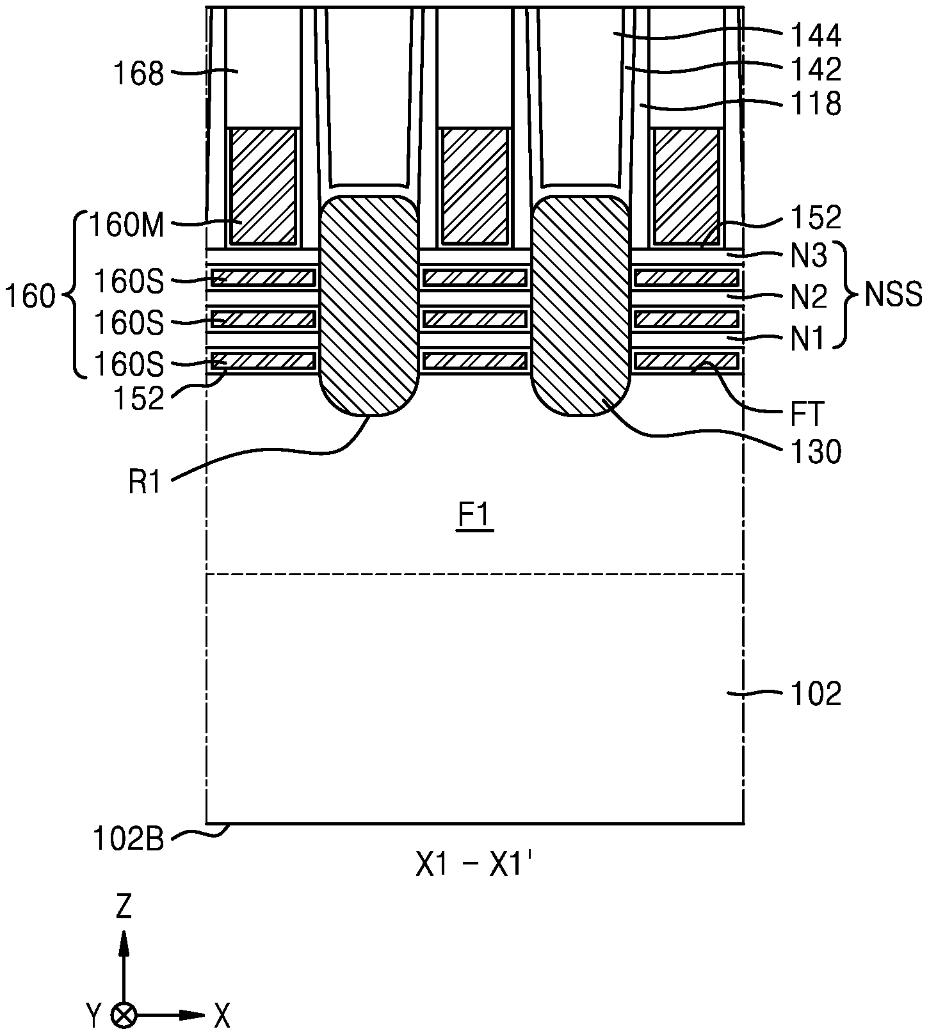

Referring to FIG. 22, a gate line 160 and a capping insulating pattern 168 may be formed. The gate line 160 may fill the gate space (refer to GS in FIG. 21) and cover the top surface of the inter-gate dielectric film 144 on the gate dielectric film 152. The capping insulating pattern 168 may cover a top surface of each of the gate line 160 and the gate dielectric film 152 in the gate space GS.

Figure 23A:
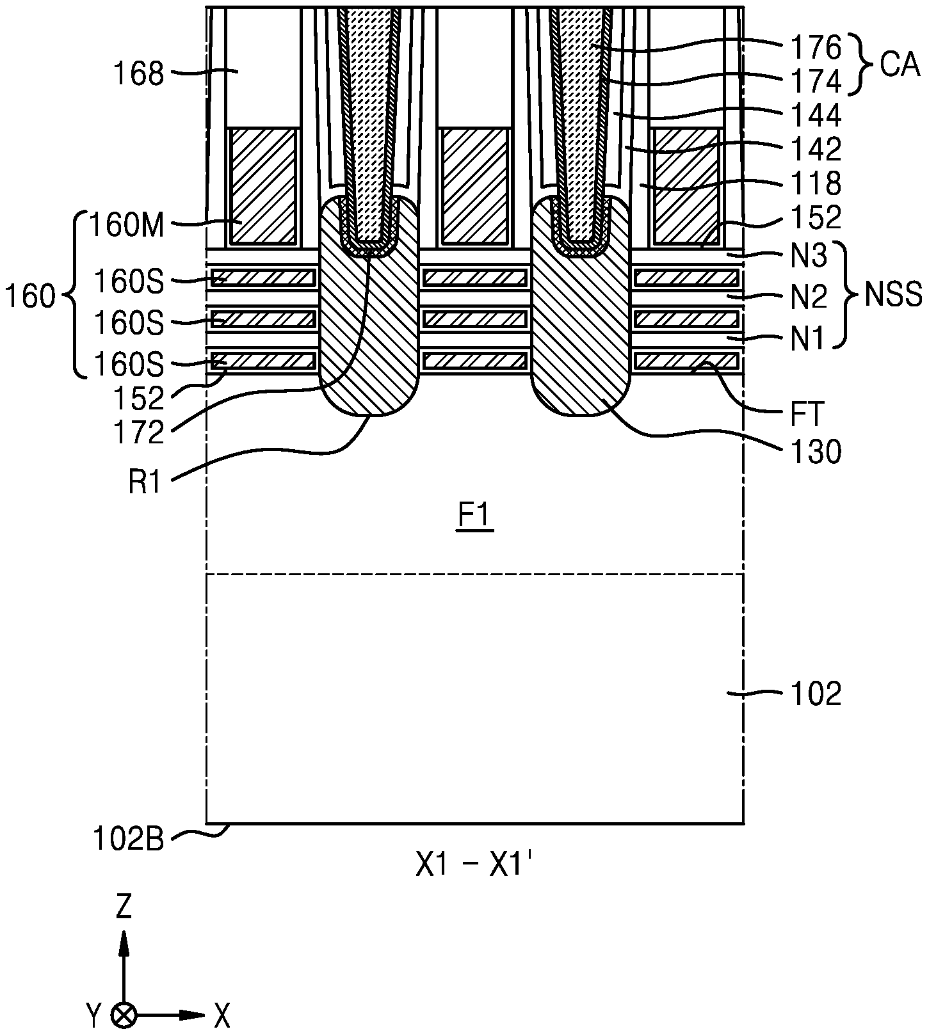
Figure 23B:
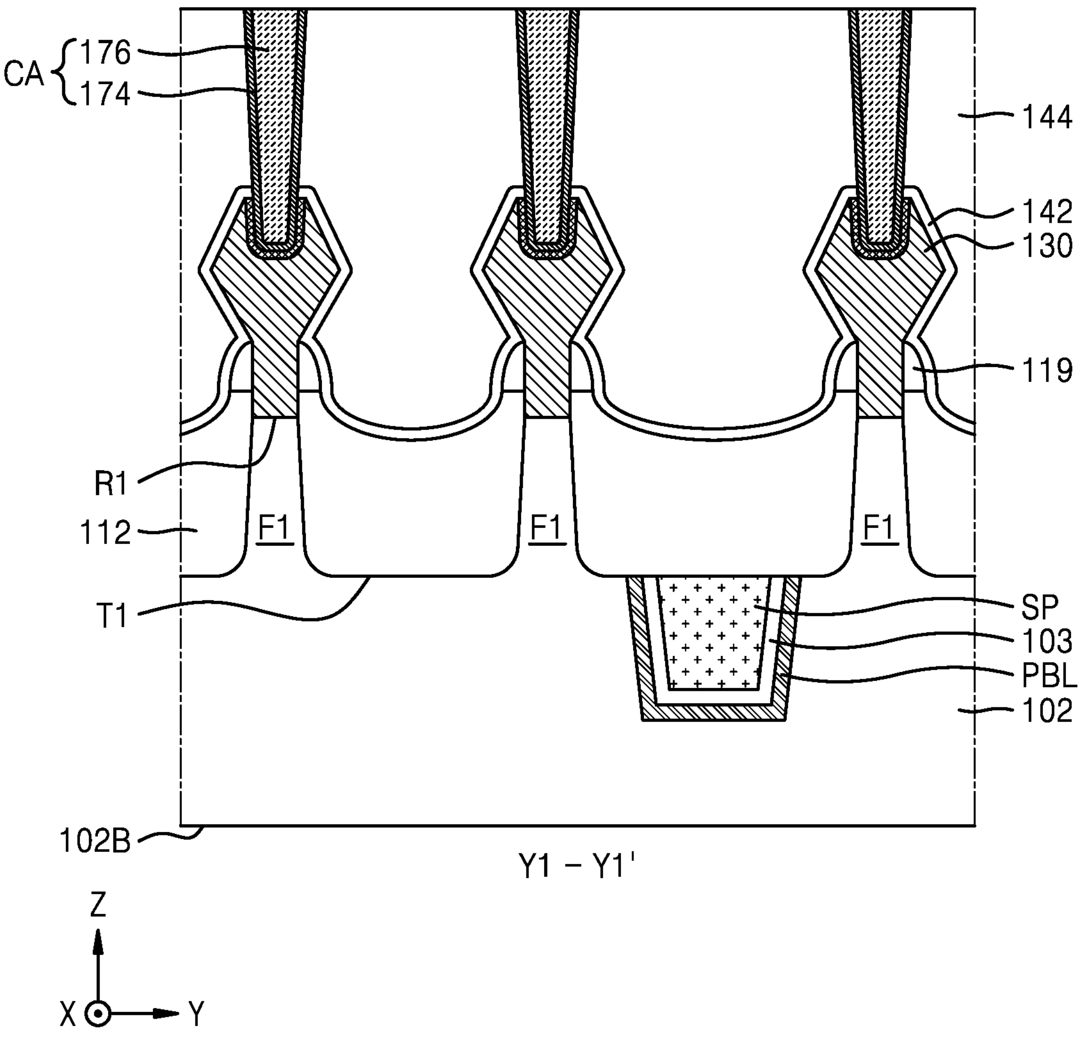
Figure 23C:
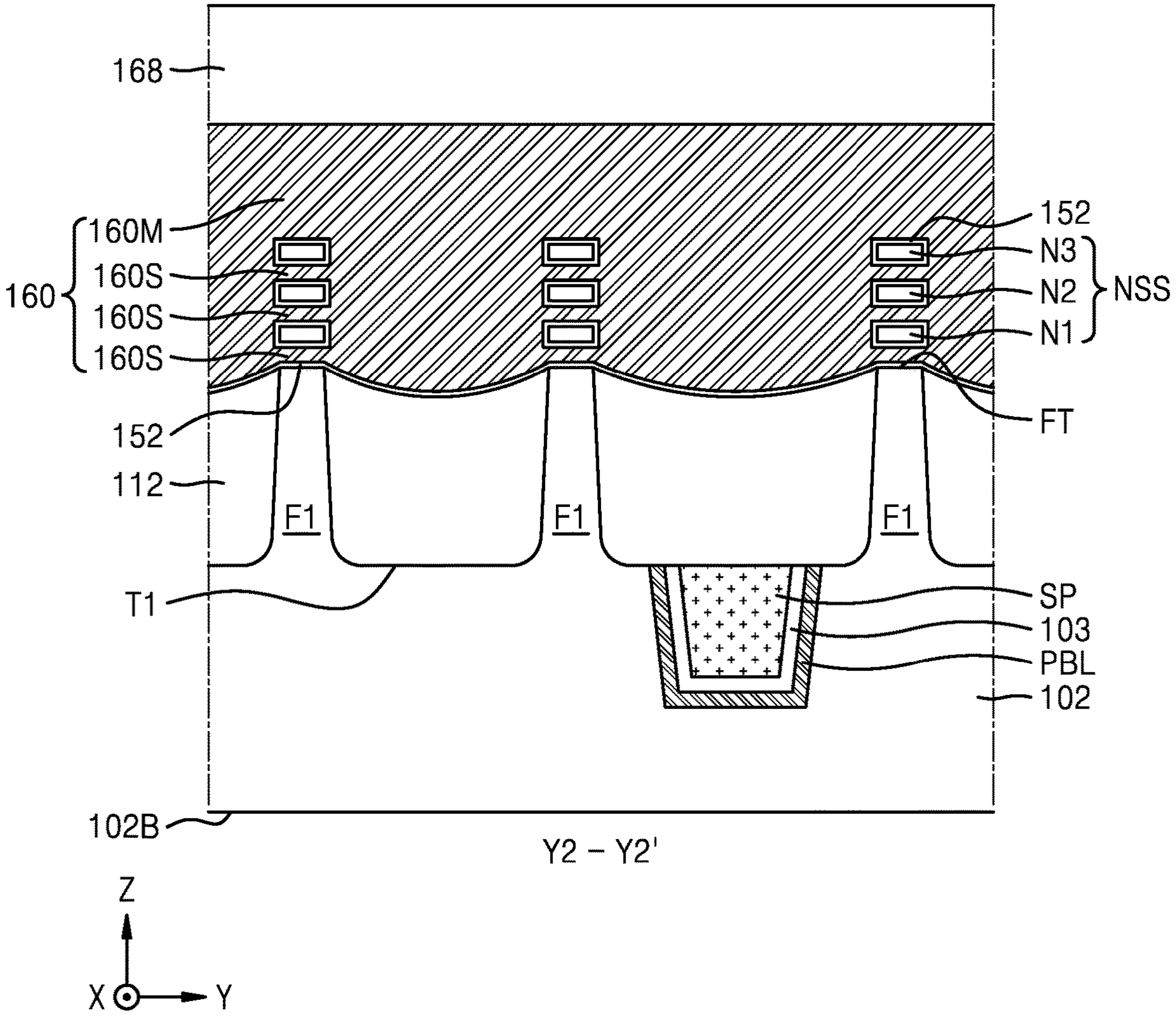

Referring to FIGS. 23A, 23B, and 23C, in the resultant structure of FIG. 22, a source/drain contact hole that exposes the source/drain region 130 may be formed to pass through an insulating structure including the insulating liner 142 and the inter-gate dielectric film 144. Thereafter, a partial region of the source/drain region 130 may be removed by using an anisotropic etching process through the source/drain contact hole, and thus, the source/drain contact hole may extend in a longer manner toward the substrate 102. Afterwards, a metal silicide film 172 may be formed on the source/drain region 130 that is exposed at a bottom side of the source/drain contact hole. In some embodiments of the present inventive concept, the formation of the metal silicide film 172 may include forming a metal liner conformally covering the exposed surface of the source/drain region 130 and annealing the metal liner to induce a reaction between the source/drain region 130 and a metal included in the metal liner. After the metal silicide film 172 is formed, the remaining portion of the metal liner may be removed. A portion of the source/drain region 130 may be consumed during the formation of the metal silicide film 172. In some embodiments of the present inventive concept, when the metal silicide film 172 includes a titanium silicide film, the metal liner may include a titanium (Ti) film.

Thereafter, a source/drain contact CA including a conductive barrier pattern 174 and a contact plug 176 may be formed on the metal silicide film 172.

Figure 24A:
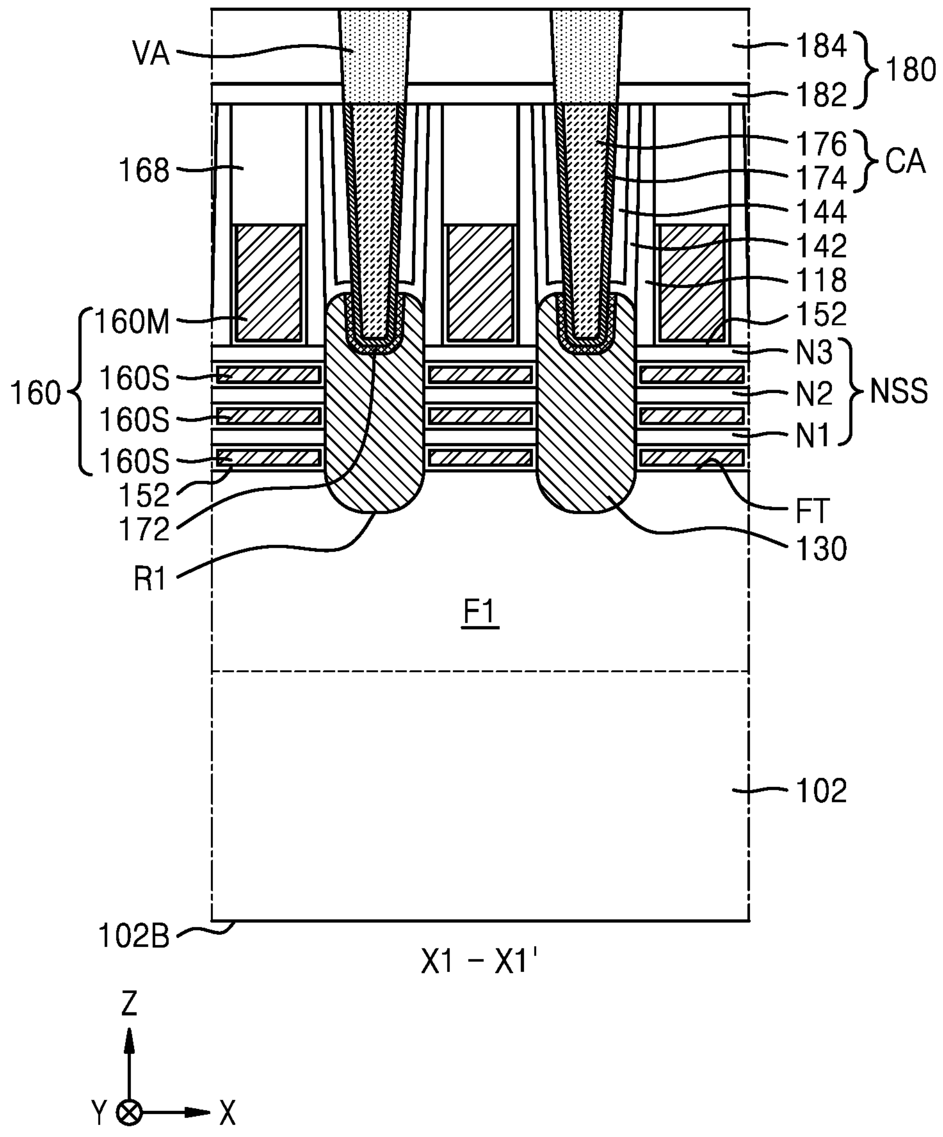
Figure 24B:
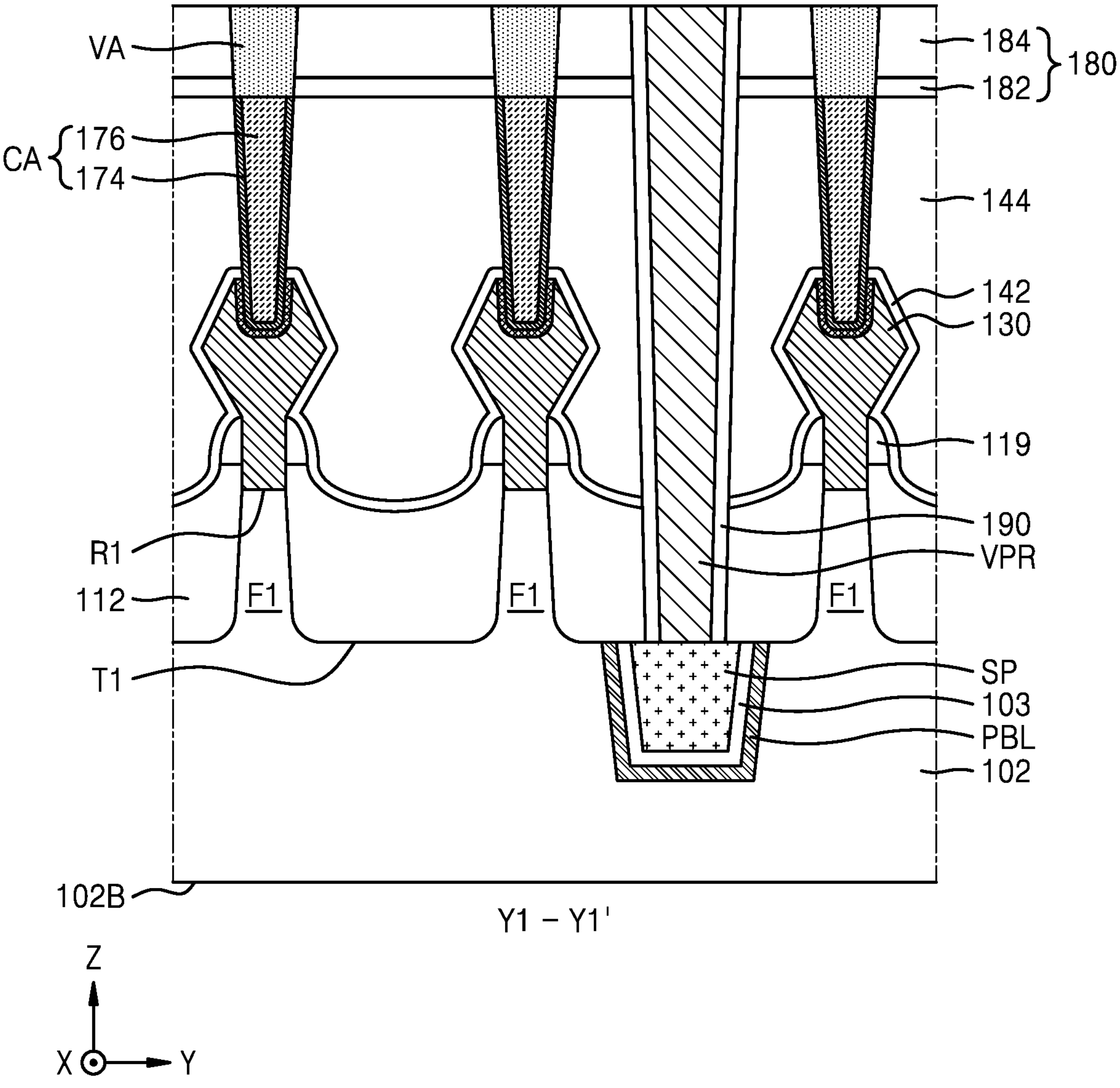
Figure 24C:
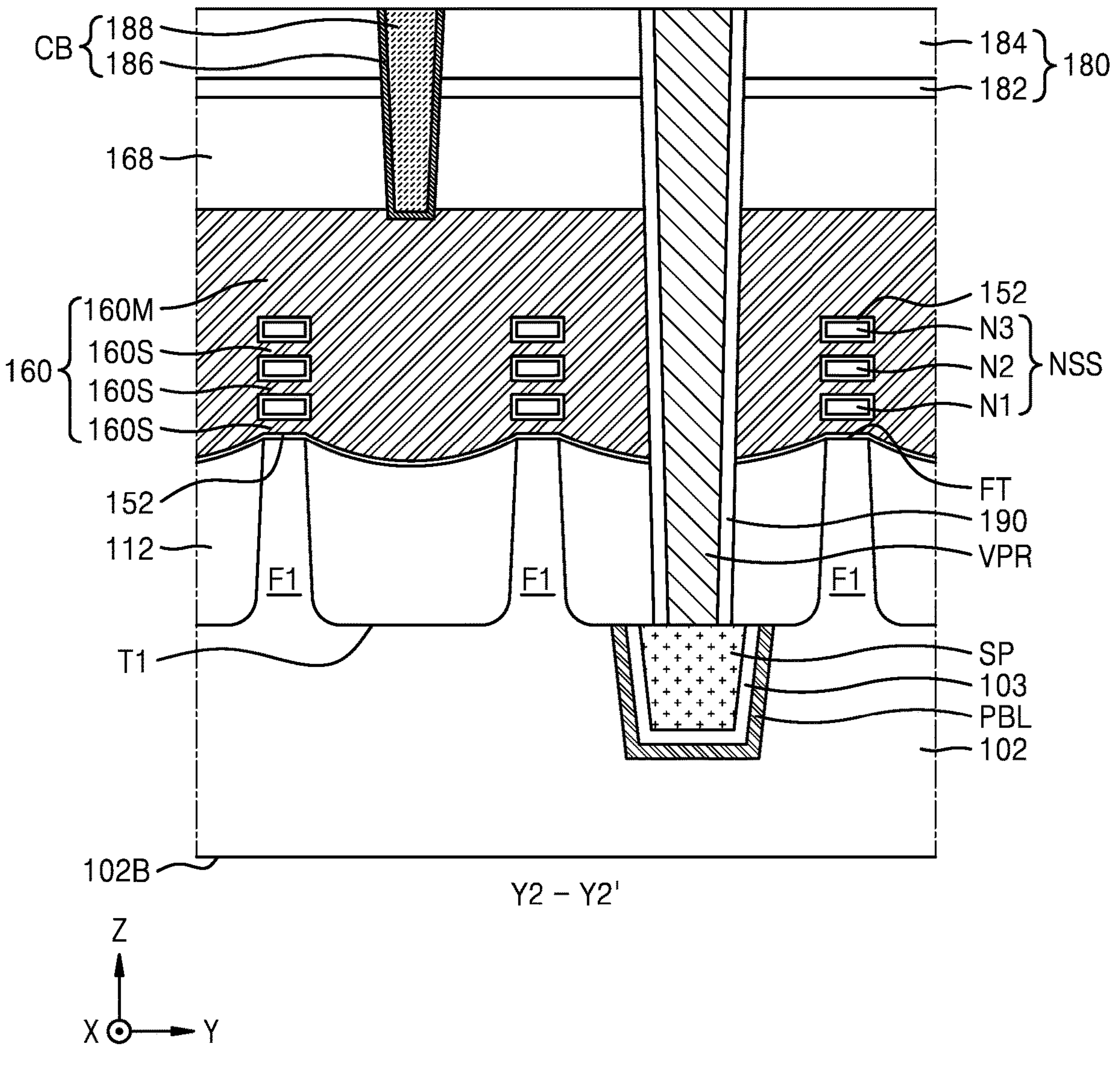

Referring to FIGS. 24A, 24B, and 24C, in the resultant structure of FIGS. 23A, 23B, and 23C, an etch stop film 182 and an interlayer insulating film 184 may be sequentially formed to cover a top surface of the inter-gate dielectric film 144, a top surface of each of a plurality of source/drain contacts CA, and a top surface of each of a plurality of capping insulating patterns 168, and thus, an upper insulating structure 180 may be formed.

Thereafter, a plurality of source/drain via contacts VA, a gate contact CB, and a via power rail structure may be formed. The plurality of source/drain via contacts VA may pass through the upper insulating structure 180 in a vertical direction (e.g., the Z direction) and be connected to the plurality of source/drain contacts CA. The gate contact CB may pass through the upper insulating structure 180 and the capping insulating pattern 168 in the vertical direction (e.g., the Z direction) and be connected to the gate line 160. The via power rail structure may include a via power rail VPR and an insulating spacer 190. The order of formation of the source/drain via contact VA, the gate contact CB, and the via power rail structure is not specifically limited.

To form the via power rail structure, a through hole may be formed to pass through the upper insulating structure 180, the inter-gate dielectric film 144, the insulating liner 142, the gate line 160, the gate dielectric film 152, and the device isolation film 112 in the vertical direction (e.g., the Z direction). In this case, by setting the sacrificial pattern SP as an etch stop point to form the hole, a completion point of the etching process may be precisely controlled. Thereafter, an insulating spacer 190 and the via power rail VPR may be sequentially formed inside the through hole.

Figure 25A:
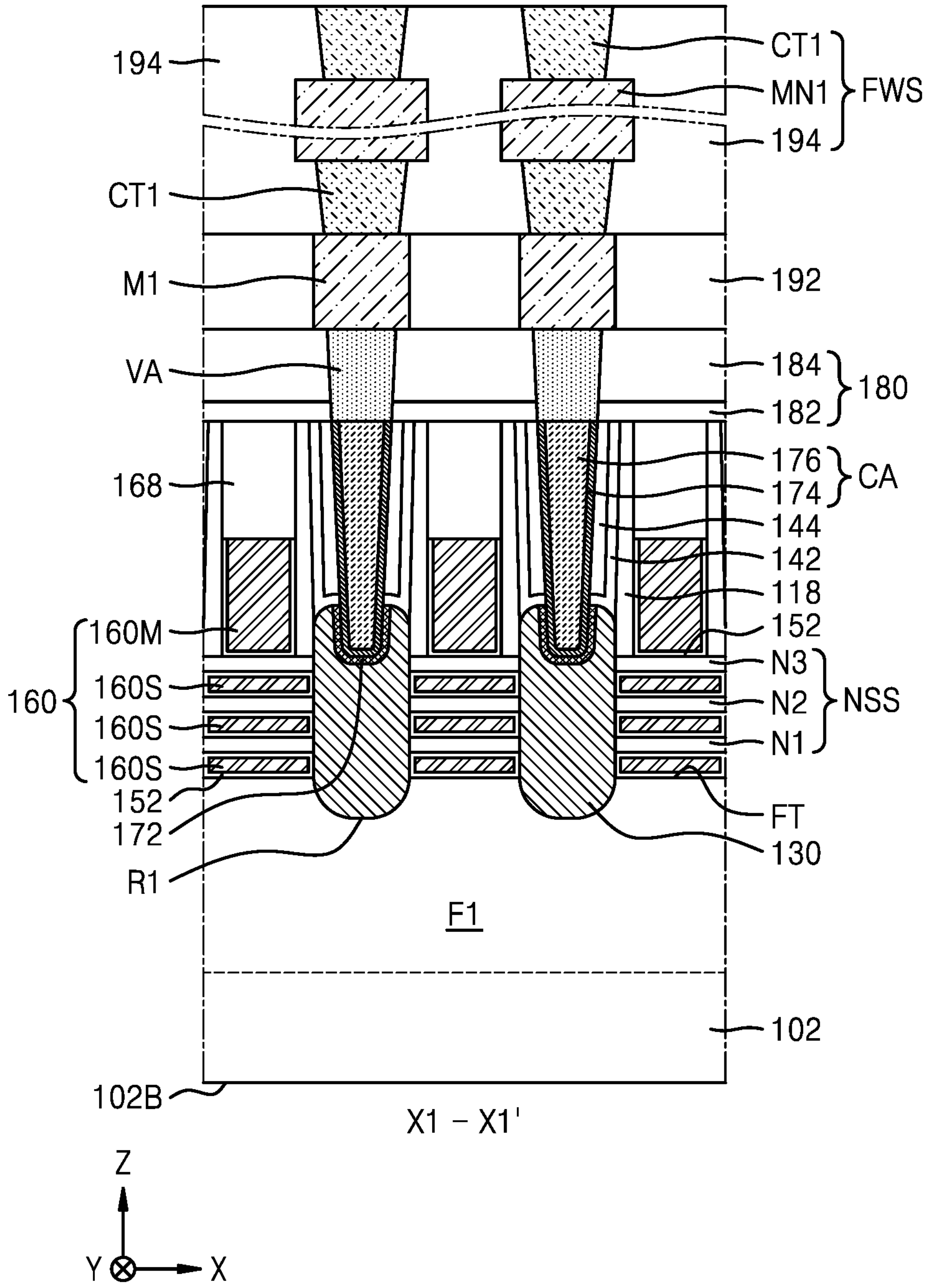
Figure 25B:
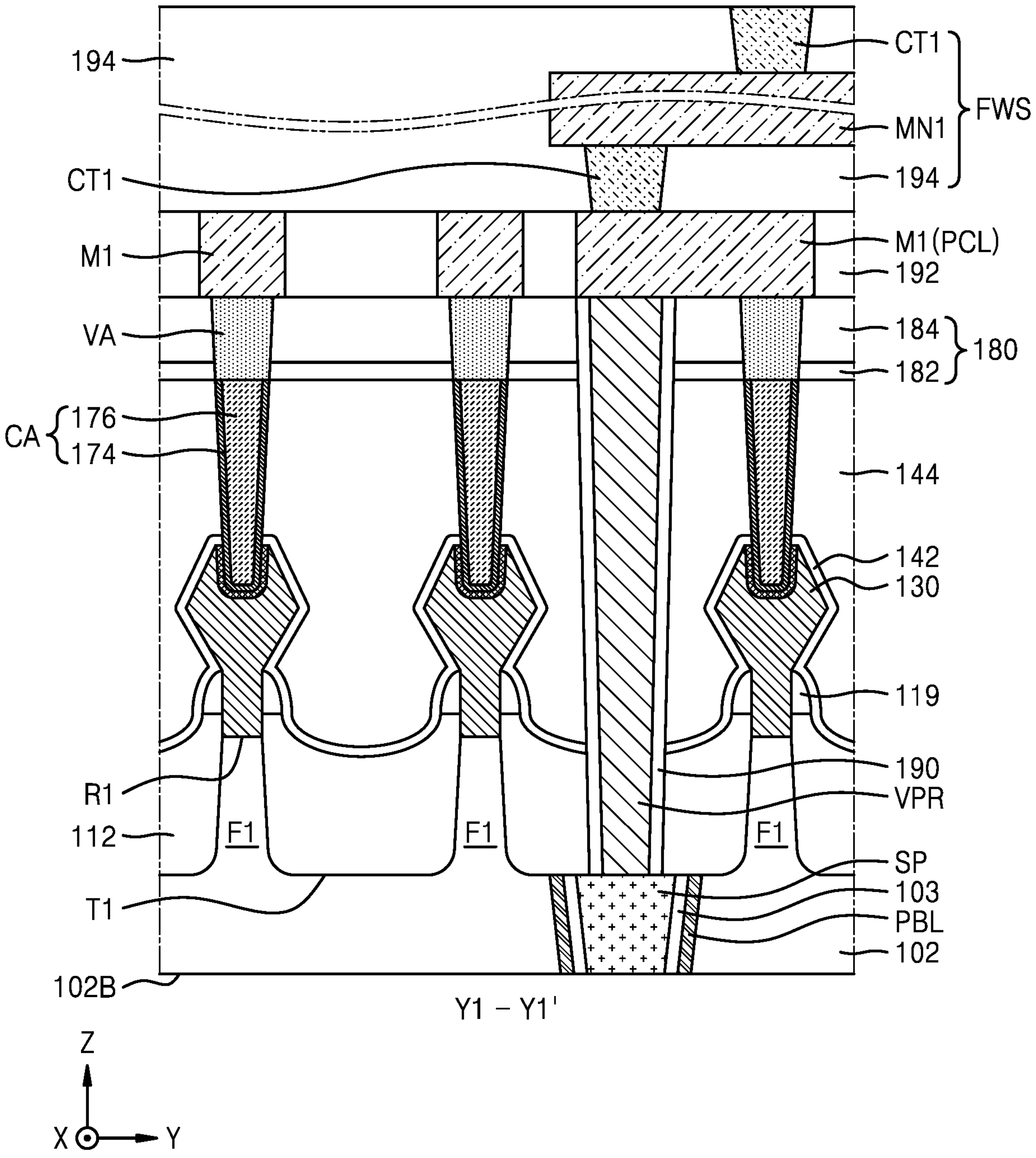
Figure 25C:
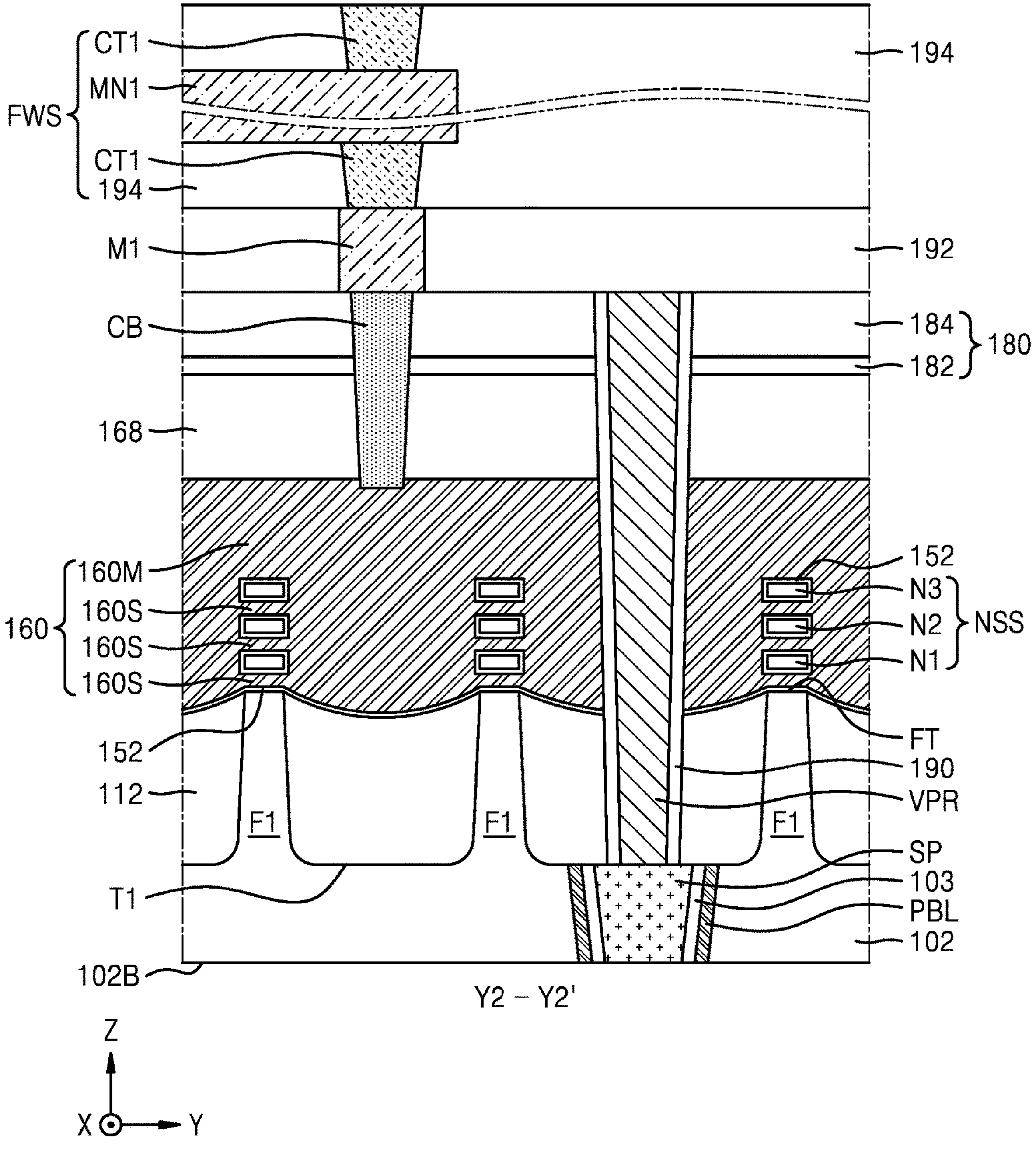

Referring to FIGS. 25A, 25B, and 25C, in the resultant structure of FIGS. 24A, 24B, and 24C, an upper insulating film 192 covering the upper insulating structure 180 may be formed, and a plurality of upper wiring layers M1 may be formed to pass through the upper insulating film 192 and be connected to the source/drain via contact VA, the gate contact CB, and the via power rail VPR. The plurality of upper wiring layers M1 may include a power connection conductive layer PCL, which is connected to the via power rail VPR, on the via power rail VPR. Thereafter, a front-side wiring structure FWS may be formed on the upper insulating film 192 and the plurality of upper wiring layers M1.

Afterwards, a portion of the substrate 102 may be removed so that the sacrificial pattern SP may be exposed from the back surface 102B of the substrate 102. To this end, a portion of the substrate 102 may be removed to expose the polymer brush layer PBL. Next, a portion of the exposed polymer brush layer PBL may be removed by further removing the portion of the substrate 102 to expose the insulating liner 103. Next, a portion of the exposed insulating liner 103 may be removed by further removing the portion of the substrate 102 to expose the sacrificial pattern SP. To remove the portion of the substrate 102 such that the sacrificial pattern SP is exposed, at least one process selected from, for example, a mechanical grinding process, a chemical mechanical polishing (CMP) process, a wet etching process, and a combination thereof may be used.

In the process of removing the portion of the substrate 102 such that the sacrificial pattern SP is exposed, a completion point of the process of removing the portion of the substrate 102 may be precisely controlled by setting at least one of the sacrificial pattern SP, the insulating liner 103, and the polymer brush layer PBL as an etch end point. In the resultant structure in which the portion of the substrate 102 is removed such that the sacrificial pattern SP is exposed, the backside surface 102B of the substrate 102 may become closer to the fin-type active region F1 than before in a vertical direction (e.g., the Z direction).

Figure 26:
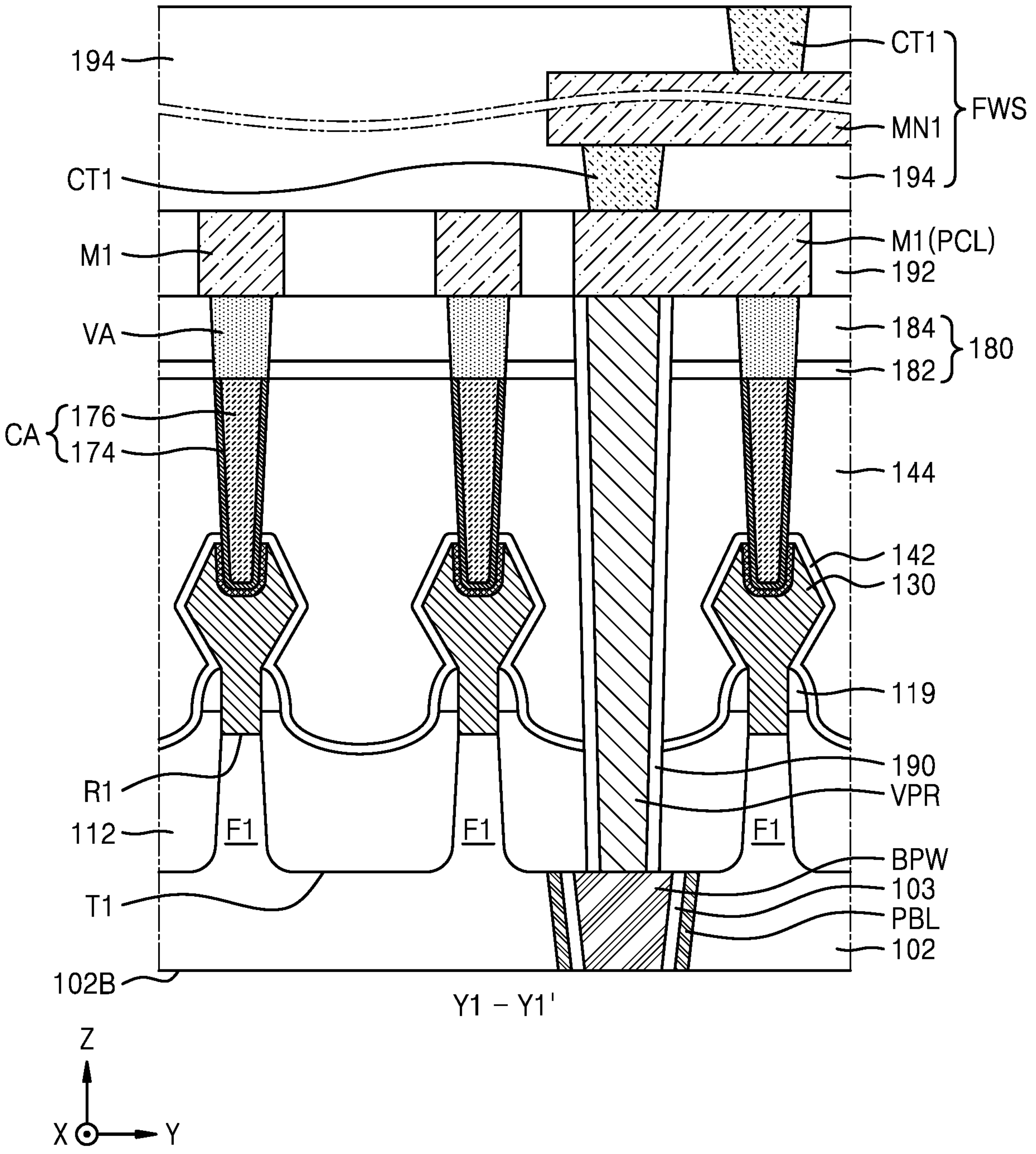

Referring to FIG. 26, the sacrificial pattern SP may be replaced by a backside power rail BPW in the resultant structure of FIGS. 25A, 25B, and 25C. To this end, after the sacrificial pattern SP is selectively removed, a space in which the sacrificial pattern SP was located may be filled by the backside power rail BPW.

Figure 27:
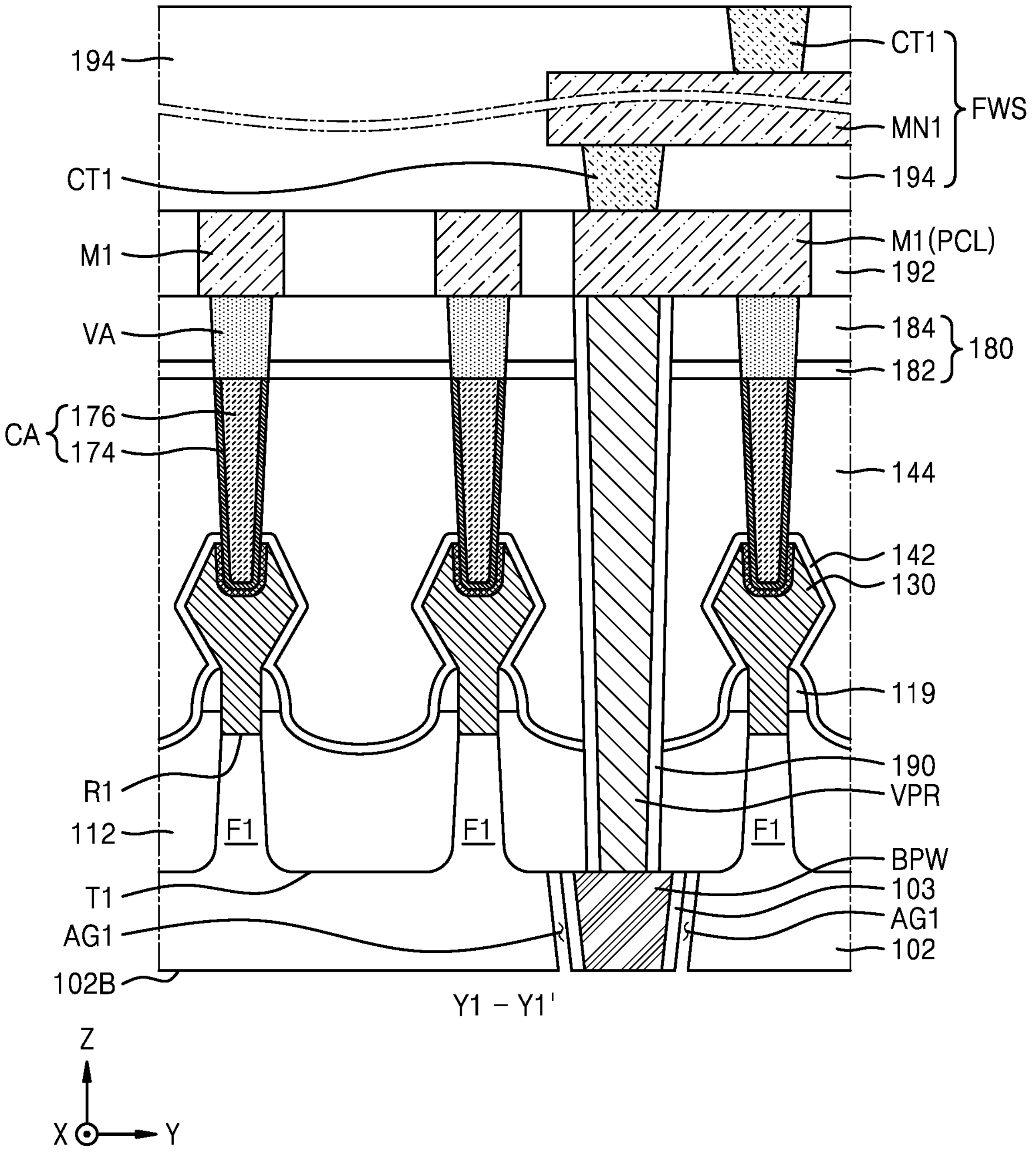

Referring to FIG. 27, the polymer brush layer PBL may be removed from the resultant structure of FIG. 26, and thus, air spacers AG1 may be formed between the substrate 102 and the insulating liner 103.

In some embodiments of the present inventive concept, the polymer brush layer PBL may be removed by using an ashing process and a strip process. The ashing process may be performed at a lower temperature than a typical plasma process. Accordingly, by removing the polymer brush layer PBL by using an ashing process, structures remaining on the substrate 102 around the polymer brush layer PBL may be prevented from being damaged by a high-temperature plasma process.

Figure 28:
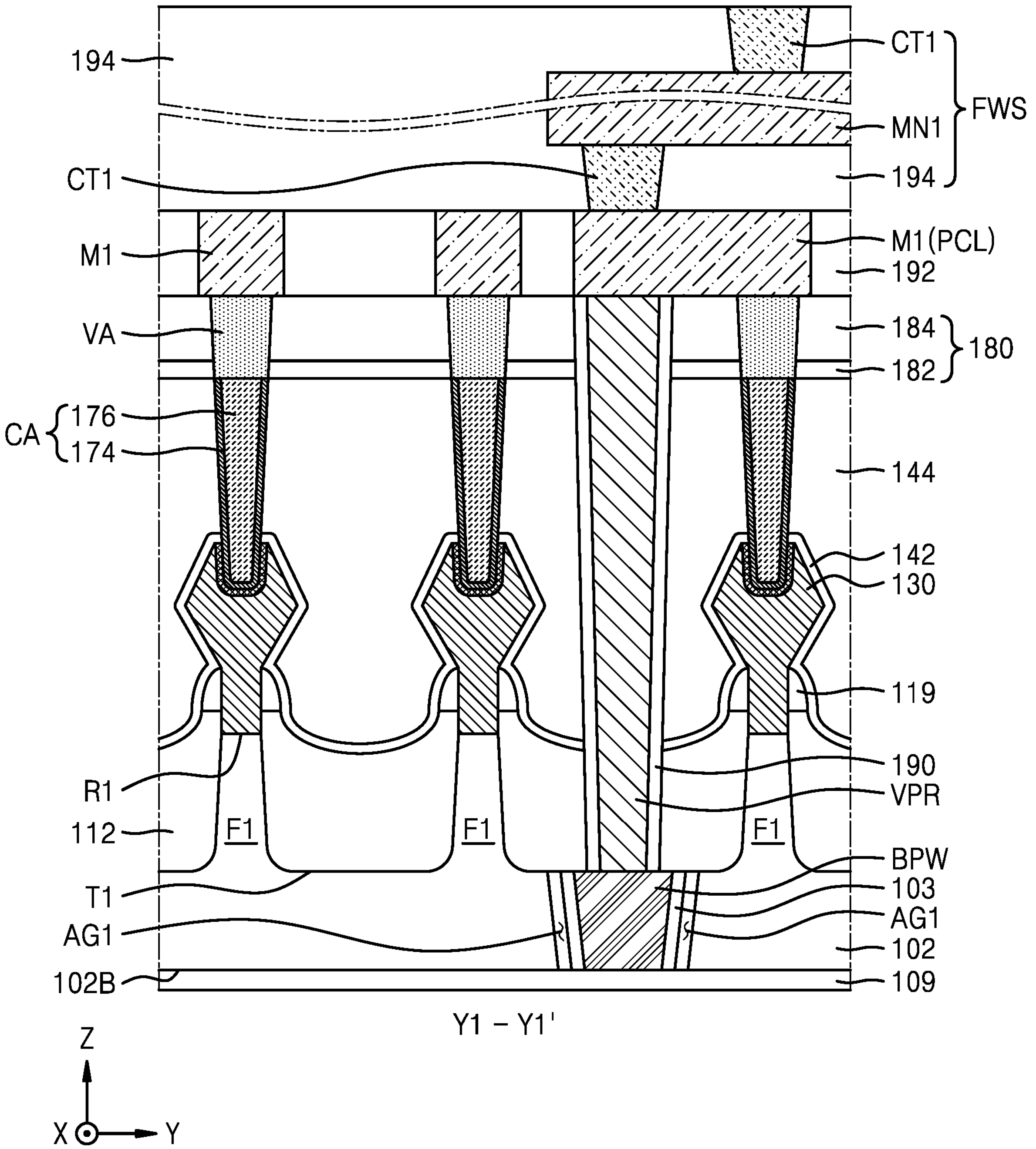

Referring to FIG. 28, in the resultant structure of FIG. 27, a backside insulating film 109 may be formed on the backside surface 102B of the substrate 102. The backside insulating film 109 may be formed to cover the backside surface 102B of the substrate 102, the backside power rail BPW, and the insulating liner 103, and may define a length of the air spacers AG1 in the vertical direction (e.g., the Z direction).

Subsequently, a backside wiring structure BWS may be formed on the backside insulating film 109 as described with reference to FIGS. 3A to 3C, and thus, the IC device 100 may be manufactured.

FIGS. 29 to 33 are cross-sectional views of a process sequence of a method of manufacturing an IC device, according to some embodiments of the present inventive concept. FIGS. 29 to 33 illustrate example cross-sectional structures of a portion corresponding to a cross-section taken along line Y1-Y1' of FIG. 2, according to a process sequence. Another example method of manufacturing the IC device 100 shown in FIGS. 2 and 3A to 3D is described with reference to FIGS. 29 to 33. In FIGS. 29 to 33, the same reference numerals are used to denote the same elements as in FIGS. 2, 3A to 3D, and 9 to 28, and repeated descriptions thereof may be omitted or briefly discussed.

Figure 29:
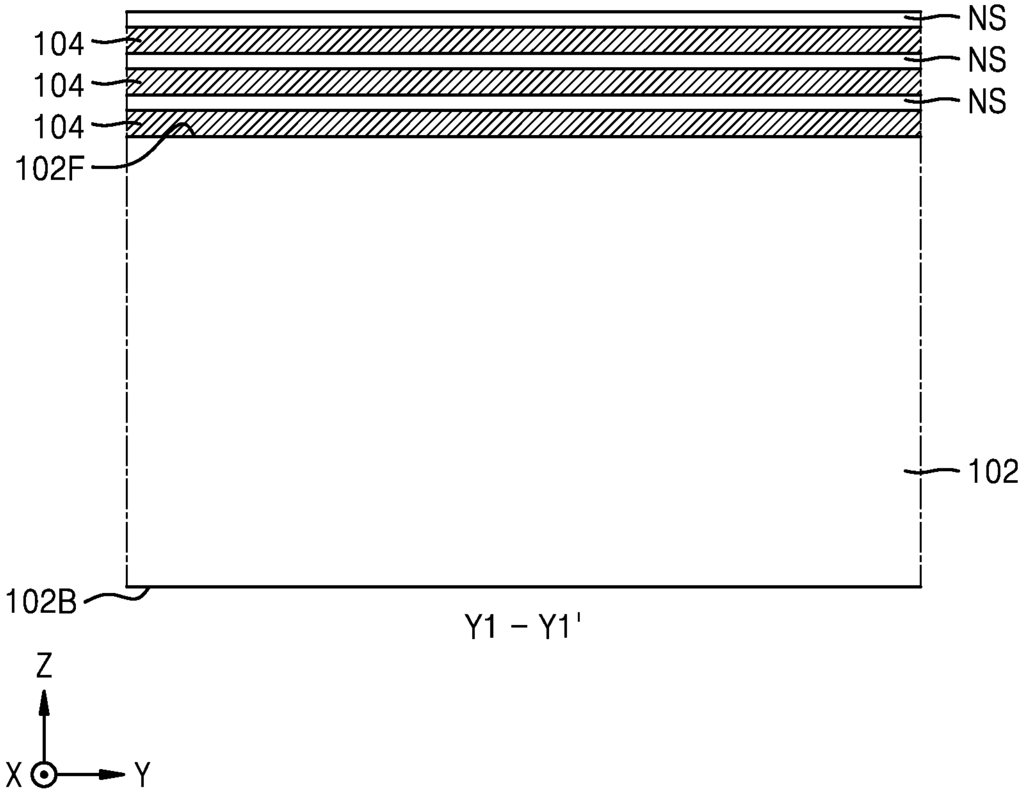
FIGS. 29, 30, 31, 32, and 33 are cross-sectional views of a process sequence of a method of manufacturing an IC device, according to an embodiment of the present inventive concept.

Referring to FIG. 29, a substrate 102 may be prepared, and a plurality of sacrificial semiconductor layers 104 and a plurality of nanosheet semiconductor layers NS may be alternately stacked one-by-one on a front-side surface 102F of the substrate 102 by using the same method as that described with reference to FIG. 14.

Figure 30:
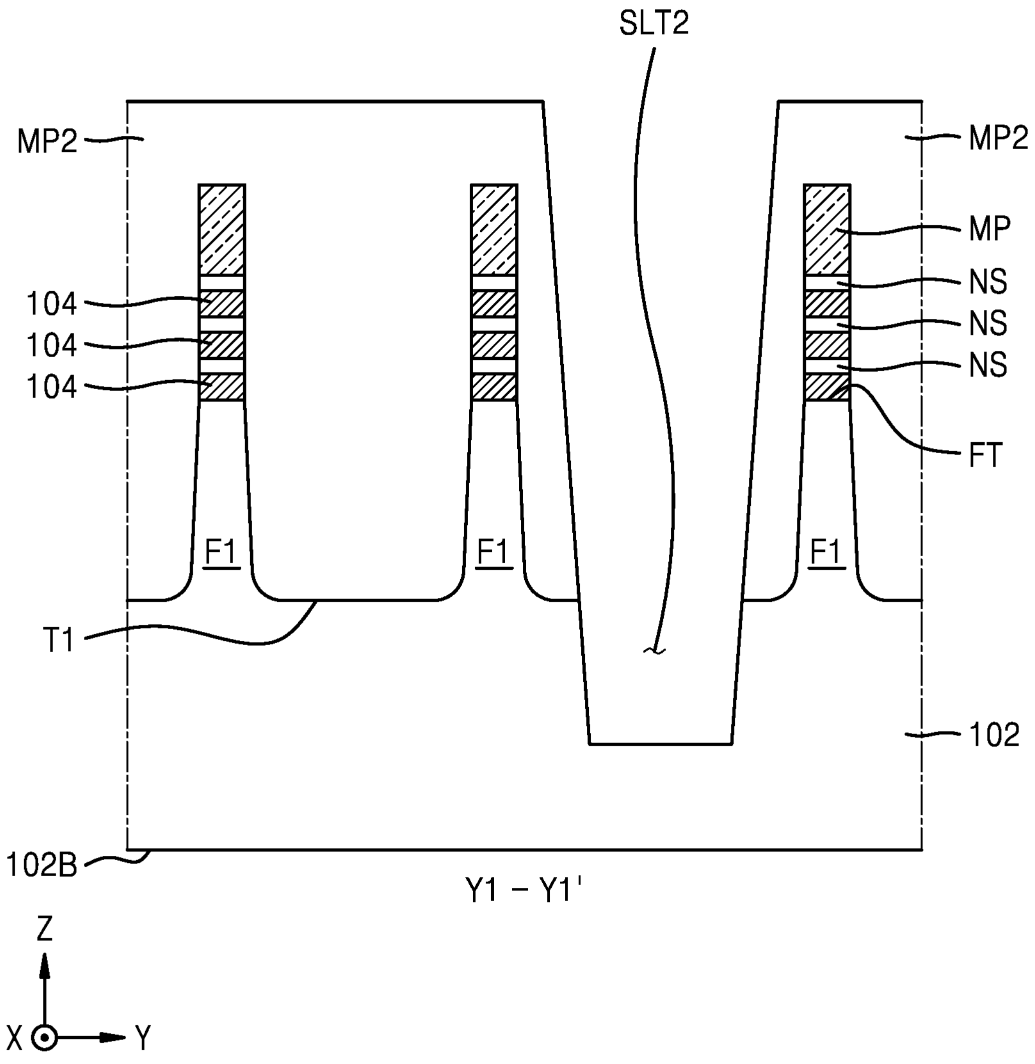

Referring to FIG. 30, a mask pattern MP may be formed on the resultant structure of FIG. 29 by using a method similar to that described with reference to FIG. 15, and the plurality of sacrificial semiconductor layers 104, the plurality of nanosheet semiconductor layers NS, and the substrate 102 may be partially etched by using the mask pattern MP as an etch mask. Thus, a plurality of fin-type active regions F1 may be formed in the substrate 102 to define a plurality of trench regions T1 in the substrate 102.

Thereafter, a mask pattern MP2 may be formed on the substrate 102 to cover the plurality of fin-type active regions F1 and expose a partial region of the substrate 102, and the exposed region of the substrate 102 may be etched by using the mask pattern MP2 as an etch mask. Thus, a sacrificial trench SLT2 may be formed in the substrate 102. In some embodiments of the present inventive concept, the mask pattern MP2 may include a photoresist pattern or a spin-on-hardmask (SOH) pattern, without being limited thereto.

Figure 31:
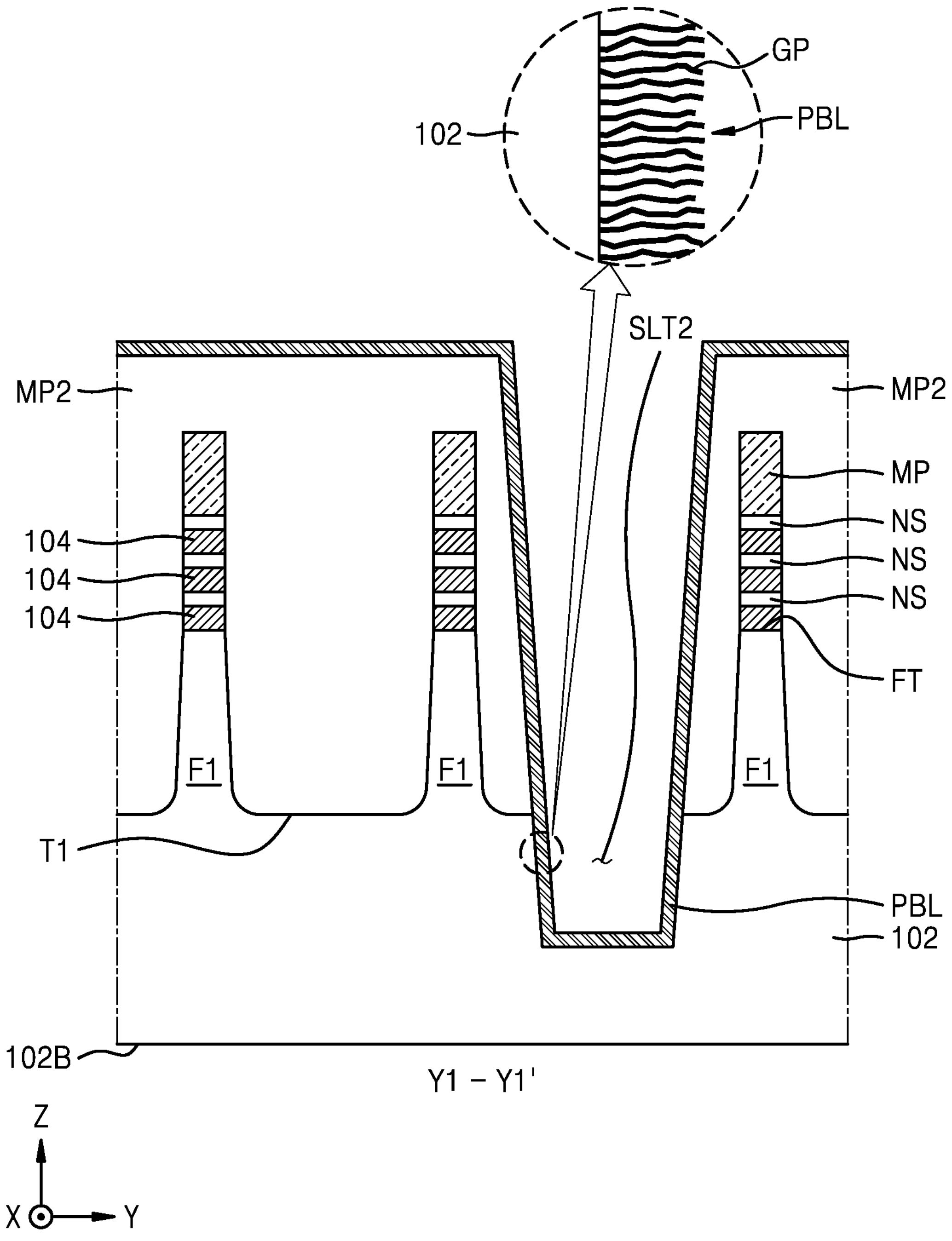

Referring to FIG. 31, processes similar to those described with reference to FIGS. 10 and 11 may be performed, and thus, a polymer brush layer PBL may be formed on an exposed surface in the resultant structure of FIG. 30.

Figure 32:
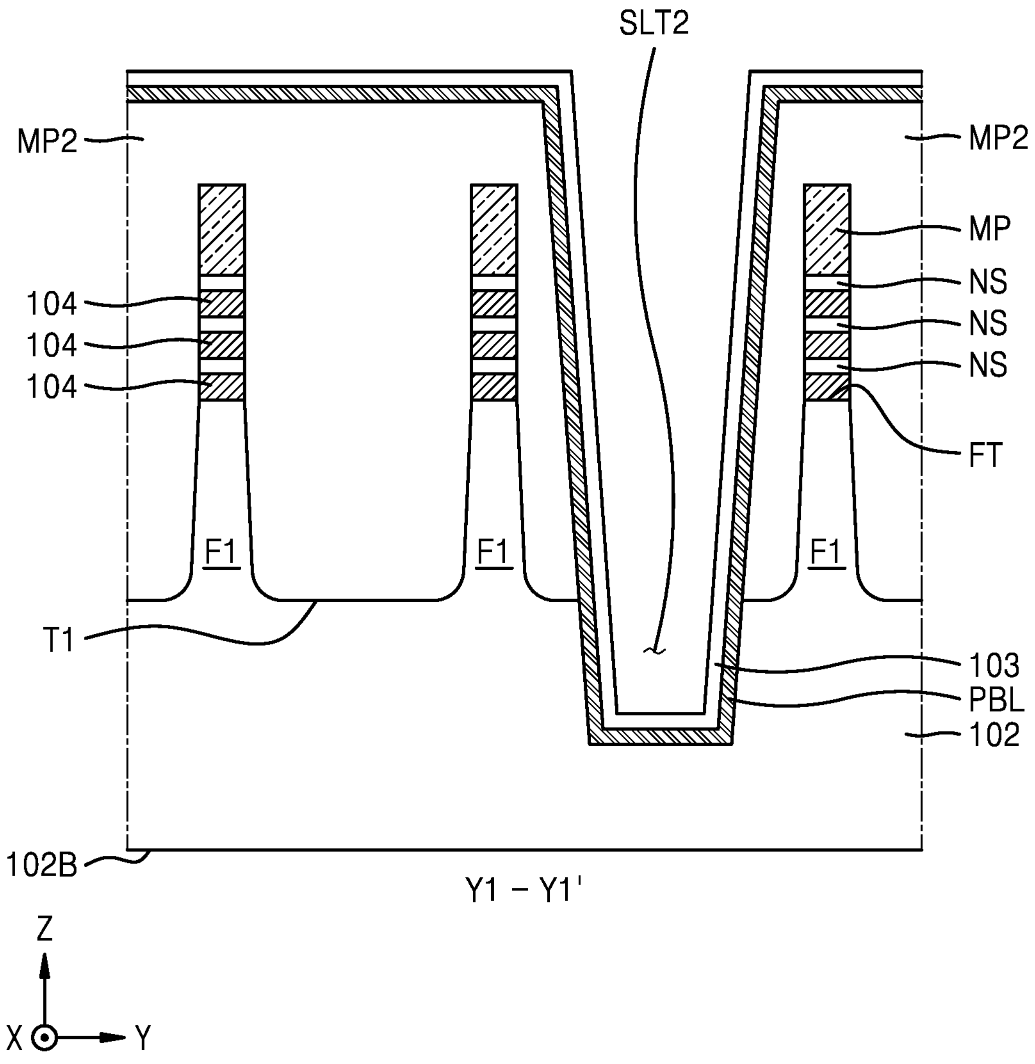

Referring to FIG. 32, a process similar to that described with reference to FIG. 12 may be performed on the resultant structure of FIG. 31, and thus, an insulating liner 103 may be formed on the polymer brush layer PBL.

Figure 33:
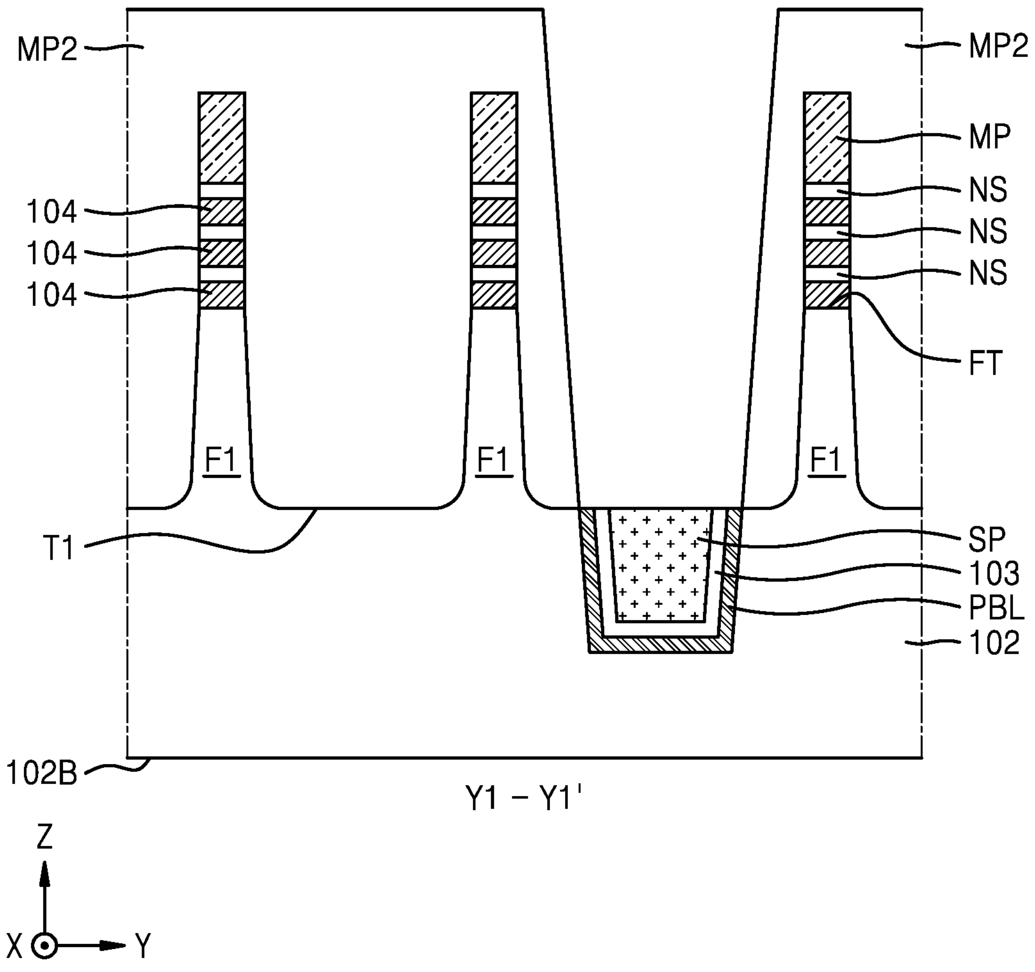

Referring to FIG. 33, in the resultant structure of FIG. 32, a sacrificial film may be formed to such a sufficient thickness as to fill a remaining empty space of the sacrificial trench SLT2 after forming the insulating liner 103 in the sacrificial trench SLT2. A portion of each of the sacrificial film, the insulating liner 103, and the polymer brush layer PBL may be removed by using an etchback process such that, the sacrificial film, the insulating liner 103, and the polymer brush layer PBL are left only inside the sacrificial trench SLT2.

Afterwards, the mask pattern MP2 may be removed, and the processes described with reference to FIGS. 16 to 28 may be performed to manufacture the IC device 100.

Although the method of manufacturing the IC device 100 shown in FIGS. 2 and 3A to 3D has been described with reference to FIGS. 8 to 33, it will be understood that the IC devices 200, 300, 400, 500, and 600 shown in FIGS. 4 to 8 and IC devices having variously changed structures may be manufactured by applying various modifications and changes to the processes described with reference to FIGS. 8 to 33 within the scope of the present inventive concept.

For example, to manufacture the IC device 200 shown in FIG. 4, processes similar to those described with reference to FIGS. 9 to 28 may be performed. However, in the process described with reference to FIG. 27, after the ashing process for removing the polymer brush layer PBL is performed, only a portion of the ashed polymer brush layer PBL may be removed. As a result, a region in which the polymer brush layer PBL was located may be left as air spacers AG2, and the resultant structure, in which a plurality of char particles 215 including the remaining portions of the ashed polymer brush layer PBL that may be dispersed in the air spacers AG2, may be obtained. Afterwards, the processes described with reference to FIG. 28 may be performed.

To manufacture the IC device 300 shown in FIG. 5, processes similar to those described with reference to FIGS. 9 to 28 may be performed. However, in the process described with reference to FIG. 27, a process of removing the insulating liner 103 may be further performed before or after the air spacers AG1 are formed by removing the polymer brush layer PBL. As a result, air spacers AG3 having a greater width than that of the air spacers AG1 in the second lateral direction (e.g., the Y direction) may be formed. Afterwards, the processes described with reference to FIG. 28 may be performed.

To manufacture the IC device 400 shown in FIG. 6, processes similar to those described with reference to FIGS. 9 to 28 may be performed. However, in the process described with reference to FIG. 27, a process of removing the insulating liner 103 may be further performed before air spacers AG1 are formed by removing the polymer brush layer PBL. Thereafter, the polymer brush layer PBL may be removed by using a method similar to that described with reference to FIG. 27. However, after an ashing process is performed to remove the polymer brush layer PBL, only a portion of the ashed polymer brush layer PBL may be removed. As a result, a region, in which the polymer brush layer PBL and the insulating liner 103 were located may be left as the air spacers AG4, and the resultant structure, in which a plurality of char particles 415 including the remaining portions of the ashed polymer brush layer PBL that may be dispersed in the air spacers AG4, may be obtained. Afterwards, the processes described with reference to FIG. 28 may be performed.

While the present inventive concept has been described with reference to example embodiments thereof, it will be understood by those of ordinary skill in the art that various changes in form and details may be made thereto without departing from the spirit and scope of the present inventive concept.

What is claimed is:

1. An integrated circuit device comprising:

a substrate having a backside surface;

a plurality of fin-type active regions comprising a pair of adjacent fin-type active regions protruding from the substrate and defining a trench region in the substrate on an opposite side of the backside surface, wherein the pair of adjacent fin-type active regions extend in a first lateral direction;

a plurality of source/drain regions comprising a pair of adjacent source/drain regions disposed, one-by-one, on the pair of adjacent fin-type active regions, respectively;

a device isolation film covering a sidewall of each of the pair of adjacent fin-type active regions and disposed in the trench region;

a via power rail disposed between the pair of adjacent fin-type active regions and between the pair of adjacent source/drain regions, wherein the via power rail passes through the device isolation film in a vertical direction;

a backside power rail passing through the substrate in the vertical direction and disposed at a position overlapping the via power rail in the vertical direction, wherein the backside power rail is connected to the via power rail; and an air spacer disposed between the substrate and the backside power rail.

2. The integrated circuit device of claim 1, wherein the substrate and the device isolation film are exposed by the air spacer.

3. The integrated circuit device of claim 1, further comprising at least one char particle dispersed in the air spacer, wherein the at least one char particle comprises about 70% to about 90% by weight of carbon (C) and about 10% to about 30% by weight of hydrogen (H), based on a total weight of the at least one char particle.

4. The integrated circuit device of claim 1, further comprising an insulating liner disposed between the backside power rail and the air spacer, wherein the insulating liner is in contact with the backside power rail.

5. The integrated circuit device of claim 1, wherein the substrate has a through region that accommodates the air spacer and the backside power rail, the through region has a pair of inner sidewalls that are exposed by the air spacer in a second lateral direction, wherein the second lateral direction intersects with the first lateral direction, and a distance between the pair of inner sidewalls in the second lateral direction gradually reduces toward the backside surface of the substrate.

6. The integrated circuit device of claim 1, wherein the backside power rail is spaced apart from the pair of source/drain regions with the device isolation film disposed therebetween.

7. The integrated circuit device of claim 1, wherein the air spacer covers both sidewalls of the backside power rail in a second lateral direction, wherein the second lateral direction intersects with the first lateral direction, the backside power rail is spaced apart from the pair of adjacent fin-type active regions with the air spacer and the substrate disposed therebetween.

8. The integrated circuit device of claim 1, wherein the backside power rail has a width that gradually reduces toward the backside surface of the substrate in a second lateral direction, wherein the second lateral direction intersects with the first lateral direction.

9. The integrated circuit device of claim 1, further comprising:

a gate line extending in a second lateral direction and disposed on the pair of adjacent fin-type active regions, wherein the second lateral direction intersects with the first lateral direction; and a pair of nanosheet stacks disposed between the pair of adjacent fin-type active regions and the gate line, wherein each nanosheet stack comprises at least one nanosheet that is at least partially surrounded by the gate line, wherein the via power rail passes through the gate line in the vertical direction and between the pair of nanosheet stacks.

10. The integrated circuit device of claim 1, further comprising:

a gate line extending in a second lateral direction and disposed on the pair of adjacent fin-type active regions, wherein the second lateral direction intersects with the first lateral direction; and a pair of nanosheet stacks disposed between the pair of adjacent fin-type active regions and the gate line, wherein each nanosheet stack comprises at least one nanosheet that is at least partially surrounded by the gate line, wherein the air spacer overlaps the gate line in the vertical direction.

11. An integrated circuit device comprising:

a substrate having a backside surface;

a plurality of fin-type active regions protruding from the substrate and defining a plurality of trench regions in the substrate on an opposite side of the backside surface, wherein the plurality of fin-type active regions extend in a first lateral direction;

a plurality of source/drain regions disposed on the plurality of fin-type active regions, respectively;

a device isolation film disposed on a sidewall of each of the plurality of fin-type active regions in the plurality of trench regions;

a via power rail spaced apart from and non-overlapping vertically with the plurality of fin-type active regions and the plurality of source/drain regions, wherein the via power rail passes through the device isolation film in a vertical direction; and a backside power structure passing through the substrate in the vertical direction and disposed at a position overlapping the via power rail in the vertical direction, wherein the backside power structure comprises:

a backside power rail passing through the substrate in the vertical direction and disposed at a position overlapping the via power rail in the vertical direction, wherein the backside power rail is connected to the via power rail; and an air spacer disposed between the substrate and the backside power rail.

12. The integrated circuit device of claim 11, wherein the backside power structure further comprises an insulating liner disposed between the backside power rail and the air spacer, and a width of the air spacer in a second lateral direction is defined by the substrate and the insulating liner, wherein the second lateral direction intersects with the first lateral direction.

13. The integrated circuit device of claim 11, wherein a width of the air spacer in a second lateral direction is defined by the substrate and the backside power rail, wherein the second lateral direction intersects with the first lateral direction.

14. The integrated circuit device of claim 11, wherein the backside power structure further comprises at least one char particle dispersed in the air spacer, and the at least one char particle comprises about 70% to about 90% by weight of carbon (C) and about 10% to about 30% by weight of hydrogen (H), based on a total weight of the at least one char particle.

15. The integrated circuit device of claim 11, wherein the substrate has a through region that accommodates the backside power structure, and the through region has a tapered shape.

16. The integrated circuit device of claim 11, wherein the backside power structure is apart from the plurality of source/drain regions with the device isolation film disposed therebetween and is spaced apart from the plurality of fin-type active regions with the substrate disposed therebetween.

17. The integrated circuit device of claim 11, further comprising:

a gate line extending in a second lateral direction and disposed on the plurality of fin-type active regions, wherein the second lateral direction intersects with the first lateral direction; and a plurality of nanosheet stacks disposed between the plurality of fin-type active regions and the gate line, wherein each nanosheet stack comprises at least nanosheet at least partially surrounded by the gate line, wherein the via power rail passes through the gate line in the vertical direction and between a pair of adjacent nanosheet stacks, from among the plurality of nanosheet stacks, and the backside power structure is spaced apart from the plurality of nanosheet stacks with the device isolation film disposed therebetween.

18. An integrated circuit device comprising:

a substrate having a backside surface;

a fin-type active region protruding from the substrate to and defining a trench region in the substrate on an opposite side of the backside surface;

at least one nanosheet disposed on the fin-type active region, wherein the at least one nanosheet is spaced apart from a fin top surface of the fin-type active region;

a gate line at least partially surrounding the at least one nanosheet and disposed on the fin-type active region;

a source/drain region adjacent to the gate line and disposed on the fin-type active region, wherein the source/drain region is in contact with the at least one nanosheet;

a device isolation film covering a sidewall of the fin-type active region and disposed in the trench region;

a via power rail spaced apart from each of the fin-type active region, the source/drain region, and the gate line, wherein the via power rail passes through the gate line in a vertical direction; and a backside power structure passing through the substrate in the vertical direction and disposed at a position overlapping the via power rail in the vertical direction, wherein the backside power structure comprises:

a backside power rail passing through the substrate in the vertical direction and disposed at a position overlapping the via power rail in the vertical direction, wherein the backside power rail is connected to the via power rail; and an air spacer disposed between the substrate and the backside power rail and comprising at least one char particle disposed therein.

19. The integrated circuit device of claim 18, wherein the backside power structure further comprises an insulating liner disposed between the backside power rail and the air spacer, and the insulating liner comprises a silicon oxide film, a silicon nitride film, or a combination thereof.

20. The integrated circuit device of claim 18, wherein the at least one char particle comprises about 70% to about 90% by weight of carbon (C) and about 10% to about 30% by weight of hydrogen (H), based on a total weight of the at least one char particle.

* * * * *